(12) United States Patent
Suzuki et al.

(10) Patent No.: US 10,557,892 B2
(45) Date of Patent: Feb. 11, 2020

(54) ENERGY STORAGE DEVICE STATE ESTIMATION DEVICE AND ENERGY STORAGE DEVICE STATE ESTIMATION METHOD

(71) Applicant: GS Yuasa International Ltd., Kyoto-shi, Kyoto (JP)

(72) Inventors: Keita Suzuki, Kyoto (JP); Yohei Tao, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 110 days.

(21) Appl. No.: 15/534,766

(22) PCT Filed: Dec. 8, 2015

(86) PCT No.: PCT/JP2015/006079
§ 371 (c)(1),
(2) Date: Jun. 9, 2017

(87) PCT Pub. No.: WO2016/092811
PCT Pub. Date: Jun. 16, 2016

(65) Prior Publication Data
US 2017/0328957 A1 Nov. 16, 2017

(30) Foreign Application Priority Data

Dec. 10, 2014 (JP) .................. 2014-250205
Oct. 1, 2015 (JP) .................. 2015-196290

(51) Int. Cl.
*G01R 31/387* (2019.01)
*H01M 10/48* (2006.01)
*H02J 7/00* (2006.01)

(52) U.S. Cl.
CPC ........ *G01R 31/387* (2019.01); *H01M 10/482* (2013.01); *H02J 7/0021* (2013.01)

(58) Field of Classification Search
None
See application file for complete search history.

(56) References Cited

U.S. PATENT DOCUMENTS

2012/0112700 A1  5/2012  Morimoto et al.
2013/0096858 A1  4/2013  Ide
(Continued)

FOREIGN PATENT DOCUMENTS

JP  2013089424      5/2013
JP  2013181875 A2   9/2013
(Continued)

OTHER PUBLICATIONS

Translation JP 2013-089424 (Year: 2013).*
(Continued)

*Primary Examiner* — Paresh Patel
(74) *Attorney, Agent, or Firm* — Rankin, Hyll & Clark LLP

(57) ABSTRACT

Provided is an energy storage device state estimation device (100) for estimating a state of an energy storage device (200) at a predetermined point of time. The energy storage device state estimation device (100) includes: a history acquisition part (110) configured to acquire a charge-discharge history of the energy storage device (200) up to the predetermined point of time; a deterioration value estimation part (130) configured to estimate a time dependent deterioration value and a working electricity dependent deterioration value of the energy storage device (200) at the predetermined point of time using information about time dependent deterioration and information about working electricity dependent deterioration corresponding to the charge-discharge history; and a state estimation part (140) configured to estimate a state of the energy storage device (200) at the predetermined
(Continued)

point of time using the time dependent deterioration value and the working electricity dependent deterioration value.

20 Claims, 22 Drawing Sheets

(56) References Cited

U.S. PATENT DOCUMENTS

| | | | |
|---|---|---|---|
| 2014/0107956 A1 | 4/2014 | Miyaki | |
| 2014/0320062 A1* | 10/2014 | Murayama | G06Q 10/06 320/104 |
| 2015/0301118 A1 | 10/2015 | Yamate | |
| 2017/0074943 A1 | 3/2017 | Tao | |
| 2017/0123013 A1 | 5/2017 | Yamate | |

FOREIGN PATENT DOCUMENTS

| | | |
|---|---|---|
| JP | 2013253940 A2 | 12/2013 |
| JP | 2013253941 A2 | 12/2013 |
| JP | 2013253991 A2 | 12/2013 |
| JP | 2014081238 A2 | 5/2014 |
| JP | 2014131412 A2 | 7/2014 |
| JP | 2014163875 A2 | 9/2014 |
| JP | 2015-158416 A | 9/2015 |
| WO | 2011/004550 A1 | 1/2011 |
| WO | 2014083853 A1 | 6/2014 |
| WO | 2015146034 A1 | 10/2015 |

OTHER PUBLICATIONS

Translation JP 2013-181875 (Year: 2013).*
Translation JP 2014-163875 (Year: 2014).*
International Search Report dated Feb. 16, 2016 filed in PCT/JP2015/006079.
Supplementary European Search Report dated Jun. 27, 2018 issued in the European patent application No. 15867915.9.

* cited by examiner

| Date (year/month/day) | Time | Use period (second) | Voltage (V) | Electric current (A) | SOC (%) | Temperature (°C) | Battery state |
|---|---|---|---|---|---|---|---|
| 20XX/4/1 | 7:00 | 0 | V1 | I1 | 100 | 10 | Discharged |
| ↑ | ⋮ | ⋮ | ⋮ | ⋮ | ⋮ | ⋮ | ⋮ |
| ↑ | 11:00 | 14400 | V2 | I2 | 70 | 20 | Non-used |
| ↑ | ⋮ | ⋮ | ⋮ | ⋮ | ⋮ | ⋮ | ⋮ |
| ↑ | 13:00 | 21600 | V3 | I3 | 70 | 20 | Discharged |
| ↑ | ⋮ | ⋮ | ⋮ | ⋮ | ⋮ | ⋮ | ⋮ |
| ↑ | 20:00 | 46800 | V4 | I4 | 40 | 10 | Non-used |
| ↑ | ⋮ | ⋮ | ⋮ | ⋮ | ⋮ | ⋮ | ⋮ |
| 20XX/4/2 | 24:00 | 86400 | V5 | I5 | 40 | 10 | Charged |
| ↑ | ⋮ | ⋮ | ⋮ | ⋮ | ⋮ | ⋮ | ⋮ |
| ↑ | 7:00 | 111600 | V6 | I6 | 100 | 10 | Non-used |
| ↑ | ⋮ | ⋮ | ⋮ | ⋮ | ⋮ | ⋮ | ⋮ |

|  | Capacity retention ratio | Error between actually measured value and calculated value |
|---|---|---|
| Example 1-1 | 94.7% | 2.5% |
| Comparison example 1-1 | 76.3% | Δ15.9% |
| Actually measured value | 92.2% | — |

|  | Capacity retention ratio | Error between actually measured value and calculated value |
|---|---|---|
| Example 1-2 | 84.2% | Δ1.1% |
| Comparison example 1-2 | 24.9% | Δ60.4% |
| Actually measured value | 85.3% | --- |

Fig. 13A

| Mode | Working electricity rate | Period/h | Change in SOC | Average SOC | Average zone temperature (°C) |
|---|---|---|---|---|---|
| Non-used | — | 16.4 | — | 100% | 30 |
| Cycle | 1 C | 0.8 | 20 - 100% | 60% | 30 |
| Non-used | — | 6 | — | 20% | 30 |
| Cycle | 1 C | 0.8 | 100 - 20% | 60% | 30 |

Fig. 13B

| Mode | Working electricity rate | Period/h | Change in SOC | Average SOC | Average zone temperature (°C) |
|---|---|---|---|---|---|
| Non-used | — | 16.4 | — | 100% | 20 |
| Cycle | 1 C | 0.8 | 20 - 100% | 60% | 45 |
| Non-used | — | 6 | — | 20% | 20 |
| Cycle | 1 C | 0.8 | 100 - 20% | 60% | 45 |

Fig. 13C

| Mode | Working electricity rate | Period/h | Change in SOC | Average SOC | Average zone temperature (°C) |
|---|---|---|---|---|---|
| Non-used | — | 7 | — | 100% | 35 |
| Cycle | 0.2 C | 1.3 | 100 - 75% | 87.5% | 35 |
| Non-used | — | 8.5 | — | 75% | 35 |
| Cycle | 0.2 C | 1.3 | 75 - 50% | 62.5% | 35 |
| Non-used | — | 3 | — | 50% | 35 |
| Cycle | 0.2 C | 3 | 50 - 100% | 75% | 35 |

Fig. 14A
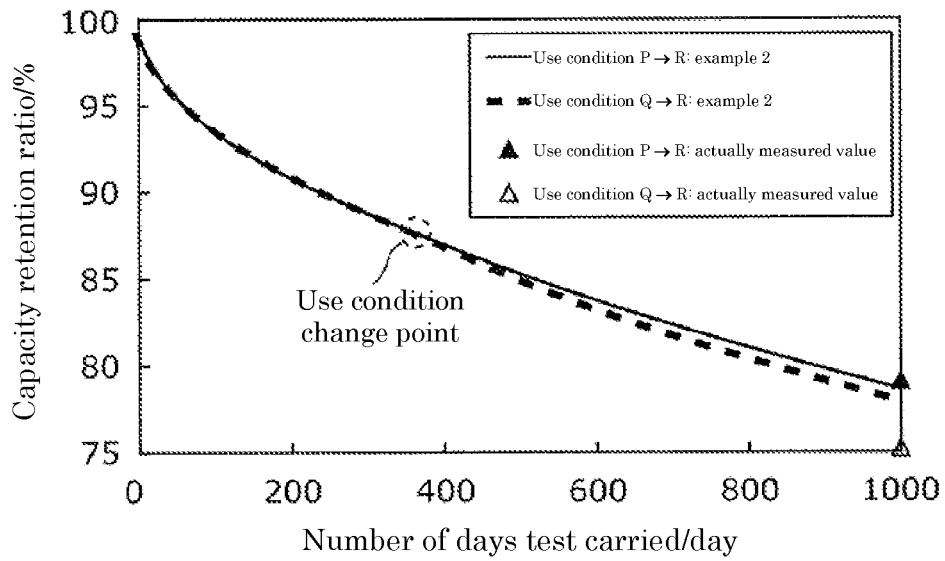
Fig. 14B
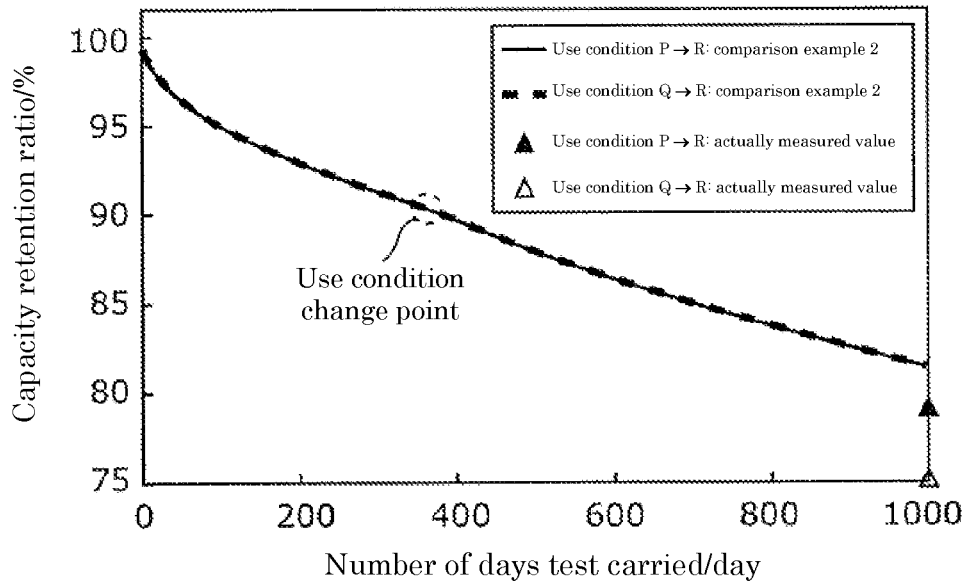
Fig. 14C
|  | Use condition P → R | Error between actually measured value and calculated value | Use condition Q → R | Error between actually measured value and calculated value |
|---|---|---|---|---|
| Example 2 | 78.6% | △0.5% | 77.9% | 2.7% |
| Comparison example 2 | 81.4% | 2.3% | 81.5% | 6.3% |
| Actually measured value | 79.1% | — | 75.2% | — |

Fig. 16
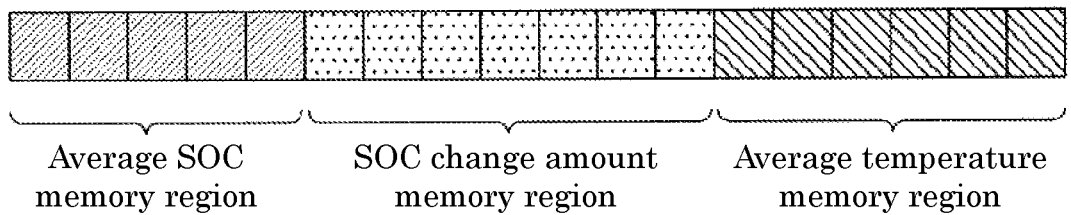
Fig. 17A
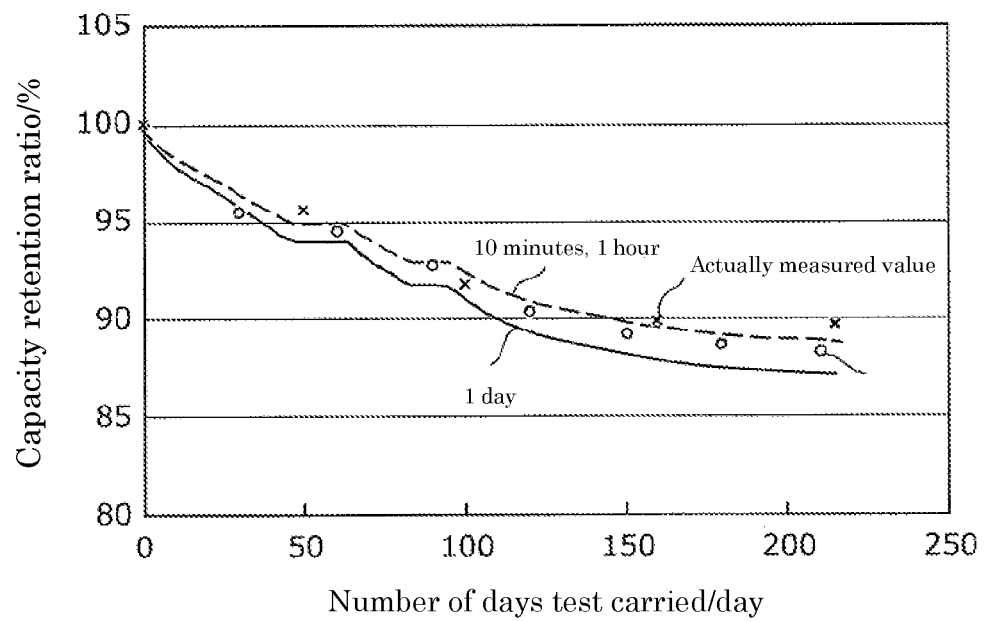
Number of days test carried/day
Fig. 17B
|  | 0-th day | 50-th day | 100-th day | 160-th day | 215-th day |
|---|---|---|---|---|---|
| Actually measured value/% | 100 | 95.6 | 91.8 | 89.8 | 89.7 |
| Every 10 minutes/% | 100 | 95.0 (-0.6) | 92.4 (+0.6) | 89.6 (-0.2) | 88.8 (-1.1) |
| Every 1 hour/% | 100 | 95.0 (-0.6) | 92.4 (+0.6) | 89.6 (-0.2) | 88.8 (-1.1) |
| Every 1 day/% | 100 | 94.1 (-1.5) | 91.1 (-0.7) | 88.0 (-1.8) | 87.2 (-2.5) |
| Every 1 month/% | 100 | 95.3 (-0.3) | 92.1 (+0.3) | 89.1 (-0.7) | 88.4 (-1.3) |

# ENERGY STORAGE DEVICE STATE ESTIMATION DEVICE AND ENERGY STORAGE DEVICE STATE ESTIMATION METHOD

TECHNICAL FIELD

The present invention relates to an energy storage device state estimation device and an energy storage device state estimation method for estimating a state of an energy storage device at a predetermined point of time.

BACKGROUND ART

An energy storage device such as a lithium ion secondary battery has been used as a power source for mobile equipment such as a notebook-type personal computer or a mobile phone. In recent years, an energy storage device has been used in various fields including a power source for an electric vehicle.

Conventionally, for such an energy storage device, there has been proposed a technique of estimating a state of an energy storage device based on information such as a charge-discharge history (see patent documents 1, 2, for example). In this technique, the prediction of a lifetime of an energy storage device or the like is performed using information such as a charge-discharge history.

PRIOR ART DOCUMENTS

Patent Documents

Patent Document 1: JP-A-2013-89424
Patent Document 2: JP-A-2014-81238

SUMMARY OF THE INVENTION

Problems to be Solved by the Invention

However, in the above-mentioned technique, a state of an energy storage device is estimated without taking into account a deterioration state of the inside of an energy storage device and hence, there exists a drawback that estimation accuracy is low.

The present invention has been made to solve the above-mentioned problem, and it is an object of the present invention to provide an energy storage device state estimation device and an energy storage device state estimation method where estimation accuracy of a state of the energy storage device is enhanced.

Means for Solving the Problems

To achieve the above-mentioned object, according to an aspect of the present invention, there is provided an energy storage device state estimation device for estimating a state of an energy storage device at a predetermined point of time, the energy storage device state estimation device including: a history acquisition part configured to acquire a charge-discharge history of the energy storage device up to the predetermined point of time; a deterioration value estimation part where, assuming information indicative of a deterioration degree of time dependent deterioration in which the energy storage device deteriorates with a lapse of time in an open-circuit state as information about time dependent deterioration, assuming information indicative of a deterioration degree of working electricity dependent deterioration which is deterioration by working electricity excluding the time dependent deterioration as information about working electricity dependent deterioration, assuming a value indicative of an amount of the time dependent deterioration of the energy storage device as a time dependent deterioration value, and assuming a value indicative of an amount of the working electricity dependent deterioration of the energy storage device as a working electricity dependent deterioration value, the time dependent deterioration value and the working electricity dependent deterioration value at the predetermined point of time are estimated using information about time dependent deterioration and information about working electricity dependent deterioration corresponding to the charge-discharge history; and a state estimation part configured to estimate a state of the energy storage device at the predetermined point of time using the time dependent deterioration value and the working electricity dependent deterioration value.

The present invention can be realized not only in the form of such an energy storage device state estimation device but also in the form of an energy storage system which includes a plurality of energy storage devices, and an energy storage device state estimation device which estimates states of the plurality of energy storage devices at a predetermined point of time.

The present invention can be also realized in the form of an energy storage device state estimation method which includes unique processing which the energy storage device state estimation device performs as a step thereof. The present invention can be also realized in the form of an integrated circuit which includes a unique processing part which the energy storage device state estimation device includes. The present invention can be also realized in the form of a program which causes a computer to execute unique processing included in an energy storage device state estimation method or in the form of a recording medium such as a computer readable compact disc-read only memory (CD-ROM) in which the program is recorded. Such a program can be put into a market through a recording medium such as a CD-ROM or a transmission medium such as Internet.

Advantages of the Invention

According to the energy storage device state estimation device of the present invention, estimation accuracy of a state of the energy storage device can be enhanced.

BRIEF DESCRIPTION OF THE DRAWINGS

FIG. 13A is a view showing test conditions for performing estimation of a state of an energy storage device at a predetermined point of time with respect to the energy storage device state estimation device according to the embodiment 1 of the present invention and a comparison example 2.

FIG. 13B is a view showing test conditions for performing estimation of a state of the energy storage device at a predetermined point of time with respect to the energy storage device state estimation device according to the embodiment 1 of the present invention and the comparison example 2.

FIG. 13C is a view showing test conditions for performing estimation of a state of the energy storage device at a predetermined point of time with respect to the energy storage device state estimation device according to the embodiment 1 of the present invention and the comparison example 2.

FIG. 14A is a view showing a result of estimation of a state of an energy storage device at a predetermined point of time by the energy storage device state estimation device according to the embodiment 1 of the present invention.

FIG. 14B is a view showing a result of estimation of a state of an energy storage device at a predetermined point of time by a device described in patent document 2 which forms the comparison example 2.

FIG. 14C is a view showing results of estimation of a state of an energy storage device at a predetermined point of time by the energy storage device state estimation device according to the embodiment 1 of the present invention and by the device described in patent document 2 which forms the comparison example 2.

FIG. 16 is a view for describing a charge-discharge history acquired by the history acquisition part according to the modification 1 of the embodiment 1 of the present invention.

FIG. 17A is a view showing a change in capacity retention ratio when the history acquisition part according to the modification 1 of the embodiment 1 of the present invention updates a charge-discharge history during a plurality of predetermined periods.

FIG. 17B is a view showing a change in capacity retention ratio when the history acquisition part according to the modification 1 of the embodiment 1 of the present invention updates a charge-discharge history during a plurality of predetermined periods.

MODE FOR CARRYING OUT THE INVENTION

Figure 1:
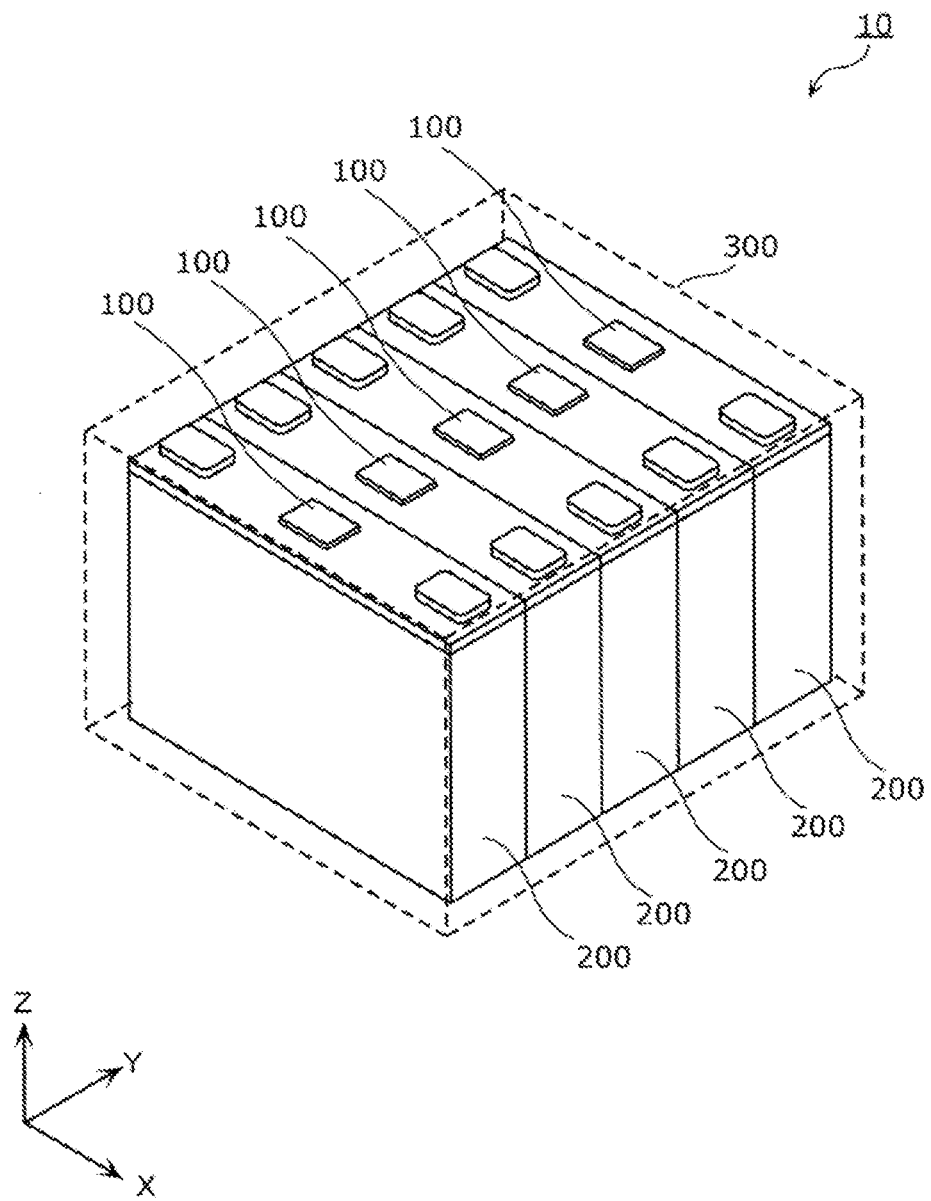
FIG. 1 is an external appearance view of an energy storage system which includes an energy storage device state estimation device according to an embodiment 1 of the present invention.

In the above-mentioned conventional technique, a state of the energy storage device is estimated without taking into account a deterioration state of the inside of the energy storage device and hence, there exists a drawback that estimation accuracy is low.

That is, when the use condition of the energy storage device differs, a deterioration state of the inside of the energy storage device also differs correspondingly. Accordingly, in the above-mentioned conventional technique, the deterioration state of the inside of the energy storage device has not been taken into account and hence, the continuity of a deterioration state of the inside of the energy storage device is not ensured whereby estimation accuracy becomes low.

The present invention has been made to overcome the above-mentioned drawbacks, and it is an object of the present invention to provide an energy storage device state estimation device and an energy storage device state estimation method which can enhance estimation accuracy of a state of the energy storage device.

To achieve the above-mentioned object, according to an aspect of the present invention, there is provided an energy storage device state estimation device for estimating a state of an energy storage device at a predetermined point of time, the energy storage device state estimation device which includes a history acquisition part configured to acquire a charge-discharge history of the energy storage device up to the predetermined point of time. The estimation device further includes a deterioration value estimation part configured to, assuming information indicative of a deterioration degree of time deterioration (time dependent deterioration) in which the energy storage device deteriorates with a lapse of time in a non-conduction state (in an open-circuit state) as time deterioration information (information about time dependent deterioration), assuming information indicative of a deterioration degree of conduction deterioration (working electricity dependent deterioration) which is deterioration by working electricity excluding the time dependent deterioration as conduction deterioration information (information about working electricity dependent deterioration), assuming a value indicative of an amount of the time dependent deterioration of the energy storage device as a time dependent deterioration value, and assuming a value indicative of an amount of the working electricity dependent deterioration of the energy storage device as a working electricity dependent deterioration value, estimate the time dependent deterioration value and the working electricity dependent deterioration value at the predetermined point of time using information about time dependent deterioration and information about working electricity dependent deterioration corresponding to the charge-discharge history. The estimation device further includes a state estimation part configured to estimate a state of the energy storage device at the predetermined point of time using the time dependent deterioration value and the working electricity dependent deterioration value.

With such a configuration, the energy storage device state estimation device estimates a state of the energy storage device at a predetermined point of time by estimating a time dependent deterioration value and a working electricity dependent deterioration value of the energy storage device at the predetermined point of time using information about time dependent deterioration and information about working electricity dependent deterioration corresponding to a charge-discharge history. Deterioration of the energy storage device includes time dependent deterioration where the energy storage device is deteriorated even in an open-circuit state with a lapse of time and working electricity dependent deterioration where the energy storage device is deteriorated by working electricity even when time dependent deterioration does not occur. That is, when use conditions of the energy storage device such as a period of a conduction state (closed-circuit state), a period of an open-circuit state, an amount of working electricity, a use temperature and the like are different, a deterioration state of time dependent deterioration and a deterioration state of working electricity dependent deterioration in the energy storage device differ and hence, it is necessary to consider separately time dependent deterioration and working electricity dependent deterioration. According to the energy storage device state estimation device, by estimating the deterioration value of the inside of the energy storage device in a state where the deterioration state is divided into time dependent deterioration and working electricity dependent deterioration, it is possible to enhance estimation accuracy of the state of the energy storage device.

The energy storage device state estimation device may further include: a deterioration information acquisition part configured to acquire information about time dependent deterioration and information about working electricity dependent deterioration, wherein the history acquisition part may be configured to acquire the charge-discharge history including histories by predetermined periods which are charge-discharge histories corresponding to a plurality of respective periods up to the predetermined point of time, the deterioration information acquisition part is configured to acquire information about time dependent deterioration and information about working electricity dependent deterioration which respectively correspond to the histories by predetermined periods, the deterioration estimation part may be configured to calculate the time dependent deterioration value and the working electricity dependent deterioration value for the respective histories by predetermined periods using information about time dependent deterioration and information about working electricity dependent deterioration corresponding to the respective histories of predetermined periods, and may be configured to calculate the time dependent deterioration value and the working electricity dependent deterioration value at the predetermined point of time by integrating the calculated time dependent deterioration values and the calculated working electricity dependent deterioration values sequentially in the order of the histories by predetermined periods.

With such a configuration, the energy storage device state estimation device acquires information about time dependent deterioration and information about working electricity dependent deterioration which correspond to the respective histories by predetermined periods. That is, the deterioration state of the inside of the energy storage device changes with a lapse of time and hence, by estimating a deterioration value using information about time dependent deterioration and information about working electricity dependent deterioration which correspond to the respective histories by predetermined periods, estimation accuracy of a state of the energy storage device can be enhanced.

Further, the energy storage device state estimation device calculates a time dependent deterioration value and a working electricity dependent deterioration value for respective histories by predetermined periods using information about time dependent deterioration and information about working electricity dependent deterioration for respective histories by predetermined periods, and integrates the time dependent deterioration values and the working electricity dependent deterioration values sequentially in the order of histories by predetermined periods thus calculating a time dependent deterioration value and a working electricity dependent deterioration value at a predetermined point of time. By integrating the time dependent deterioration values and the working electricity dependent deterioration values sequentially in the order of times, the continuity of a deterioration state of the inside of the energy storage device can be ensured. Accordingly, a time dependent deterioration value and a working electricity dependent deterioration value at a predetermined point of time can be accurately calculated and hence, the estimation accuracy of a state of the energy storage device can be enhanced.

The history acquisition part may be configured to acquire the charge-discharge history which includes: a first history by predetermined period which is a history by predetermined period from a first point of time to a second point of time; and a second history by predetermined period which is a history by predetermined period from the second point of time to a third point of time, the deterioration information acquisition part may be configured to acquire first information about time dependent deterioration which is information about time dependent deterioration corresponding to the first history by predetermined period and second information about time dependent deterioration which is information about time dependent deterioration corresponding to the second history by predetermined period, the deterioration value estimation part may be configured to: calculate a first time dependent deterioration value which is a time dependent deterioration value from the first point of time to the second point of time using the first information about time dependent deterioration; calculate a second time dependent deterioration value which is a time dependent deterioration value from the second point of time to the third point of time using the second information about time dependent deterioration by setting a state where the deterioration at the first time dependent deterioration value takes place as a start point; and calculate a time dependent deterioration value from the first point of time to the third point of time by adding the first time dependent deterioration value and the second time dependent deterioration value to each other.

With such a configuration, the energy storage device state estimation device calculates a first time dependent deterioration value from the first point of time to the second point of time; calculates a second time dependent deterioration value from the second point of time to the third point of time by setting a state where the deterioration at the first time dependent deterioration value takes place as a start point; and calculates a time dependent deterioration value from the first point of time to the third point of time by adding the first time dependent deterioration value and the second time dependent deterioration value to each other. By integrating the time dependent deterioration values sequentially in the order of time in this manner, the continuity of time dependent deterioration can be ensured. Accordingly, a time dependent deterioration value at a predetermined point of time can be accurately calculated and hence, the estimation accuracy of a state of the energy storage device can be enhanced.

The history acquisition part may be configured to acquire the charge-discharge history which includes: a third history by predetermined period which is a history by predetermined period from a fourth point of time to a fifth point of time during which electricity is supplied to the energy storage device; and a fourth history by predetermined period which is a history by predetermined period from a sixth point of time to a seventh point of time during which electricity is supplied to the energy storage device after the fifth point of time, and the deterioration information acquisition part may be configured to acquire first information about working electricity dependent deterioration which is information about working electricity dependent deterioration corresponding to the third history by predetermined period and second information about working electricity dependent deterioration which is information about working electricity dependent deterioration corresponding to the fourth history by predetermined period, and the deterioration value estimation part may be configured to: calculate a first working electricity dependent deterioration value which is a working electricity dependent deterioration value from the fourth point of time to the fifth point of time using the first information about working electricity dependent deterioration; calculate a second working electricity dependent deterioration value which is a working electricity dependent deterioration value from the sixth point of time to the seventh point of time using the second information about working electricity dependent deterioration by setting a state where the deterioration of the first working electricity dependent deterioration value takes place as a start point; and calculate a working electricity dependent deterioration value from the fourth point of time to the seventh point of time by adding the first working electricity dependent deterioration value and the second working electricity dependent deterioration value to each other.

With such a configuration, the energy storage device state estimation device calculates a first working electricity dependent deterioration value from the fourth point of time to the fifth point of time during which electricity is supplied to the energy storage device, calculates a second working electricity dependent deterioration value from the sixth point of time to the seventh point of time during which electricity is supplied to the energy storage device after the fifth point of time by setting a state where the deterioration of the first working electricity dependent deterioration value takes place as a start point, and calculates a working electricity dependent deterioration value from the fourth point of time to the seventh point of time by adding the first working electricity dependent deterioration value and the second working electricity dependent deterioration value to each other. By integrating the working electricity dependent deterioration values sequentially in the order of time during a period in which electricity is supplied to the energy storage device in this manner, the continuity of working electricity dependent deterioration can be ensured. Accordingly, a working electricity dependent deterioration value at a predetermined point of time can be accurately calculated and hence, the estimation accuracy of a state of the energy storage device can be enhanced.

The history acquisition part may be configured to acquire the charge-discharge history which contains: an average SOC which is an average value of SOCs of the energy storage device at a plurality of points of time; SOC change amounts which are change amounts at the plurality of points of time; and an average temperature which is an average value of temperatures of the energy storage device at the plurality of points of time, and the deterioration value estimation part may be configured to estimate the time dependent deterioration value and the working electricity dependent deterioration value using the average SOC, the SOC change amount and the average temperature included in the charge-discharge history.

With such a configuration, the energy storage device state estimation device acquires an average SOC, an SOC change amount and an average temperature of the energy storage device, and estimates a time dependent deterioration value and a working electricity dependent deterioration value using the average SOC, the SOC change amount and the average temperature of the energy storage device. To consider the case where data on the energy storage device is continuously measured for a long period for estimating a time dependent deterioration value and a working electricity dependent deterioration value, it is necessary to constantly store enormous data in a memory except for the case where the data can be constantly transferred by on line. To cope with such a task, the inventors of the present invention have found that the estimation accuracy of a time dependent deterioration value and a working electricity dependent deterioration value can be maintained at the substantially same level while compressing an amount of data with the use of an average SOC, an SOC change amount and an average temperature of the energy storage device. Accordingly, the energy storage device state estimation device can compress (reduce) an amount of data and, at the same time, can estimate a time dependent deterioration value and a working electricity dependent deterioration value with high accuracy with the use of the average SOC, the average temperature and the like without using an enormous amount of data on the SOC and temperature.

The history acquisition part may be configured to update the acquired charge-discharge history to a charge-discharge history for every predetermined period.

With such a configuration, the energy storage device state estimation device updates the acquired charge-discharge history to a charge-discharge history for every predetermined period. The inventors of the present invention have found that even when a charge-discharge history acquired for every one second is updated as a charge-discharge history for every predetermined period such as 10 minutes, estimation accuracy of a time dependent deterioration value and a working electricity dependent deterioration value can be maintained at the substantially same level. Accordingly, the energy storage device state estimation device can compress (reduce) an amount of data and, at the same time, can estimate the time dependent deterioration value and the working electricity dependent deterioration value with high accuracy.

The deterioration value estimation part may be configured to correct information about time dependent deterioration and information about working electricity dependent deterioration using the charge-discharge history, and may be configured to estimate the time dependent deterioration value and the working electricity dependent deterioration value using information about time dependent deterioration and information about working electricity dependent deterioration after correction.

With such a configuration, the energy storage device state estimation device estimates a time dependent deterioration value and a working electricity dependent deterioration value by correcting information about time dependent deterioration and information about working electricity dependent deterioration using a charge-discharge history. For example, in the case where deterioration tendency is changed during the use of the energy storage device, the case where the energy storage device which is an object to be estimated is changed and the case where estimation is performed by setting an assembled battery as one energy storage device, it is necessary to newly acquire information about time dependent deterioration and information about working electricity dependent deterioration. In this modification, the energy storage device state estimation device can estimate a time dependent deterioration value and a working electricity dependent deterioration value with high accuracy without newly acquiring information about time dependent deterioration and information about working electricity dependent deterioration by correcting information about time dependent deterioration and information about working electricity dependent deterioration corresponding to a past charge-discharge history.

The predetermined point of time may be a future point of time, the history acquisition part may be configured to acquire a charge-discharge history up to the future point of time by acquiring a past charge-discharge history and by estimating the charge-discharge history up to the future point of time, the deterioration value estimation part may be configured to estimate the time dependent deterioration value and the working electricity dependent deterioration value at the future point of time using information about time dependent deterioration and information about working electricity dependent deterioration corresponding to the charge-discharge history up to the future point of time, and the state estimation part may be configured to estimate a state of the energy storage device up to the future point of time using the time dependent deterioration value and the working electricity dependent deterioration value at the future point of time.

With such a configuration, the energy storage device state estimation device estimates a state of the energy storage device at a future point of time by acquiring a past charge-discharge history and by estimating the charge-discharge history up to the future point of time. Accordingly, the energy storage device state estimation device can estimate a state of the energy storage device at a future point of time with high accuracy.

The history acquisition part may be configured to receive the charge-discharge history from an energy storage apparatus including the energy storage device, and the state estimation part may be configured to transmit the estimated state of the energy storage device to the energy storage apparatus.

With such a configuration, the energy storage device state estimation device receives the charge-discharge history from an energy storage apparatus including the energy storage device, or transmits the estimated state of the energy storage device to the energy storage apparatus. That is, when a control board or the like which the energy storage device has estimates a state of the energy storage device, it is necessary for the control board to perform an enormous arithmetic calculation. By providing the energy storage device state estimation device as a separate body from the control board, it is possible to reduce an amount of arithmetic calculation which the control board performs.

Hereinafter, the description will be made with respect to an energy storage device state estimation device and an energy storage system which includes such an energy storage device state estimation device according to the embodiment of the present invention. All embodiments described hereinafter describe preferred specific examples of the present invention. In the embodiments described hereinafter, numerical values, shapes, materials, constitutional elements, the arrangement positions and connection states of the constitutional elements, steps, the order of the steps and the like are merely examples, and these are not intended to be used for limiting the present invention. Further, out of the constitutional elements in the embodiments described hereinafter, the constitutional elements which are not described in independent claims describing an uppermost concept of the present invention are described as arbitrary constitutional elements which form more preferable mode.

(Embodiment 1)

First, the configuration of an energy storage system 10 is described.

FIG. 1 is an external appearance view of the energy storage system 10 which includes an energy storage device state estimation device 100 according to an embodiment 1 of the present invention.

As shown in the drawing, the energy storage system 10 includes: a plurality of (five in the drawing) energy storage device state estimation devices 100; a plurality of (five in the drawing) energy storage devices 200; and a housing case 300 which houses the plurality of energy storage device state estimation devices 100 and the plurality of energy storage devices 200. That is, one energy storage device state estimation device 100 is disposed corresponding to one energy storage device 200.

Each energy storage device state estimation device 100 is a planar printed circuit board which is disposed above the energy storage device 200 and on which a circuit for estimating a state of the energy storage device 200 at a predetermined point of time is mounted. To be more specific, one energy storage device state estimation device 100 is connected to one energy storage device 200, acquires information from one energy storage device 200, and estimates a state such as a deterioration state or the like of such one energy storage device 200 at a predetermined point of time.

In this embodiment, the energy storage device state estimation devices 100 are disposed above the respective energy storage device 200. However, the energy storage device state estimation device 100 may be disposed at any places. Further, the shape of the energy storage device state estimation device 100 is not particularly limited.

The number of the energy storage device state estimation devices 100 is not limited to five, and may be other plural numbers or may be one. That is, one energy storage device state estimation device 100 may be disposed for a plurality of energy storage devices 200 or a plurality of energy storage device state estimation devices 100 may be disposed for one energy storage device 200. That is, a desired number of energy storage device state estimation devices 100 may be connected to a desired number of energy storage devices 200. The detailed function and configuration of the energy storage device state estimation device 100 is described later.

The energy storage device 200 is a secondary battery which can be charged with electricity and can discharge electricity. To be more specific, the energy storage device 200 is a nonaqueous electrolyte secondary battery such as a lithium ion secondary battery. In the drawing, five rectangular energy storage devices 200 are disposed in series so as to form an assembled battery. The number of the energy storage devices 200 is not limited to five, and may be other plural or singular. Further, the shape of the energy storage device 200 is also not particularly limited, and may be a circular columnar shape or an elongated circular columnar shape.

The energy storage device 200 includes a container, and electrode terminals (a positive electrode terminal and a negative electrode terminal) mounted on the container in a projecting manner. In the container, an electrode assembly, and current collectors (a positive electrode current collector and a negative electrode current collector) which make the electrode assembly and the electrode terminals connected to each other are disposed, and a liquid such as an electrolyte solution is filled in the container. The electrode assembly is formed by winding the positive electrode, the negative electrode and the separator with each other. The electrode assembly may not be a winding-type electrode assembly and may be a stack-type electrode assembly formed by stacking planar plates.

The positive electrode is an electrode plate where a positive active material layer is formed on a surface of a positive electrode base material layer which is an elongated strip-like metal foil made of aluminum, an aluminum alloy or the like. As a positive active material which is used for forming the positive active material layer, any desired known material can be used provided that the material is a positive active material which can adsorb and discharge lithium ion. For example, as a positive active material, a polyanionic compound such as $LiMPO_4$, $LiMSiO_4$, $LiMBO_3$ (M being one, two or more kinds of transition metal elements selected from a group consisting of Fe, Ni, Mn, Co and the like), lithium titanate, a spinel-type lithium manganese oxide such as $LiMn_2O_4$ or $LiMn_{1.5}Ni_{0.5}O_4$, a lithium transition metal oxide such as $LiMO_2$ (M being one, two or more kinds of transition metal elements selected from a group consisting of Fe, Ni, Mn, Co and the like) can be used.

The negative electrode is an electrode plate where a negative active material layer is formed on a surface of a negative electrode base material layer which is an elongated strip-like metal foil made of copper, a copper alloy or the like. As a negative active material which is used for forming the negative active material layer, any desired known material can be used provided that the material is a negative active material which can adsorb and discharge lithium ion. For example, as a negative active material, lithium metal and a lithium alloy (silicon lithium, aluminum lithium, lead lithium, tin lithium, aluminum tin lithium, gallium lithium, and a lithium metal containing alloy such as a wood alloy) are named. Besides such materials, an alloy which can adsorb and discharge lithium, a carbon material (for example, graphite, hardly graphitizable carbon, easily graphitizable carbon, low-temperature baked carbon, amorphous carbon or the like), silicon oxide, metal oxide, lithium metal oxide ($Li_4Ti_5O_{12}$ or the like), a polyphosphoric acid compound, a compound between a transition metal and a group 14 element to a group 16 element such as $Co_3O_4$, $Fe_2P$ or the like which is generally referred to as a conversion negative electrode can be named.

The separator is a fine porous sheet made of a resin. The separator used in the energy storage device 200 is not particularly different from a conventionally used sheet, and a desired known material can be used provided that the material does not impair performances of the energy storage device 200. Further, as an electrolyte solution (nonaqueous electrolyte) sealed in the container, various electrolyte solutions can be selected without being particularly limited to a specific kind provided that the electrolyte solution dose not impair performances of the energy storage device 200.

The energy storage device 200 is not limited to a nonaqueous electrolyte secondary battery, and may be a secondary battery other than a nonaqueous electrolyte secondary battery or may be a capacitor.

Next, the detailed function and configuration of the energy storage device state estimation device 100 is described.

Figure 2:
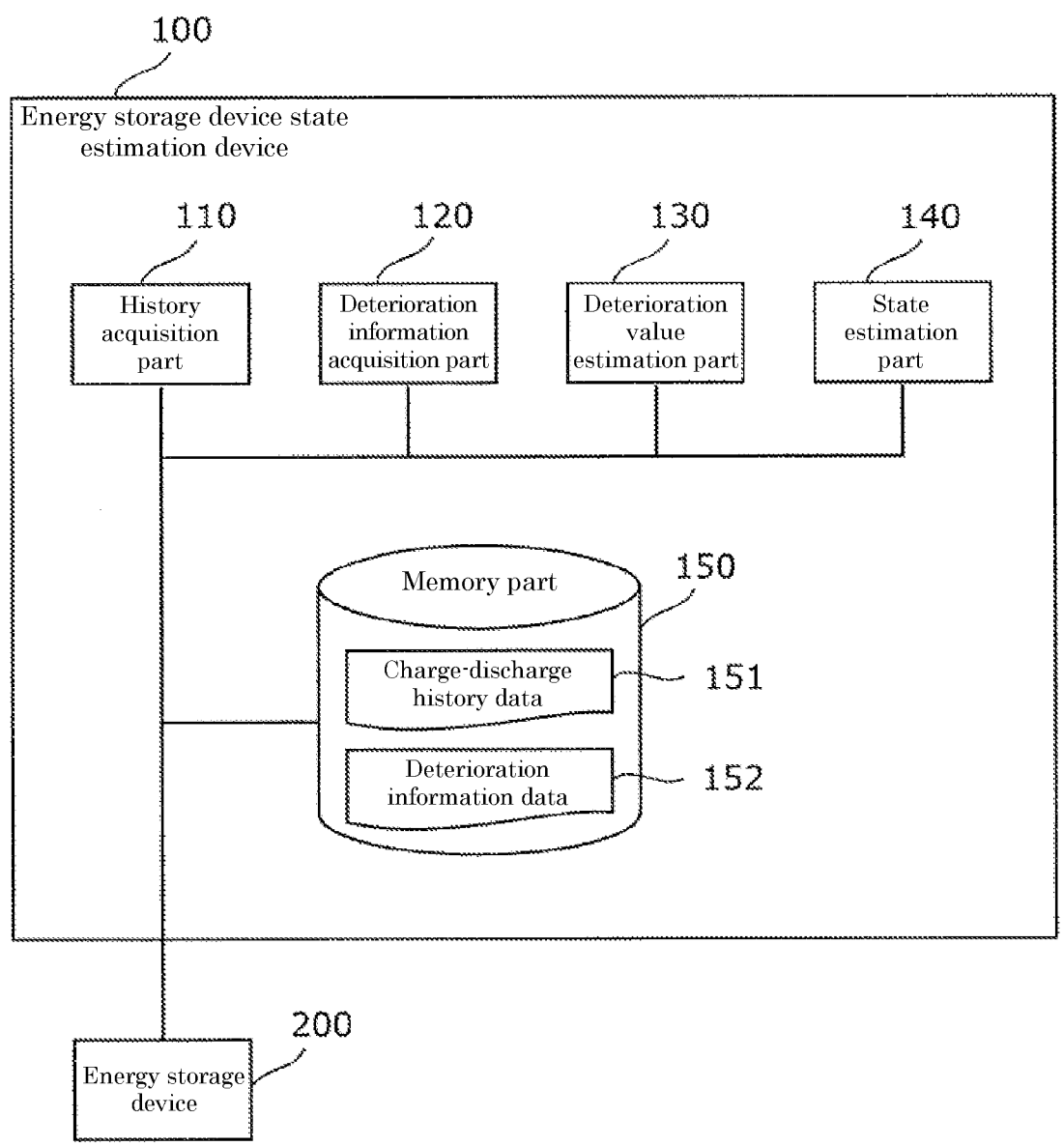
FIG. 2 is a block diagram showing the functional configuration of the energy storage device state estimation device according to the embodiment 1 of the present invention.

FIG. 2 is a block diagram showing the functional configuration of the energy storage device state estimation device 100 according to the embodiment 1 of the present invention.

The energy storage device state estimation device 100 is a device for estimating a state of the energy storage device 200 at a predetermined point of time. In this embodiment, a state of the energy storage device 200 means an electrical or mechanical state of the energy storage device 200. The state of the energy storage device 200 includes a deterioration state indicative of a deterioration degree of the energy storage device 200 and the like, for example.

As shown in the drawing, the energy storage device state estimation device 100 includes a history acquisition part 110, a deterioration information acquisition part 120, a deterioration value estimation part 130, a state estimation part 140 and a memory part 150. The memory part 150 is a memory for storing various data for estimating a state of the energy storage device 200 at a predetermined point of time, and charge-discharge history data 151 and deterioration information data 152 are stored in the memory part 150.

The history acquisition part 110 acquires a charge-discharge history of the energy storage device 200 at a predetermined point of time. To be more specific, the history acquisition part 110 is connected to the energy storage device 200, and detects and acquires a charge-discharge history from the energy storage device 200. That is, the history acquisition part 110 is electrically connected to electrode terminals of the energy storage device 200 on which the energy storage device state estimation device 100 is mounted by a wire such as a leading wire. The history acquisition part 110 acquires a charge-discharge history from the energy storage device 200 through the wire during a period up to a predetermined point of time.

To be more specific, the history acquisition part 110 constantly monitors an operation state of the energy storage device 200, and acquires a charge-discharge history each time a predetermined change is observed with respect to the operation state of the energy storage device 200. For example, the history acquisition part 110 monitors a change in voltage of the energy storage device 200, and when the difference in voltage exceeds 0.1% of a present voltage, it is regarded that the energy storage device 200 performs charge-discharge, and acquires a charge-discharge history. In this case, for example, each time a change in voltage of the energy storage device 200 exceeds 0.1%, the history acquisition part 110 acquires a charge-discharge history. That is, the history acquisition part 110 acquires a charge-discharge history at a sampling cycle where a change in voltage of the energy storage device 200 is set to 0.1%.

Timing at which a charge-discharge history is acquired is not limited to the above-mentioned timing, and the history acquisition part 110 may use any sampling cycle such as the case where a charge-discharge history is acquired at a sampling cycle 1 second during a use period of the energy storage device 200.

A charge-discharge history is an operation history of the energy storage device 200, and is information which includes: information indicative of a period during which the energy storage device 200 performs charging or discharging (use period); information about charging or discharging which the energy storage device 200 performs during the use period and the like.

To be more specific, information indicative of a use period of the energy storage device 200 is information which includes date (year/month/day) and time which are information indicative of a point of time that the energy storage device 200 performs charging or discharging or an integrated use period during which the energy storage device 200 is used or the like.

In this embodiment, an integrated use period is an integrated value of use periods of the energy storage device 200. To be more specific, the integrated use period indicates a period ranging from a point of time that the use of the energy storage device 200 is started to a predetermined point of time. As a unit of an integrated use period, any unit may be used provided that the unit indicates a period such as time (hour, minute, second), day, month, or cycle (the number of charges and discharges).

Information about charging or discharging which the energy storage device 200 performs is information indicative of a voltage, an electric current, a use temperature, a battery state and the like when the energy storage device 200 performs charging or discharging. The history acquisition part 110 acquires such information when it is regarded that the energy storage device 200 performs charging or discharging.

A use temperature is a use temperature of the energy storage device 200. As such a use temperature, the history acquisition part 110 may measure a temperature of the energy storage device 200 by mounting a thermometer to the container or the electrode terminal of the energy storage device 200 or may measure a temperature around the energy storage device 200 by a thermometer. The history acquisition part 110 may acquire a temperature of a region where the energy storage device 200 is used (outside air temperature) as such a use temperature.

A battery state is information indicative of an operation state of the energy storage device 200 such as a charge state, a discharge state or a non-use state (a state where neither charging nor discharging is performed). When the battery state is estimated based on information indicative of a voltage or an electric current of the energy storage device 200, information indicative of the battery state is unnecessary.

The history acquisition part 110 writes the acquired charge-discharge history into charge-discharge history data 151 stored in the memory part 150.

Figures 3A, 3B:
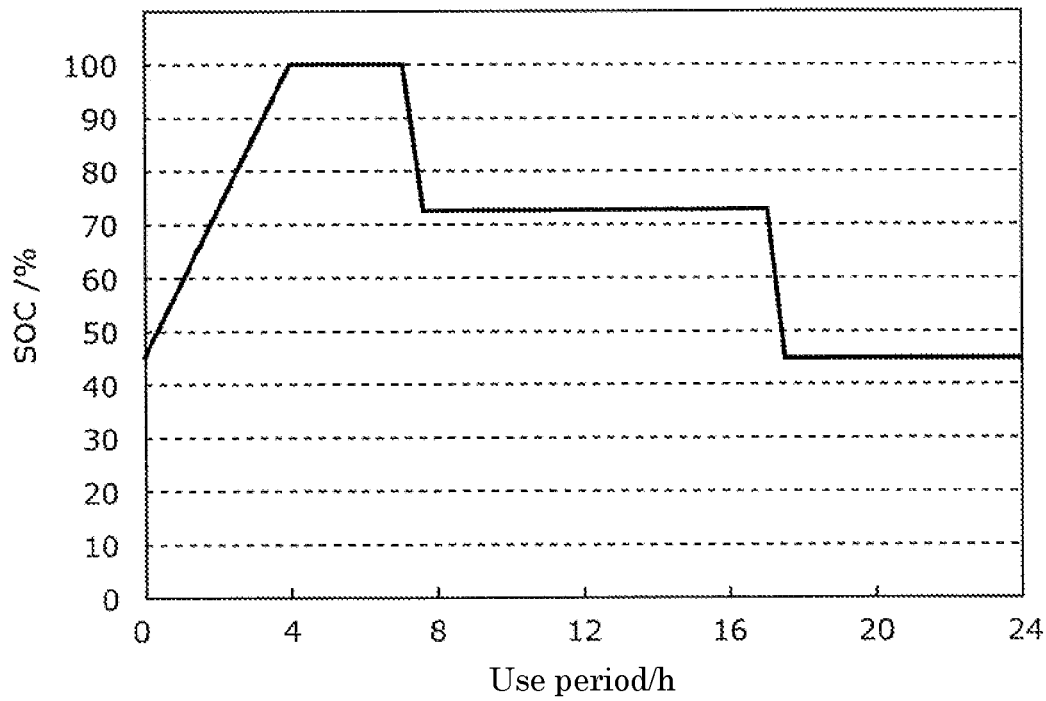
FIG. 3A is a view showing one example of a charge-discharge history written in charge-discharge history data according to the embodiment 1 of the present invention.
FIG. 3B is a view showing one example of pattern data generated by a history acquisition part according to the embodiment 1 of the present invention.

FIG. 3A is a view showing one example of a charge-discharge history written into the charge-discharge history data 151 according to the embodiment 1 of the present invention.

As shown in the drawing, in the charge-discharge history data 151, as a charge-discharge history, data indicative of a charge-discharge history which is an operation history of the energy storage device 200 up to a predetermine point of time is written. That is, in the charge-discharge history data 151, a data table is written where "date", "time", "use period", "voltage", "electric current", "SOC", "temperature" and "battery state" are made to be associated with each other.

Here, date (year/month/day) and time which are information indicative of a point of time at which the energy storage device 200 performs charging or discharging are stored in "date" and "time". In "use period", value indicative of an integrated use period during which the energy storage device 200 is used is stored. That is, the history acquisition part 110 measures a time using a timer or the like, acquires the date (year/month/day), the time and the integrated use period, and writes them in "date", "time" and "use period". The history acquisition part 110 may calculate the integrated use period using information stored in "date" and "time", and may write the integrated use period in "use period".

In "voltage", "electric current", "temperature" and "battery state", as information about charging or discharging which the energy storage device 200 performs, information indicative of a voltage, an electric current, a use temperature and a battery state when the energy storage device 200 performs charging or discharging is stored. That is, the history acquisition part 110 acquires a voltage, an electric current, a use temperature and a battery state of the energy storage device 200, and writes them in "voltage", "electric current", "temperature" and "battery state".

In "SOC", information indicative of an SOC (State Of Charge) of the energy storage device 200 when the energy storage device 200 performs charging or discharging is stored. The SOC is calculated by the history acquisition part 110 and is written in "SOC".

That is, the history acquisition part 110 calculates an SOC by estimating an SOC from a voltage value of the energy storage device 200 using an SOC-OCV characteristic indicative of a relationship between an SOC and an OCV (Open Circuit Voltage), for example. The history acquisition part 110 may calculate an SOC based on a current value of the energy storage device 200 using a current integration method which estimates an SOC by integrating charge-discharge currents.

The history acquisition part 110 generates pattern data using a relationship between an SOC, a use temperature and a use period of the energy storage device 200, and writes the generated pattern data into charge-discharge history data 151 as a charge-discharge history of the energy storage device 200.

FIG. 3B is a view showing one example of pattern data which the history acquisition part 110 according to the embodiment 1 of the present invention generates.

Pattern data is data indicative of an operation pattern of the energy storage device 200. To be more specific, pattern data is a mass of data indicative of a relationship between an SOC, a use temperature and a use period of the energy storage device 200. For example, when pattern data is expressed as a graph, pattern data is shown as a graph indicating a relationship between an SOC and a use period of the energy storage device 200 as shown in the drawing.

Pattern data is data obtained by patterning data which indicates a repeatedly performed change in data indicative of a change of a state quantity (SOC in the drawing) of the energy storage device 200 during a period up to a predetermined point of time. That is, when a change in the graph shown in the drawing is repeatedly performed during a period up to a predetermined point of time, data indicative of the change in the graph is generated as pattern data.

For example, when charging and discharging of the energy storage device 200 are repeatedly performed with a change in the graph every weekdays, data indicated in the graph is generated as pattern data of weekday. In the same manner, pattern data is generated also with respect to holiday. In generating pattern data, it is not necessary that the exactly same charge and discharge are repeated (exhibiting exactly same graph shape), and some displacement is allowed. This displacement amount is suitably determined by user setting or the like.

In this manner, the history acquisition part 110 generates a plurality of pattern data during a period up to the predetermined point of time. When there is only one charge-discharge pattern, the history acquisition part 110 may generate only one pattern data.

The history acquisition part 110 writes generated pattern data into charge-discharge history data 151 stored in the memory part 150. The history acquisition part 110 may write pattern data into charge-discharge history data 151 in the form of the graph shown in the drawing or may write pattern data into charge-discharge history data 151 in the form of a mass of data (data table) for forming the graph.

The history acquisition part 110 may erase a charge-discharge history used for generating pattern data from charge-discharge history data 151. That is, the charge-discharge history is patterned by the pattern data and hence, it is unnecessary to continuously preserve the charge-discharge history in the charge-discharge history data 151 and hence, the charge-discharge history can be erased from the charge-discharge history data 151.

In this manner, the history acquisition part 110 acquires pattern data obtained by patterning data indicative of a repeatedly performed change in data indicative of a change in a state quantity of the energy storage device 200 up to a predetermined point of time as a charge-discharge history. That is, the history acquisition part 110 generates and acquires pattern data obtained by patterning data indicative of a repeatedly performed change in data indicative of a change of a state quantity of the energy storage device 200 up to a predetermined point of time using a charge-discharge history stored in the charge-discharge history data 151.

A state quantity of the energy storage device 200 is a numerical value indicative of a state of the energy storage device 200. For example, a state quantity of the energy storage device 200 is a voltage or an electric current of the energy storage device 200 or a charge-discharge electric amount, an SOC or the like indicative of a charge-discharge state of the energy storage device 200. In this embodiment, a state quantity of the energy storage device 200 is an SOC of the energy storage device 200.

As described above, the energy storage device state estimation device 100 uses the pattern data which the history acquisition part 110 acquires as a charge-discharge history for estimating a state of the energy storage device 200 at a predetermined point of time. The energy storage device state estimation device 100 may estimate a state of the energy storage device 200 at a predetermined point of time using a charge-discharge history shown in FIG. 3A which the history acquisition part 110 acquires instead of using pattern data.

Returning to FIG. 2, the deterioration information acquisition part 120 acquires information about time dependent deterioration and information about working electricity dependent deterioration corresponding to a charge-discharge history which the history acquisition part 110 acquires. To be more specific, the deterioration information acquisition part 120 refers to deterioration information data 152 stored in the memory part 150, and extracts and acquires information about time dependent deterioration and information about working electricity dependent deterioration corresponding to the charge-discharge history from deterioration information written in the deterioration information data 152 in advance.

In this embodiment, information about time dependent deterioration means information indicative of a deterioration degree of time dependent deterioration where the energy storage device 200 deteriorates with a lapse of time in an open-circuit state, and information about working electricity dependent deterioration means information indicative of a deterioration degree of a working electricity dependent deterioration which is deterioration caused by working electricity excluding the time dependent deterioration. In this embodiment, information about time dependent deterioration is a coefficient in a formula indicative of an amount of time dependent deterioration of the energy storage device 200, and information about working electricity dependent deterioration is a coefficient in a formula indicative of an amount of working electricity dependent deterioration of the energy storage device 200.

Information about time dependent deterioration is a coefficient indicative of a deterioration degree during a period such as a night time where the energy storage device 200 is left in a state where the energy storage device 200 is neither charged nor discharged. Information about working electricity dependent deterioration is a value obtained by subtracting a time dependent deterioration coefficient during a period where the energy storage device 200 is charged and discharged from a coefficient indicative of a deterioration degree during a period where the energy storage device 200 is charged and discharged. That is, a sum of information about time dependent deterioration and information about working electricity dependent deterioration becomes a coefficient indicative of a deterioration degree during a period where the energy storage device 200 is charged and discharged.

The "open-circuit state" means a state where electricity is not supplied to the energy storage device 200, that is, a state where a current value of electricity which flows into the energy storage device 200 is zero. However, there may be a case where a fine electric current constantly flows into the energy storage device 200. In such a case, not only a state where a current value is zero but also a state where a current value is equal to or below a fixed value or an SOC change amount is equal to or below a fixed value are also regarded as the "open-circuit state".

In this embodiment, the history acquisition part 110 acquires charge-discharge history which contains at least one of an SOC and a use temperature of the energy storage device 200 and hence, the deterioration information acquisition part 120 acquires information about time dependent deterioration and information about working electricity dependent deterioration corresponding to at least one of the SOC and the use temperature of the energy storage device 200 in the charge-discharge history. In this embodiment, the history acquisition part 110 acquires a charge-discharge history containing the SOC and the use temperature of the energy storage device 200 and hence, the deterioration information acquisition part 120 acquires information about time dependent deterioration and information about working electricity dependent deterioration corresponding to the SOC and the use temperature of the energy storage device 200 in the charge-discharge history.

The history acquisition part 110 acquires a charge-discharge history containing histories by predetermined periods which are charge-discharge histories respectively corresponding to plural periods up to a predetermined point of time and hence, the deterioration information acquisition part 120 acquires information about time dependent deterioration and information about working electricity dependent deterioration which respectively correspond to the histories by predetermined periods.

Deterioration information (that is, information about time dependent deterioration and information about working electricity dependent deterioration which the deterioration information acquisition part 120 acquires) written in the deterioration information data 152 in advance is described hereinafter.

Figure 4A:
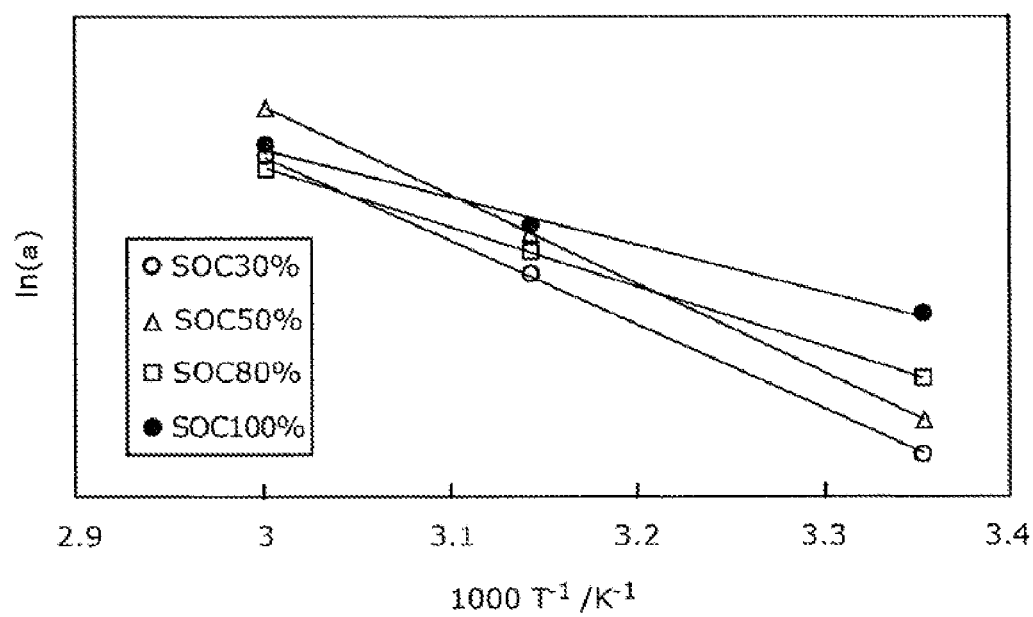
FIG. 4A is a view showing one example of information about deterioration preliminarily written in deterioration information data according to the embodiment 1 of the present invention.
Figure 4B:
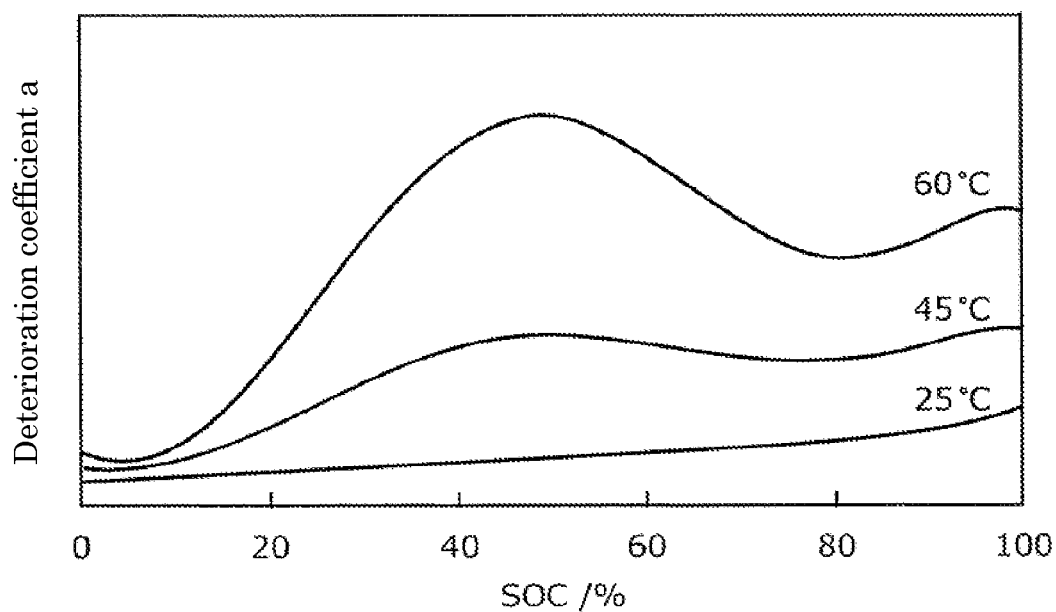
FIG. 4B is a view showing one example of information about deterioration preliminarily written in deterioration information data according to the embodiment 1 of the present invention.

FIG. 4A and FIG. 4B are views showing one example of deterioration information which is written in deterioration information data 152 according to the embodiment 1 of the present invention in advance.

In modeling the transition of a capacitance reduction ratio of the energy storage device 200 by an appropriate formula, a deterioration model formula of the energy storage device 200 adopts at least a use period t as a variable and hence, the transition of the capacitance reduction ratio of the energy storage device 200 can be modeled as f(t). A deterioration speed k(t) of the energy storage device 200 can be obtained by differentiating the deterioration model formula f(t) of the energy storage device 200 with respect to the variable t.

For example, when the deterioration model formula f(t) is expressed as $f(t)=a\sqrt{t}$, the deterioration speed k(t) is expressed as $k(t)=a/2 \cdot t^{-0.5}$, while when the deterioration model formula f(t) is expressed as $f(t)=bt^3+ct^2+dt$, the deterioration speed k(t) is expressed as $k(t)=3bt^2+2ct+d$. In these calculated deterioration speeds, a constant of proportionality and a constant term (a, b, c or d) are deterioration information, and are referred to as a deterioration coefficient hereinafter.

To prepare an Arrhenius plot with respect to the deterioration coefficient, as shown in FIG. 4A, a straight line relationship is obtained with respect to the respective SOCs.

By calculating a constant α (gradient) and a constant β (intercept) in a formula $\ln(a) = -\alpha(10^3/T) + \beta$, a deterioration coefficient a at a use temperature T can be calculated. When a simple proportional relationship shown in the drawing cannot be obtained, a deterioration coefficient at an SOC to be calculated can be calculated based on an interpolation value between the nearest two points. A graph indicative of such a change in deterioration coefficient when an SOC and a use temperature of the energy storage device 200 are changed can be also expressed as a map relating to use condition dependency of a deterioration coefficient shown in FIG. 4B (deterioration coefficient a in the drawing). A model formula for calculating a deterioration speed can be formed based on these factors.

In this manner, a time dependent deterioration coefficient which forms information about time dependent deterioration and a working electricity dependent deterioration coefficient which forms information about working electricity dependent deterioration are acquired in advance, and are written in deterioration information data 152 in advance. Data for calculating the time dependent deterioration coefficient and the working electricity dependent deterioration coefficient can be acquired by a capacity confirmation test, a cycle test and an open-circuit standing test described hereinafter, for example.

In the capacity confirmation test, in charging the energy storage device 200, 1 CA constant current and constant voltage charging is performed at a charge finish condition of 0.02 CA, and up to a charge upper limit voltage of 4.15 V, and in discharging the energy storage device 200, a constant current discharge is performed up to a discharge lower limit voltage of 2.75 V. A temperature is set to 25° C. in both charging and discharging the energy storage device 200. In the cycle test, in charging the energy storage device 200, 1 CA constant current charging is performed at a charge finish condition of 0.02 CA, and up to a charge upper limit voltage of 4.15 V, and in discharging the energy storage device 200, a constant current discharge is performed up to a discharge lower limit voltage of 2.75 V. In the cycle test, it is preferable that data be obtained by repeating the charging and discharging within a range of from an SOC of 90% to an SOC of 70%, or repeating charging and discharging within a range of from an SOC of 30% to an SOC of 10%, and the data be used as data for calculating working electricity dependent deterioration coefficients in various SOC ranges. Both charging and discharging are performed at temperatures of −10° C., 0° C., 10° C., 25° C., 45° C., and 55° C. The open-circuit standing test is performed by changing an SOC in increments of 10% within a range of from 10 to 100% and setting a temperature to −10° C., 0° C., 10° C., 25° C., 45° C., and 55° C.

That is, data for calculating a time dependent deterioration coefficient can be acquired by the open-circuit standing test and the capacity confirmation test, and data for calculating a working electricity dependent deterioration coefficient can be acquired by the cycle test and the capacity confirmation test. In calculating a working electricity dependent deterioration coefficient, the working electricity dependent deterioration coefficient which is a deterioration coefficient obtained by subtracting influence of time dependent deterioration at the time of supplying a constant current can be calculated by subtracting an average value of time dependent deterioration coefficients for respective SOCs from a deterioration coefficient acquired by the cycle test.

In this embodiment, as described previously, in calculating a working electricity dependent deterioration coefficient, it is preferable to adopt a constant current charge as a charging condition in a cycle test. However, when a charging condition in the cycle test is a constant current and constant voltage charging, a working electricity dependent deterioration coefficient can be calculated by a method described hereinafter.

In this case, assume a period during which a charge current in a constant voltage charge period is attenuated as an open-circuit standing test period, and regard this case as a composite endurance test formed of a cycle test and an open-circuit standing test. A time dependent deterioration coefficient with an SOC of 100% is applied to the open-circuit standing test period after charging, a time dependent deterioration coefficient with an SOC of 0% is applied to the open-circuit standing test period at the end of discharging, and a deterioration coefficient during a period that electricity is supplied other than the above-mentioned open-circuit standing test period is set to an unknown number x. Next, the above-mentioned condition is used as a charge-discharge pattern, and a deterioration coefficient x during a period that electricity is supplied to the energy storage device 200 is optimized by putting the pattern into a result of the test thus calculating an apparent deterioration coefficient only for a period during which a constant current is supplied to the energy storage device 200. A working electricity dependent deterioration coefficient which is a deterioration coefficient obtained by subtracting influence of time dependent deterioration during a period that a constant current is supplied to the energy storage device 200 can be calculated by subtracting an average value of time dependent deterioration coefficients for respective SOCs from the obtained deterioration coefficient only for the period during which a constant current is supplied to the energy storage device 200.

A time dependent deterioration coefficient and a working electricity dependent deterioration coefficient may be written in deterioration information data 152 in the form of graphs shown in FIG. 4A and FIG. 4B, or may be written in the deterioration information data 152 in the form of a data table.

Returning to FIG. 2, the deterioration value estimation part 130 estimates a time dependent deterioration value indicative of an amount of time dependent deterioration of the energy storage device 200 at a predetermined point of time and a working electricity dependent deterioration value indicative of an amount of working electricity dependent deterioration of the energy storage device 200 at a predetermined point of time which are obtained based on information about time dependent deterioration and information about working electricity dependent deterioration corresponding to a charge-discharge history. That is, the deterioration value estimation part 130 estimates a time dependent deterioration value and a working electricity dependent deterioration value using information about time dependent deterioration and information about working electricity dependent deterioration which the deterioration information acquisition part 120 acquires. To be more specific, the deterioration value estimation part 130 calculates time dependent deterioration values and working electricity dependent deterioration values for respective histories by predetermined periods using information about time dependent deterioration and information about working electricity dependent deterioration corresponding to the respective histories by predetermined periods, and calculates a time dependent deterioration value and a working electricity dependent deterioration value at a predetermined point of time by integrating the calculated time dependent deterioration values and working electricity dependent deterioration values sequentially in the order of histories by predetermined periods.

For example, assume a case where the history acquisition part 110 acquires a charge-discharge history which includes: a first history by a predetermined period which is a history by a predetermined period from a first point of time to a second point of time; and a second history by a predetermined period which is a history by a predetermined period from the second point of time to a third point of time. In this case, the deterioration information acquisition part 120 acquires: first information about time dependent deterioration which is information about time dependent deterioration corresponding to the first history by a predetermined period; and second information about time dependent deterioration which is information about time dependent deterioration corresponding to the second history by a predetermined period.

The deterioration value estimation part 130 calculates a first time dependent deterioration value which is a time dependent deterioration value from the first point of time to the second point of time using the first information about time dependent deterioration. The deterioration value estimation part 130 also calculates a second time dependent deterioration value which is a time dependent deterioration value from the second point of time to the third point of time using the second information about time dependent deterioration while setting a state where the deterioration of the first time dependent deterioration value takes place as a start point of time. Then, the deterioration value estimation part 130 calculates a time dependent deterioration value from the first point of time to the third point of time by adding the first time dependent deterioration value and the second time dependent deterioration value to each other.

Assume a case where the history acquisition part 110 acquires a charge-discharge history which includes: a third history by a predetermined period which is a history by a predetermined period from a fourth point of time at which electricity is supplied to the energy storage device 200 to a fifth point of time, and a fourth history by a predetermined period which is a history by a predetermined period from a sixth point of time at which electricity is supplied to the energy storage device 200 after the fifth point of time to a seventh point of time. In this case, the deterioration information acquisition part 120 acquires: first information about working electricity dependent deterioration which is information about working electricity dependent deterioration corresponding to the third history by a predetermined period; and second information about working electricity dependent deterioration which is information about working electricity dependent deterioration corresponding to the fourth history by a predetermined period.

The deterioration value estimation part 130 calculates a first working electricity dependent deterioration value which is a working electricity dependent deterioration value from the fourth point of time to the fifth point of time using the first information about working electricity dependent deterioration. The deterioration value estimation part 130 also calculates a second working electricity dependent deterioration value which is a working electricity dependent deterioration value from the sixth point of time to the seventh point of time using the second information about working electricity dependent deterioration while setting a state where the deterioration of the first working electricity dependent deterioration value takes place as a start point of time. Then, the deterioration value estimation part 130 calculates a working electricity dependent deterioration value from the fourth point of time to the seventh point of time by adding the first working electricity dependent deterioration value and the second working electricity dependent deterioration value to each other.

The detail of processing where the deterioration value estimation part 130 estimates a time dependent deterioration value and a working electricity dependent deterioration value at a predetermined point of time is described later. In this embodiment, a time dependent deterioration value is a deterioration amount (time dependent deterioration amount) in time dependent deterioration of the energy storage device 200, and a working electricity dependent deterioration value is a deterioration amount (working electricity dependent deterioration amount) in working electricity dependent deterioration of the energy storage device 200.

The state estimation part 140 estimates a state of the energy storage device 200 at a predetermined point of time using a time dependent deterioration value and a working electricity dependent deterioration value which the deterioration value estimation part 130 estimates. To be more specific, the state estimation part 140 estimates a deterioration state of the energy storage device 200 at a predetermined point of time by adding a time dependent deterioration value and a working electricity dependent deterioration value at the predetermined point of time to each other.

The above-mentioned predetermined point of time is a concept which includes not only a present point of time and a past point of time but also a future point of time.

That is, in estimating a state of the energy storage device 200 at a future point of time, the history acquisition part 110 sets a future point of time as a predetermined point of time, acquires a past charge-discharge history, and estimates a charge-discharge history up to the future point of time thus acquiring a prediction value of a charge-discharge history of the energy storage device 200 up to the future point of time as a charge-discharge history. The history acquisition part 110 may acquire a prediction value of a charge-discharge history up to a future point of time based on inputting by a user instead of acquiring a prediction value by calculation based on an actual performance value of a past charge-discharge history.

The deterioration information acquisition part 120 acquires information about time dependent deterioration and information about working electricity dependent deterioration up to a future point of time corresponding to a charge-discharge history. The deterioration value estimation part 130 estimates a time dependent deterioration value and a working electricity dependent deterioration value at the future point of time using the information about time dependent deterioration and the information about working electricity dependent deterioration up to the future point of time. The state estimation part 140 estimates a state of the energy storage device 200 at the future point of time using the time dependent deterioration value and the working electricity dependent deterioration value at the future point of time. With such steps, the state estimation part 140 can estimate a remaining lifetime of the energy storage device 200, for example.

Next, processing where the energy storage device state estimation device 100 estimates a state of the energy storage device 200 at a predetermined point of time is described in detail.

Figure 5:
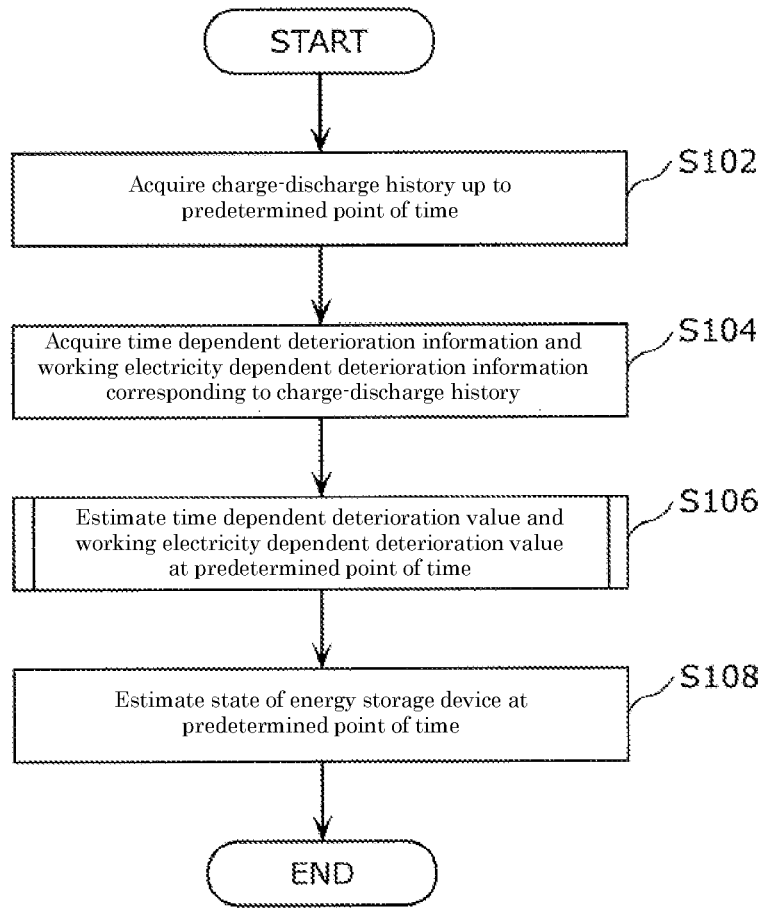
FIG. 5 is a flowchart showing one example of processing where the energy storage device state estimation device according to the embodiment 1 of the present invention estimates a state of an energy storage device at a predetermined point of time.

FIG. 5 is a flowchart showing one example of processing where the energy storage device state estimation device 100 according to the embodiment 1 of the present invention estimates a state of the energy storage device 200 at a predetermined point of time.

First, as shown in the drawing, the history acquisition part 110 acquires a charge-discharge history of the energy storage device 200 up to a predetermined point of time (S102: history acquisition step).

To be more specific, the history acquisition part 110 acquires, as a charge-discharge history, pattern data obtained by patterning data indicative of a change which repeatedly takes place among data indicative of a change in state quantity of the energy storage device 200 up to a predetermined point of time.

Figure 6:
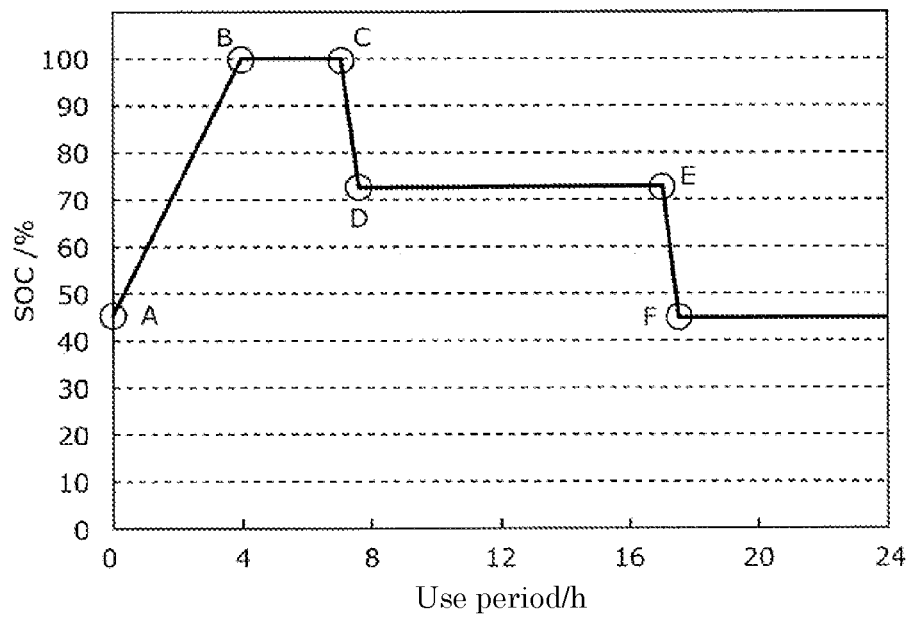
FIG. 6 is a view showing one example of pattern data acquired by a history acquisition part according to the embodiment 1 of the present invention.

That is, the history acquisition part 110 acquires pattern data shown in FIG. 6 as a charge-discharge history. The pattern data is written in the charge-discharge history data 151, and the history acquisition part 110 acquires the pattern data from the charge-discharge history data 151. FIG. 6 is a view showing one example of pattern data which the history acquisition part 110 according to the embodiment 1 of the present invention acquires.

In FIG. 6, points A to F indicate change points of a state quantity (SOC in the drawing) in pattern data.

Next, the deterioration information acquisition part 120 acquires information about time dependent deterioration and information about working electricity dependent deterioration corresponding to a charge-discharge history which the history acquisition part 110 acquires (S104: deterioration information acquisition step). Information about time dependent deterioration and information about working electricity dependent deterioration which the deterioration information acquisition part 120 acquires is described in detail hereinafter.

Figure 7A:
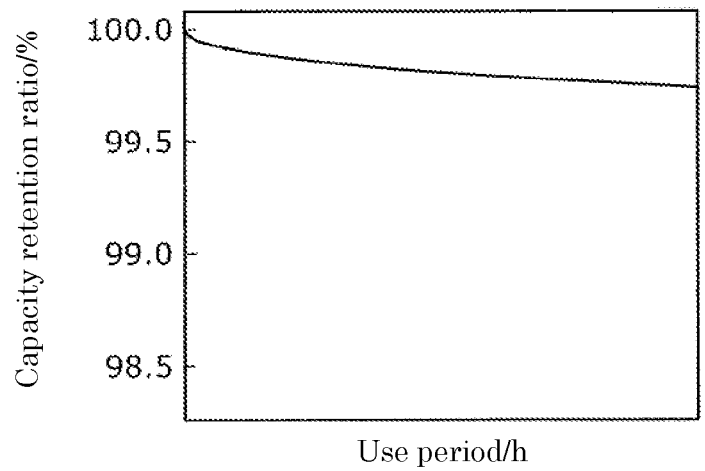
FIG. 7A is a view for describing information about time dependent deterioration which corresponds to a use period between A and B in FIG. 6 acquired by a deterioration information acquisition part according to the embodiment 1 of the present invention.
Figure 7B:
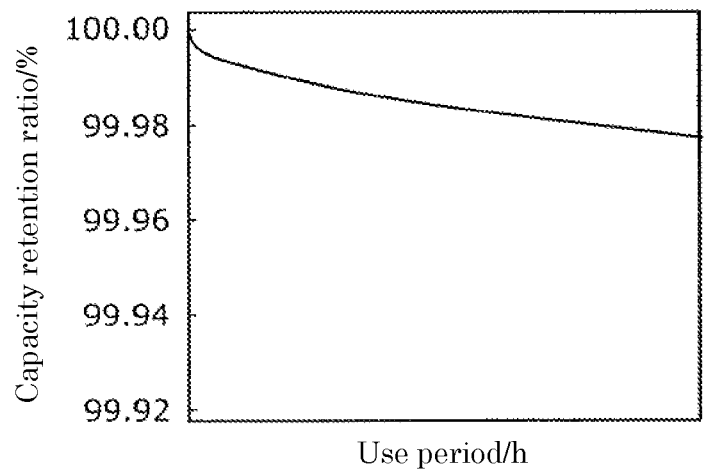
FIG. 7B is a view for describing information about working electricity dependent deterioration which corresponds to the use period between A and B in FIG. 6 acquired by a deterioration information acquisition part according to the embodiment 1 of the present invention.

FIG. 7A is a view for describing information about time dependent deterioration which corresponds to a use period between A and B in FIG. 6 acquired by the deterioration information acquisition part 120 according to the embodiment 1 of the present invention. FIG. 7B is a view for describing information about working electricity dependent deterioration which corresponds to the use period between A and B in FIG. 6 acquired by the deterioration information acquisition part 120 according to the embodiment 1 of the present invention.

To be more specific, FIG. 7A and FIG. 7B are graphs indicative of a relationship between a use period and a capacity retention ratio when the energy storage device 200 is used in the same manner as the use from point A to point B in the pattern data shown in FIG. 6, wherein FIG. 7A indicates the transition of time dependent deterioration and FIG. 7B indicates the transition of working electricity dependent deterioration. That is, in the case where the deterioration of the energy storage device 200 which is caused due to repeated charging and discharging at an SOC of 45% to 100% is divided into time dependent deterioration and working electricity dependent deterioration, FIG. 7A shows the time dependent deterioration and FIG. 7B shows working electricity dependent deterioration.

The deterioration information acquisition part 120 acquires a time dependent deterioration coefficient which forms information about time dependent deterioration corresponding to the graph shown in FIG. 7A with respect to the use period between A and B in the pattern data shown in FIG. 6. A time dependent deterioration coefficient also changes corresponding to a change in an SOC in the use period between A and B and hence, the deterioration information acquisition part 120 acquires an average value of a time dependent deterioration coefficient in the use period between A and B (at an SOC of from 45% to 100%) by a weighted average. The deterioration information acquisition part 120 may acquire a time dependent deterioration coefficient at an average value of an SOC between A and B (SOC of 72.5%).

The deterioration information acquisition part 120 acquires a working electricity dependent deterioration coefficient corresponding to a graph shown in FIG. 7B as information about working electricity dependent deterioration in the use period between A and B. That is, the deterioration information acquisition part 120 acquires a working electricity dependent deterioration coefficient when the energy storage device 200 is charged from an SOC of 45% to an SOC of 100%.

For example, the deterioration information acquisition part 120 acquires a formula for calculating deterioration coefficients described with reference to FIG. 4A and FIG. 4B and constants for setting the deterioration coefficients ($\alpha$, $\beta$ in the description of FIG. 4A) with respect to information about time dependent deterioration and information about working electricity dependent deterioration respectively. To be more specific, the deterioration information acquisition part 120 extracts and acquires the formula, the constants and the like corresponding to charge-discharge history (corresponding to the graphs shown in FIG. 7A or FIG. 7B) from data written in deterioration information data 152 in advance.

Figure 7C:
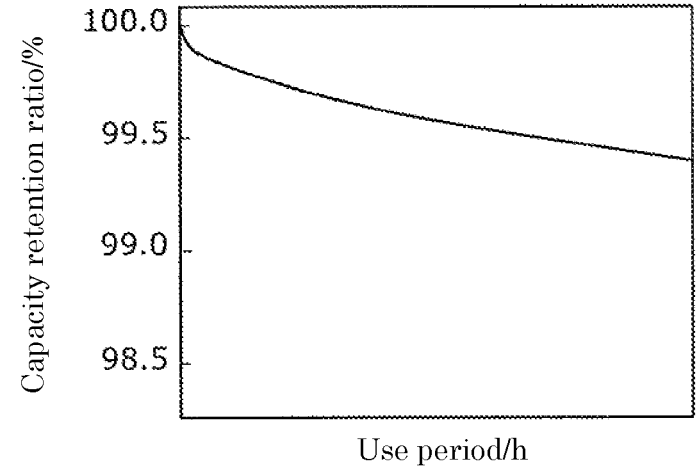
FIG. 7C is a view for describing information about time dependent deterioration which corresponds to a use period between B and C in FIG. 6 acquired by the deterioration information acquisition part according to the embodiment 1 of the present invention.

FIG. 7C is a view for describing information about time dependent deterioration which corresponds to a use period between B and C in FIG. 6 acquired by the deterioration information acquisition part 120 according to the embodiment 1 of the present invention. To be more specific, FIG. 7C shows time dependent deterioration when the energy storage device 200 is left in an open-circuit standing state with an SOC of 100%.

The deterioration information acquisition part 120 acquires a time dependent deterioration coefficient corresponding to a graph shown in FIG. 7C as information about time dependent deterioration with respect to the use period between B and C in the pattern data shown in FIG. 6. That is, the deterioration information acquisition part 120 acquires a time dependent deterioration coefficient at a value of an SOC between B and C (SOC of 100%). Since charging and discharging are not performed in the use period between B and C, the deterioration information acquisition part 120 acquires only information about time dependent deterioration, and does not acquire information about working electricity dependent deterioration or acquires information about working electricity dependent deterioration (working electricity dependent deterioration coefficient) as "0".

In accordance with the steps described above, the deterioration information acquisition part 120 sequentially acquires, in respective zones of pattern data, information about time dependent deterioration and information about working electricity dependent deterioration corresponding to charge-discharge histories of the respective zones. A scale taken on an axis of ordinates (capacity retention ratio) in graphs shown in FIG. 7A to FIG. 7C is one example, and the scale is suitably set corresponding to a deterioration degree of the energy storage device 200 whose state is to be estimated. A scale taken on an axis of ordinates (capacity retention ratio) in graphs shown in FIG. 9, FIG. 10 and the like described hereinafter is set substantially in the same manner.

Returning to FIG. 5, the deterioration value estimation part 130 estimates a time dependent deterioration value indicative of an amount of time dependent deterioration of the energy storage device 200 at a predetermined point of time and a working electricity dependent deterioration value indicative of an amount of working electricity dependent deterioration of the energy storage device 200 at a predetermined point of time which are obtained based on information about time dependent deterioration and information about working electricity dependent deterioration which the deterioration information acquisition part 120 acquires (S106: deterioration value estimation step).

To be more specific, the deterioration value estimation part 130 calculates time dependent deterioration values and working electricity dependent deterioration values for respective histories by predetermined periods using information about time dependent deterioration and information about working electricity dependent deterioration corresponding to the respective histories by predetermined periods (charge-discharge histories of the respective zones in the previously described pattern date in this embodiment). The deterioration value estimation part 130 calculates a time dependent deterioration value and a working electricity dependent deterioration value at a predetermined point of time by integrating the calculated time dependent deterioration values and working electricity dependent deterioration values sequentially in the order of histories by predetermined periods.

The detail of processing where the deterioration value estimation part 130 estimates a time dependent deterioration value and a working electricity dependent deterioration value at a predetermined point of time is described later.

The state estimation part 140 estimates a state of the energy storage device 200 at a predetermined point of time using a time dependent deterioration value and a working electricity dependent deterioration value which the deterioration value estimation part 130 estimates (S108: state estimation step).

To be more specific, the state estimation part 140 estimates a deterioration state of the energy storage device 200 at a predetermined point of time by adding the time dependent deterioration value and the working electricity dependent deterioration value to each other at the predetermined point of time, for example.

In this manner, the energy storage device state estimation device 100 can estimate a state of the energy storage device 200 at a present point of time, a past point of time or a future point of time. By performing the above-mentioned steps, processing where the energy storage device state estimation device 100 estimates a state of the energy storage device 200 at a predetermined point of time is finished.

Next, processing where the deterioration value estimation part 130 estimates a time dependent deterioration value and a working electricity dependent deterioration value at a predetermined point of time (S106 in FIG. 5) is described in detail.

Figure 8:
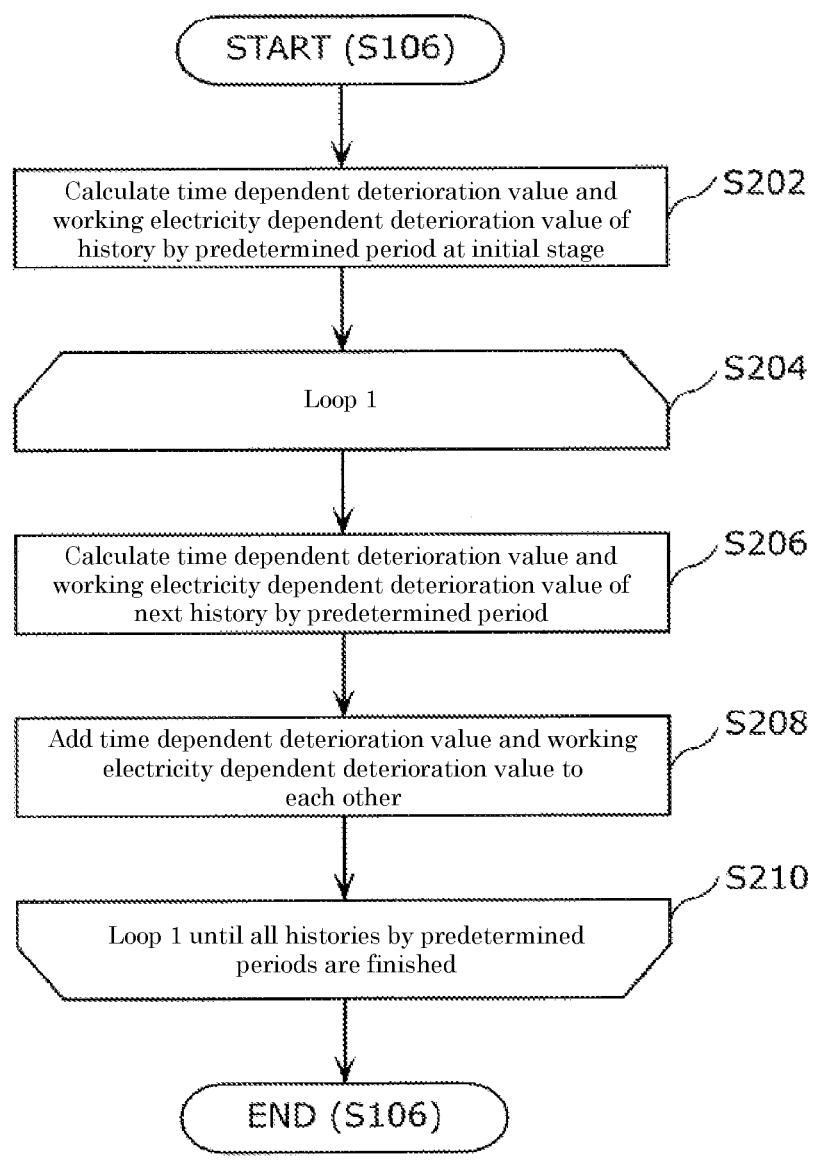
FIG. 8 is a flowchart showing one example of processing where a deterioration value estimation part according to the embodiment 1 of the present invention estimates a time dependent deterioration value and a working electricity dependent deterioration value at a predetermined point of time.

FIG. 8 is a flowchart showing one example of processing where the deterioration value estimation part 130 according to the embodiment 1 of the present invention estimates a time dependent deterioration value and a working electricity dependent deterioration value at a predetermined point of time.

First, as shown in the drawing, the deterioration value estimation part 130 calculates a time dependent deterioration value and a working electricity dependent deterioration value in a history by a predetermined period at an initial stage (S202). That is, the deterioration value estimation part 130 calculates a time dependent deterioration value and a working electricity dependent deterioration value in a history by a predetermined period in the use period between A and B using a time dependent deterioration coefficient and a working electricity dependent deterioration coefficient corresponding to the history by a predetermined period at the initial stage.

In this embodiment, the deterioration value estimation part 130 calculates a time dependent deterioration amount and a working electricity dependent deterioration amount which are deterioration amounts in the history by a predetermined period at the initial stage using a time dependent deterioration coefficient and a working electricity dependent information about coefficient corresponding to a history by predetermined period between A and B in pattern data shown in FIG. 6.

Next, the deterioration value estimation part 130 repeats processing (S206 to S208) described hereinafter until the whole histories by predetermined periods are finished (loop 1: S204 to S210).

First, the deterioration value estimation part 130 calculates a time dependent deterioration amount and a working electricity dependent deterioration amount in a next history by a predetermined period (S206). That is, the deterioration value estimation part 130 calculates the time dependent deterioration amount and the working electricity dependent deterioration amount in the next history by a predetermined period using a time dependent deterioration coefficient and a working electricity dependent deterioration coefficient corresponding to the next history by a predetermined period.

For example, the deterioration value estimation part 130 calculates the time dependent deterioration amount and the working electricity dependent deterioration amount in the history by a predetermined period in the use period between B and C using the time dependent deterioration coefficient and the working electricity dependent deterioration coefficient corresponding to the history by a predetermined period in the use period between B and C in the pattern data shown in FIG. 6.

Then, the deterioration value estimation part 130 calculates a time dependent deterioration amount and a working electricity dependent deterioration amount respectively (S208). That is, the deterioration value estimation part 130 adds a time dependent deterioration amount in a history by a predetermined period at an initial stage and a time dependent deterioration amount in a next history by a predetermined period to each other and adds a working electricity dependent deterioration amount in the history by a predetermined period at an initial stage and a working electricity dependent deterioration amount in the next history by a predetermined period to each other.

In accordance with the above-mentioned steps, the deterioration value estimation part 130 calculates a time dependent deterioration amount and a working electricity dependent deterioration amount for respective histories by predetermined periods, and integrates the calculated time dependent deterioration amounts and working electricity dependent deterioration amounts sequentially in order of the histories by predetermined periods thus calculating a time dependent deterioration amount and a working electricity dependent deterioration amount at a predetermined point of time.

The processing where the deterioration value estimation part 130 estimates a time dependent deterioration amount and a working electricity dependent deterioration amount at a predetermined point of time is described more specifically.

Figure 9:
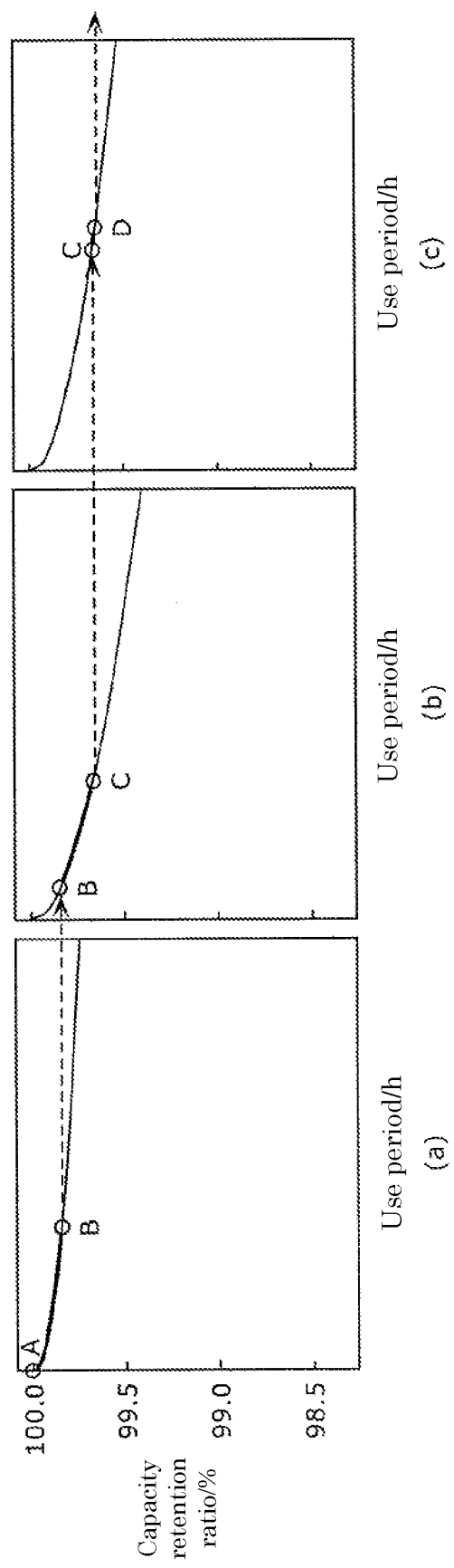
FIG. 9 is a view for describing processing where the deterioration value estimation part according to the embodiment 1 of the present invention estimates a time dependent deterioration value at a predetermined point of time.
Figure 10:
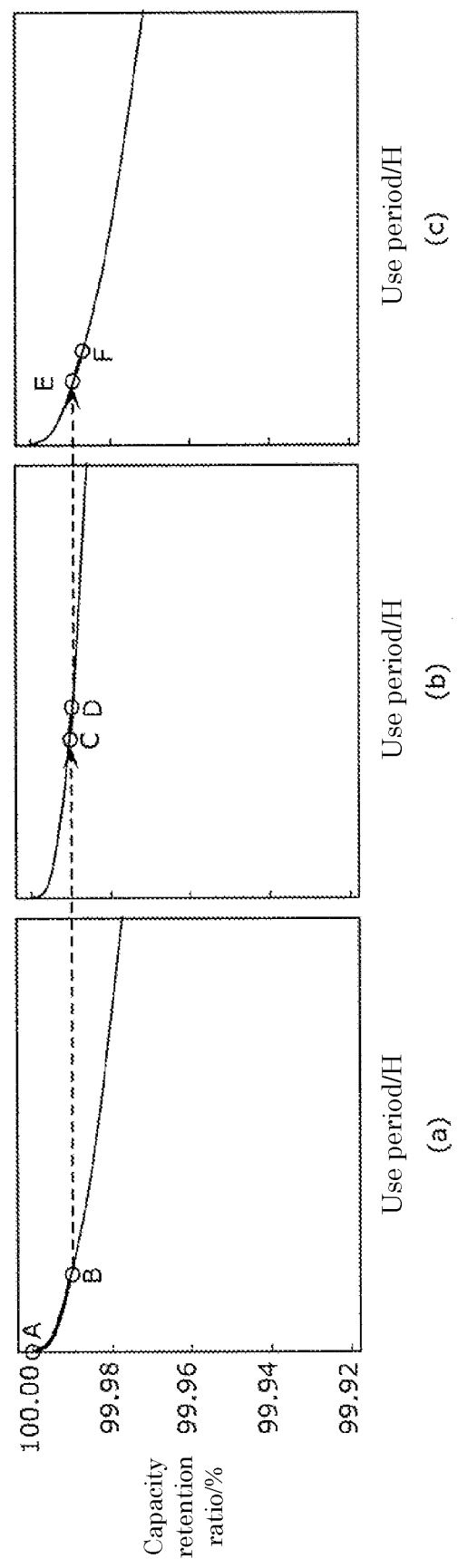
FIG. 10 is a view for describing processing where the deterioration value estimation part according to the embodiment 1 of the present invention estimates a working electricity dependent deterioration value at a predetermined point of time.

FIG. 9 is a view for describing processing where the deterioration value estimation part 130 according to the embodiment 1 of the present invention estimates a time dependent deterioration amount at a predetermined point of time. FIG. 10 is a view for describing processing where the deterioration value estimation part 130 according to the embodiment 1 of the present invention estimates a working electricity dependent deterioration amount at a predetermined point of time.

First, in the processing where the deterioration value estimation part 130 estimates a time dependent deterioration amount, assume point A in the pattern data shown in FIG. 6 as a first point of time, point B shown in FIG. 6 as a second point of time, and point C shown in FIG. 6 as a third point of time. In this case, the history acquisition part 110 acquires a charge-discharge history which contains: a first history by a predetermined period (a charge-discharge history between A and B) which is a history by a predetermined period from the first point of time to the second point of time; and a second history by a predetermined period (a charge-discharge history between B and C) which is a history by a predetermined period from the second point of time to the third point of time.

The deterioration information acquisition part 120 acquires: first information about time dependent deterioration which is information about time dependent deterioration corresponding to the first history by a predetermined period; and second information about time dependent deterioration which is information about time dependent deterioration corresponding to the second history by a predetermined period.

To be more specific, the deterioration information acquisition part 120 acquires a time dependent deterioration coefficient corresponding to a graph shown in (a) of FIG. 9 as first information about time dependent deterioration, and acquires a time dependent deterioration coefficient corresponding to a graph shown in (b) of FIG. 9 as second information about time dependent deterioration. (a) of FIG. 9 is the graph indicating the time dependent deterioration coefficient corresponding to a use period between A and B in the pattern data shown in FIG. 6, and the graph corresponds the graph shown in FIG. 7A. (b) of FIG. 9 is the graph indicating the time dependent deterioration coefficient corresponding to a use period between B and C in the pattern data shown in FIG. 6, and the graph corresponds the graph shown in FIG. 7C.

The deterioration value estimation part 130 calculates a first time dependent deterioration value which is a time dependent deterioration value from the first point of time to the second point of time using the first information about time dependent deterioration. That is, the deterioration value estimation part 130 calculates a time dependent deterioration amount between A and B in (a) of FIG. 9 as the first time dependent deterioration value. In the drawing, the time dependent deterioration amount is indicated as a capacity retention ratio of the energy storage device 200.

The deterioration value estimation part 130 calculates a second time dependent deterioration value which is a time dependent deterioration value from the second point of time to the third point of time using the second information about time dependent deterioration while setting a state where the deterioration of the first time dependent deterioration value takes place as a start point of time. That is, in (b) of FIG. 9, the deterioration value estimation part 130 calculates a time dependent deterioration amount between B and C as the second time dependent deterioration value using a value of the capacity retention ratio at point B in (a) of FIG. 9 as a start point of time. Also in the drawing, the time dependent deterioration amount is indicated as a capacity retention ratio of the energy storage device 200.

Then, the deterioration value estimation part 130 calculates a time dependent deterioration value (time dependent deterioration amount) from the first point of time to the third point of time (from point A to point C) by adding the first time dependent deterioration value and the second time dependent deterioration value to each other.

Next, as shown in (c) of FIG. 9, the deterioration value estimation part 130 redefines point C as the second point of time and point D as the third point of time in the pattern data shown in FIG. 6, and repeats processing substantially equal to the above-mentioned processing thus calculating a time dependent deterioration amount from point A to point D. (c) of FIG. 9 is a graph showing a time dependent deterioration coefficient corresponding to the use period between C and D in the pattern data shown in FIG. 6.

In accordance with the above-mentioned steps, the deterioration value estimation part 130 calculates time dependent deterioration amounts for respective histories by predetermined periods, and integrates the calculated time dependent deterioration amounts sequentially in the order of histories by predetermined periods thus calculating a time dependent deterioration amount at a predetermined point of time.

In the processing where the deterioration value estimation part 130 estimates a working electricity dependent deterioration value, assume point A in the pattern data shown in FIG. 6 as a fourth point of time, point B as a fifth point of time, point C as a sixth point of time, and point D as a seventh point of time. In this case, the history acquisition part 110 acquires a charge-discharge history which contains: a third history by a predetermined period (the charge-discharge history between A and B) which is a history by a predetermined period from the fourth point of time to the fifth point of time during which electricity is supplied to the energy storage device 200; and a fourth history by a predetermined period (the charge-discharge history between C and D) which is a history by a predetermined period from the sixth point of time to the seventh point of time during which electricity is supplied to the energy storage device 200 after the fifth point of time.

Then, the deterioration information acquisition part 120 acquires: first information about working electricity dependent deterioration which is information about working electricity dependent deterioration corresponding to the third history by a predetermined period; and second information about working electricity dependent deterioration which is information about working electricity dependent deterioration corresponding to the fourth history by a predetermined period.

To be more specific, the deterioration information acquisition part 120 acquires a working electricity dependent deterioration coefficient corresponding to a graph shown in (a) of FIG. 10 as first information about working electricity dependent deterioration, and a working electricity dependent deterioration coefficient corresponding to a graph shown in (b) of FIG. 10 as second information about working electricity dependent deterioration. (a) of FIG. 10 is a graph indicating a working electricity dependent deterioration coefficient corresponding to a use period between A and B in pattern data shown in FIG. 6, and corresponds to FIG. 7B. (b) of FIG. 10 is a graph indicating a working electricity dependent deterioration coefficient corresponding to a use period between C and D in the pattern data shown in FIG. 6.

The deterioration value estimation part 130 calculates a first working electricity dependent deterioration value which is a working electricity dependent deterioration value from the fourth point of time to the fifth point of time using the first information about working electricity dependent deterioration. That is, the deterioration value estimation part 130 calculates a working electricity dependent deterioration amount between A and B in (a) of FIG. 10 as the first working electricity dependent deterioration value. In the drawing, the working electricity dependent deterioration amount is indicated as a capacity retention ratio of the energy storage device 200.

Then, the deterioration value estimation part 130 calculates a second working electricity dependent deterioration value which is a working electricity dependent deterioration value from the sixth point of time to the seventh point of time using the second information about working electricity dependent deterioration while setting a state where the deterioration of the first working electricity dependent deterioration value takes place as a start point of time. That is, in (b) of FIG. 10, the deterioration value estimation part 130 calculates a working electricity dependent deterioration amount between C and D as the second working electricity dependent deterioration value using a value of a capacity retention ratio at point B in (a) of FIG. 10 as a capacity retention ratio at point C which is a start point of time. Also in the drawing, the working electricity dependent deterioration amount is indicated as a capacity retention ratio of the energy storage device 200.

Then, the deterioration value estimation part 130 calculates a working electricity dependent deterioration value (working electricity dependent deterioration amount) from the fourth point of time to the seventh point of time (from point A to point D) by adding the first working electricity dependent deterioration value and the second working electricity dependent deterioration value to each other.

Next, as shown in (c) of FIG. 10, the deterioration value estimation part 130 redefines point D as the fifth point of time, point E as the sixth point of time, and point F as the seventh point in the pattern data shown in FIG. 6, and repeats processing substantially equal to the above-mentioned processing thus calculating a working electricity dependent deterioration amount from point A to point F. (c) of FIG. 10 is a graph indicating a working electricity dependent deterioration coefficient corresponding to the use period between E and F in the pattern data shown in FIG. 6.

In accordance with the above-mentioned steps, the deterioration value estimation part 130 calculates working electricity dependent deterioration amounts for respective histories by predetermined periods, and integrates the calculated working electricity dependent deterioration amounts sequentially in order of the histories by predetermined periods thus calculating a working electricity dependent deterioration amount at a predetermined point of time.

For example, the deterioration value estimation part 130 can calculate a time dependent deterioration amount y and a working electricity dependent deterioration amount z using the following formulae. In these formulae, a model formula of time dependent deterioration of the energy storage device 200 during a use period t with a time dependent deterioration coefficient set to $a_{sto}$ is expressed by $f(t)=a_{sto}\sqrt{t}$, and a model formula of working electricity dependent deterioration of the energy storage device 200 during the use period t with a working electricity dependent deterioration coefficient set to $a_{cyc}$ is expressed by $g(t)=a_{cyc}\sqrt{t}$. Further, an SOC at a predetermined point of time i is expressed as $S_i$, a working electricity rate at the predetermined point of time is expressed as $C_i$, a use temperature at the predetermined point of time i is expressed as $T_i$, a use period at the predetermined point of time i is expressed as ti, and ΔDOD when electricity is supplied (a change amount of depth of discharge) at the predetermined point of time i is expressed as $D_i$.

$$y_n = y_{n-1} + a_{sto}(S_n, T_n) \times \left[ \left\{ \left( \frac{y_{n-1}}{a_{sto}(S_n, T_n)} \right)^2 + (t_n - t_{n-1}) \right\}^{0.5} - \left( \frac{y_{n-1}}{a_{sto}(S_n, T_n)} \right) \right]$$

$$z_n = z_{n-1} + a_{cyc}(C_n, T_n) \times \left[ \left\{ \left( \frac{z_{n-1}}{a_{cyc}(D_n, C_n, T_n)} \right)^2 + (t_n - t_{n-1}) \right\}^{0.5} - \left( \frac{z_{n-1}}{a_{cyc}(D_n, C_n, T_n)} \right) \right]$$

[Formula 1]

By performing the above-mentioned steps, processing where the deterioration value estimation part 130 estimates a time dependent deterioration value and a working electricity dependent deterioration value at a predetermined point of time (S106 in FIG. 5) is finished.

Next, advantageous effects which the energy storage device state estimation device 100 can acquire are described.

Figures 11A, 11B:
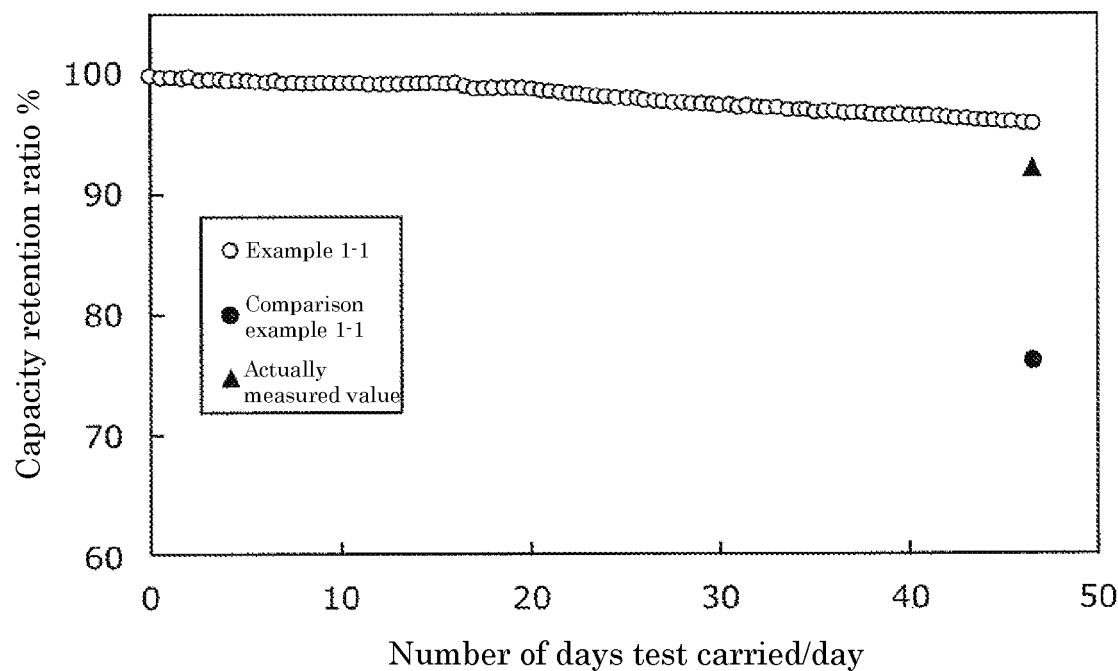
FIG. 11A is a view showing results of estimation of a state of an energy storage device at a predetermined point of time after a lapse of a short period with respect to the energy storage device state estimation device according to the embodiment 1 of the present invention and a comparison example 1.
FIG. 11B is a view showing results of estimation of a state of the energy storage device at a predetermined point of time after a lapse of the short period with respect to the energy storage device state estimation device according to the embodiment 1 of the present invention and the comparison example 1.

FIG. 11A and FIG. 11B are views showing results of estimation of a state of the energy storage device 200 at a predetermined point of time after a lapse of a short period with respect to the energy storage device state estimation device 100 according to the embodiment 1 of the present invention and a comparison example 1. To be more specific, these drawings are views showing results of estimation on the 47th day with respect to the energy storage device state estimation device 100 which forms the example 1 (example 1-1) and the device described in the above-mentioned patent document 1 which forms a comparison example 1 (comparison example 1-1).

Figures 12A, 12B:
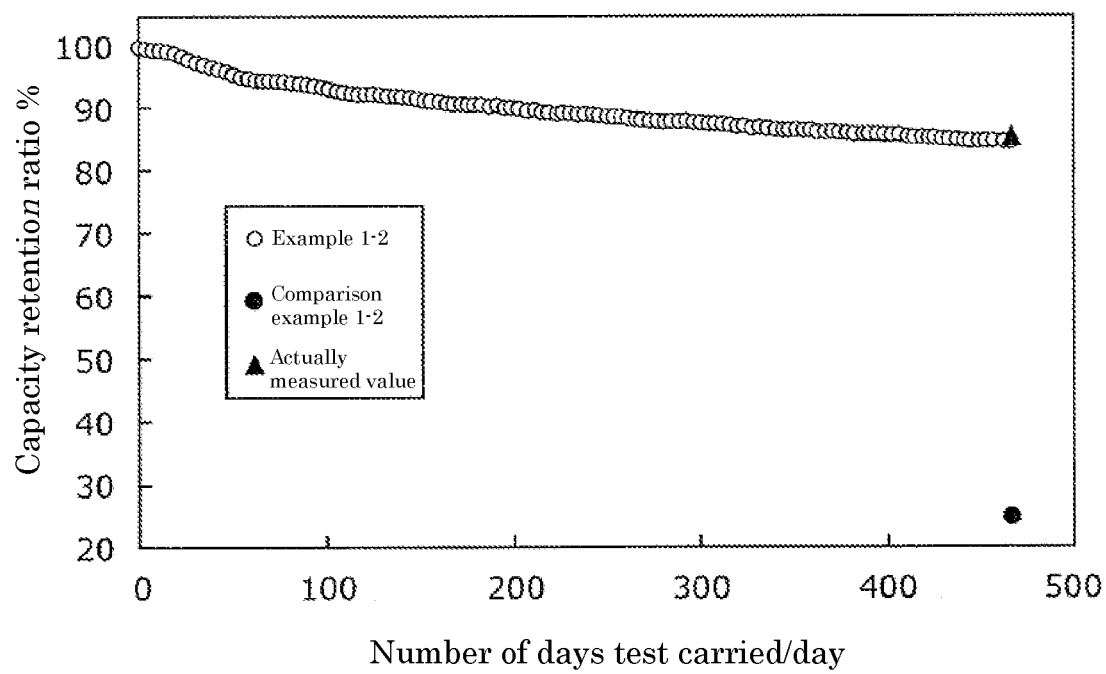
FIG. 12A is a view showing results of estimation of a state of an energy storage device at a predetermined point of time after a lapse of a long period with respect to the energy storage device state estimation device according to the embodiment 1 of the present invention and a comparison example 1.
FIG. 12B is a view showing results of estimation of a state of the energy storage device at a predetermined point of time after a lapse of the long period with respect to the energy storage device state estimation device according to the embodiment 1 of the present invention and the comparison example 1.

FIG. 12A and FIG. 12B are views showing results of estimation of a state of the energy storage device 200 at a predetermined point of time after a lapse of a long period with respect to the energy storage device state estimation device 100 according to the embodiment 1 of the present invention and the comparison example 1. To be more specific, these drawings are views showing results of estimation on the 466th day with respect to the energy storage device state estimation device 100 which forms the example 1 (example 1-2) and the device described in the above-mentioned patent document 1 which forms a comparison example 1 (comparison example 1-2).

Batteries which are subjected to such state estimation have the common specification and test conditions with respect to all examples and comparison examples.

That is, the batteries have the following specification. In a positive composite (positive active material layer), spinel-type lithium manganese oxide is used as a positive active material, acetylene black is used as a conduction supporting agent, and polyvinylidene fluoride is used as a binder. In a negative composite (negative active material layer), hardly graphitizable carbon is used as a negative active material, and polyvinylidene fluoride is used as a binder. An electrolyte solution is prepared by mixing EC (ethylene carbonate), EMC (ethyl methyl carbonate) and DMC (dimethyl carbonate) at a ratio of 25:55:20 and by adding 1 mol/L of $LiPF_6$ to a mixed solution.

In the battery test, a capacity confirmation test is performed for grasping basic performances of a battery and, thereafter, a charge-discharge cycle test is performed. In the capacity confirmation test, charging is performed as a constant current constant voltage charging where a charge current is set to 1 CA, a charge upper limit voltage is set to 4.15 V, and a charge finish condition is set to 0.02 CA, and discharging is performed as a constant current discharging where a discharge current is set to 1 CA and a lower limit voltage is set to 2.75 V. A temperature is set to 25° C. In the discharge cycle test, charging is performed as a constant current constant voltage charging where a charge current is set to 1 CA, a charge upper limit voltage is set to 4.15 V, and a charge finish condition is set to 0.02 CA, and discharging is performed as a constant current discharging where a discharge current is set to 1 CA and a discharge lower limit voltage is set to 2.75 V. During a period of the charge-discharge cycle test, a temperature cycle where a temperature is changed for every 6 hours in order of 40° C., 45° ° C., 40° C., 35° C. is repeated.

In the comparison example 1, the configuration described in patent document 1 (JP-A-2013-89424) is simulated. That is, with respect to time dependent deterioration, as shown in FIG. 5 of patent document 1, a use condition classification table where an SOC is changed in increments of 10% and a temperature is changed in increments of 5° C. is prepared, and use histories (periods) are classified to corresponding batteries in the table and are integrated. With respect to the working electricity dependent deterioration, a table substantially equal to the above-mentioned table is prepared where a plurality of working electricity rates are provided and a temperature is changed in increments of 5° C., and use histories (periods) are classified to corresponding batteries in the table and are integrated. Further, with respect to the above-mentioned time dependent deterioration and working electricity dependent deterioration, a deterioration coefficient is calculated for respective batteries, and a deterioration amount (deterioration ratio) is calculated by multiplying the deterioration coefficient of each battery by a root of an integrated period. Next, all deterioration amounts (deterioration ratios) of the batteries are added to each other, and a deterioration amount after the test is estimated.

That is, in the comparison example 1, unlike the energy storage device state estimation device 100, continuity of a deterioration state is not ensured by dividing the deterioration of the inside of the energy storage device 200 into time dependent deterioration and working electricity dependent deterioration.

As shown in FIG. 11A to FIG. 12B, after a lapse of a short period as well as after a lapse of a long period, an error in an actually measured value of a capacity retention ratio in the energy storage device state estimation device 100 which forms the examples 1 (examples 1-1 and 1-2) is small compared to the comparison examples 1 (comparison examples 1-1 and 1-2). Accordingly, it is understood that estimation accuracy in the present invention is high.

FIG. 13A to FIG. 13C are views showing test conditions for performing estimation of a state of the energy storage device 200 at a predetermined point of time with respect to the energy storage device state estimation device 100 according to the embodiment 1 of the present invention and a comparison example 2. To be more specific, these drawings are views showing test conditions in an estimation test with respect to the energy storage device state estimation device 100 which forms the example 2 and the device described in the above-mentioned patent document 2 (JP-A-2014-81238) which forms the comparison example 2.

That is, in the comparison example 2, unlike the energy storage device state estimation device 100, a deterioration state is calculated based on a predetermined formula without ensuring continuity of the deterioration state by dividing the deterioration of the inside of the energy storage device 200 into time dependent deterioration and working electricity dependent deterioration.

Assume the test conditions shown in FIG. 13A as a use condition P, test conditions shown in FIG. 13B as a use condition Q, and test conditions shown in FIG. 13C as a use condition R. For example, with respect to the use condition P, under an environment with a use temperature of 30° C., the energy storage device 200 is left with an SOC of 100% for 16.4 hours and, thereafter, the energy storage device 200 is discharged to an SOC of 20% in 0.8 hours and, thereafter, the energy storage device 200 is left for 6 hours and, thereafter, the energy storage device 200 is charged to an SOC of 100% in 0.8 hours. The use conditions Q, R are set in the same manner as the use condition P.

In both the example 2 and the comparison example 2, a state of the energy storage device 200 is estimated with respect to the case where the use condition is changed from the use condition P to the use condition R and the case where the use condition is changed from the use condition Q to the use condition R. The results of the estimation are described hereinafter.

FIG. 14A is a view showing a result of estimation of a state of an energy storage device 200 at a predetermined point of time by an energy storage device state estimation device 100 according to the embodiment 1 of the present invention. FIG. 14B is a view showing a result of estimation of a state of an energy storage device 200 at a predetermined point of time by a device described in patent document 2 which forms the comparison example 2. FIG. 14C is a view showing results of estimation of a state of an energy storage device 200 at a predetermined point of time by the energy storage device state estimation device 100 according to the embodiment 1 of the present invention and by the device described in patent document 2 which forms the comparison example 2.

First, as shown in FIG. 14A and FIG. 14B, in both the example 2 and the comparison example 2, when the above-mentioned use condition P and the use condition Q are applied, the deterioration occurs substantially in the same manner. Further, as shown in FIG. 14B, in the comparison example 2, even after the use condition is changed to the use condition R, substantially the same change occurs in deterioration between the case where the use condition is changed from the use condition P to the use condition R and the case where the use condition is changed from the use condition Q to the use condition R.

To the contrary, as shown in FIG. 14A, in the example 2, after the use condition is changed to the use condition R, a change in deterioration occurs differently between the case where the use condition is changed from the use condition P to the use condition R and the case where the use condition is changed from the use condition Q to the use condition R, and such a change approximates an actually measured value. As shown in FIG. 14C, an error in an actually measured value of a capacity retention ratio in the example 2 is small compared to the comparison example 2. Accordingly, estimation accuracy in the present invention is high.

In this manner, in the energy storage device state estimation device 100 of the examples 1 and 2, the deterioration in the energy storage device 200 is divided into time dependent deterioration and working electricity dependent deterioration and hence, the continuity of a deterioration state in the energy storage device 200 is ensured whereby a deterioration state of the energy storage device 200 can be estimated with high accuracy.

With such a configuration, the energy storage device state estimation device 100 according to the embodiment 1 of the present invention estimates a state of the energy storage device 200 at the predetermined point of time by estimating a time dependent deterioration value and a working electricity dependent deterioration value of the energy storage device 200 at the predetermined point of time using information about time dependent deterioration and information about working electricity dependent deterioration corresponding to a charge-discharge history. Deterioration of the energy storage device 200 is divided into time dependent deterioration where the energy storage device is deteriorated even in an open-circuit state with a lapse of time and working electricity dependent deterioration where the energy storage device 200 is deteriorated when electricity is supplied even when time dependent deterioration does not occur. That is, when use conditions of the energy storage device 200 such as a period of a closed-circuit state, a period of an open-circuit state, an amount of working electricity, a use temperature or the like differs, a deterioration state of time dependent deterioration and a deterioration state of working electricity dependent deterioration in the energy storage device 200 differ and hence, it is necessary to consider time dependent deterioration and working electricity dependent deterioration separately. According to the energy storage device state estimation device 100, by estimating the deterioration of the inside of the energy storage device 200 in a state where the deterioration state is divided into time dependent deterioration and working electricity dependent deterioration, it is possible to enhance estimation accuracy of the energy storage device 200.

With such a configuration, the energy storage device state estimation device 100 acquires information about time dependent deterioration and information about working electricity dependent deterioration which correspond to at least one of an SOC and a use temperature of the energy storage device 200. That is, a deterioration state of the inside of the energy storage device 200 largely depends on the SOC or the use temperature of the energy storage device 200 and hence, by estimating a deterioration value using information about time dependent deterioration and information about working electricity dependent deterioration which correspond to the SOC or the use temperature, estimation accuracy of a state of the energy storage device 200 can be enhanced.

The energy storage device state estimation device 100 acquires information about time dependent deterioration and information about working electricity dependent deterioration which correspond to the respective histories by predetermined periods. That is, the deterioration state of the inside of the energy storage device 200 changes with a lapse of time and hence, by estimating a deterioration value using information about time dependent deterioration and information about working electricity dependent deterioration which correspond to the respective histories by predetermined periods, estimation accuracy of a state of the energy storage device 200 can be enhanced.

The energy storage device state estimation device 100 calculates a time dependent deterioration value and a working electricity dependent deterioration value for respective histories by predetermined periods using information about time dependent deterioration and information about working electricity dependent deterioration corresponding to respective histories by predetermined periods, and integrates the time dependent deterioration values and the working electricity dependent deterioration values sequentially in the order of histories by predetermined periods thus calculating a time dependent deterioration value and a working electricity dependent deterioration at a predetermined point of time. By integrating the time dependent deterioration values and the working electricity dependent deterioration values sequentially in the order of times, the continuity of a deterioration state of the inside of the energy storage device 200 can be ensured. Accordingly, a time dependent deterioration value and a working electricity dependent deterioration value at a predetermined point of time can be accurately calculated and hence, the estimation accuracy of a state of the energy storage device 200 can be enhanced.

The energy storage device state estimation device 100 calculates a first time dependent deterioration value from the first point of time to the second point of time; calculates a second time dependent deterioration value from the second point of time to the third point of time by setting a state where the deterioration at the first time dependent deterioration value takes place as a start point; and calculates a time dependent deterioration value from the first point of time to the third point of time by adding the first time dependent deterioration value and the second time dependent deterioration value to each other. By integrating the time dependent deterioration values sequentially in the order of time in this manner, the continuity of time dependent deterioration can be ensured. Accordingly, a time dependent deterioration value at a predetermined point of time can be accurately calculated and hence, the estimation accuracy of a state of the energy storage device 200 can be enhanced.

The energy storage device state estimation device 100 calculates a first working electricity dependent deterioration value from the fourth point of time to the fifth point of time during which electricity is supplied to the energy storage device 200; calculates a second working electricity dependent deterioration value from the sixth point of time to the seventh point of time during which electricity is supplied to the energy storage device 200 after the fifth point of time by setting a state where the deterioration of the first working electricity dependent deterioration value takes place as a start point; and calculates a working electricity dependent deterioration value from the fourth point of time to the seventh point of time by adding the first working electricity dependent deterioration value and the second working electricity dependent deterioration value to each other. By integrating the working electricity dependent deterioration values sequentially in the order of time during a period in which electricity is supplied to the energy storage device 200 in this manner, the continuity of working electricity dependent deterioration can be ensured. Accordingly, a working electricity dependent deterioration value at a predetermined point of time can be accurately calculated and hence, the estimation accuracy of a state of the energy storage device 200 can be enhanced.

The energy storage device state estimation device 100 estimates a state of the energy storage device 200 at a future point of time by setting the future point of time as a predetermined point of time. Accordingly, estimation accuracy of the state of the energy storage device 200 at the future point of time can be enhanced.

The energy storage device state estimation device 100 acquires pattern data where a change in state quantity of the energy storage device 200 is patterned as a charge-discharge history. Accordingly, the energy storage device state estimation device 100 can reduce an information amount of a charge-discharge history and hence, processing for estimating a state of the energy storage device 200 can be simplified.

The energy storage device state estimation device 100 can enhance estimation accuracy of the deterioration state of the energy storage device 200 at a predetermined point of time.

(Modification 1 of Embodiment 1)

Next, a modification 1 of the embodiment 1 is described. In the embodiment 1, the history acquisition part 110 acquires a charge-discharge history of the energy storage device 200 at a sampling cycle of 1 second, for example, and writes the acquired charge-discharge history into charge-discharge history data 151. In this case, when the history acquisition part 110 continuously acquires the charge-discharge history of the energy storage device 200 for a long period, an enormous amount of charge-discharge history is written in the charge-discharge history data 151.

On the other hand, according to this modification, the history acquisition part 110 updates the acquired charge-discharge history every predetermined period (10 minutes, for example), and acquires the updated charge-discharge history. Then, the history acquisition part 110 writes the acquired updated charge-discharge history in the charge-discharge history data 151 stored in the memory part 150. This modification is described in detail hereinafter.

FIG. 15A to FIG. 15C and FIG. 16 are views for describing a charge-discharge history acquired by the history acquisition part 110 according to the modification 1 of the embodiment 1 of the present invention. This modification has substantially the same functions as the embodiment 1 except for parts described hereinafter, and the overall configuration of this modification is substantially equal to the overall configuration of the embodiment 1 shown in FIG. 2 and hence, the detailed description of a block diagram and respective parts which correspond to the block diagram and the respective parts shown in FIG. 2 is omitted.

Figure 15A:
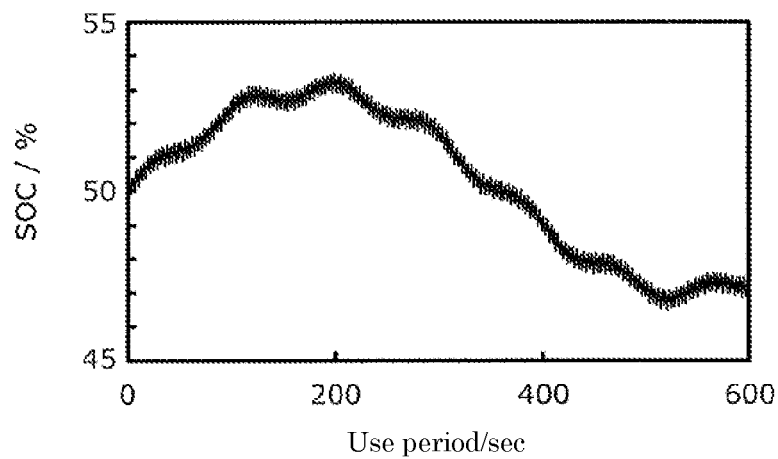
FIG. 15A is a view for describing a charge-discharge history acquired by a history acquisition part according to a modification 1 of the embodiment 1 of the present invention.

First, as shown in FIG. 15A, the history acquisition part 110 acquires a charge-discharge history such as an electric current or a voltage of the energy storage device 200 for a predetermined period (10 minutes, for example) at a sampling cycle of 1 second, for example, and calculates an SOC of the energy storage device 200 of every one second based on the acquired charge-discharge history. Then, the history acquisition part 110 writes the calculated SOC of the energy storage device 200 in the predetermined period in charge-discharge history data 151.

Figure 15B:
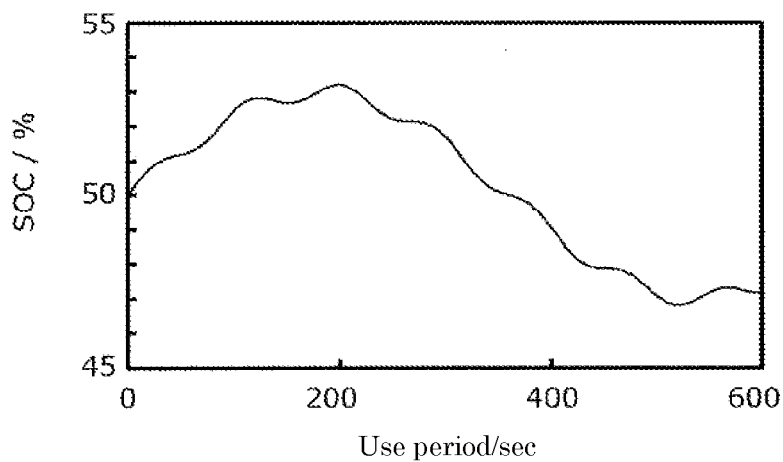
FIG. 15B is a view for describing a charge-discharge history acquired by the history acquisition part according to the modification 1 of the embodiment 1 of the present invention.

Then, as shown in FIG. 15B, the history acquisition part 110 removes noises having high frequency components from a history (time-sequential data) of the SOC. That is, the history acquisition part 110 reads the SOC of the energy storage device 200 from the charge-discharge history data 151 and removes noises having high frequency components.

Figure 15C:
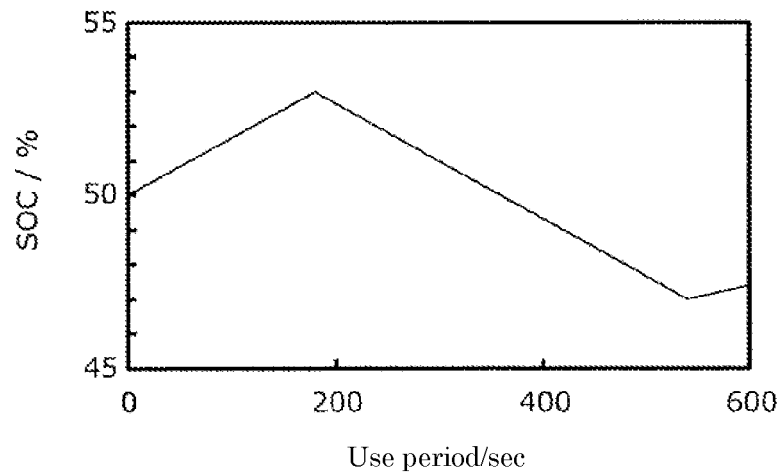
FIG. 15C is a view for describing a charge-discharge history acquired by the history acquisition part according to the modification 1 of the embodiment 1 of the present invention.

Then, as shown in FIG. 15C, the history acquisition part 110 forms a simple waveform based on a maximum value and a minimum value in the history of the SOC from which noises having high frequency components are removed, the SOC at a point of time that the predetermined period is started, and a value of the SOC at a point of time that the predetermined period is finished. In the drawing, the simple waveform is formed by sequentially connecting, in the history (time sequential data) of the SOC during a predetermined period (10 minutes), a value of the SOC at the point of time that the predetermined period is started, the maximum value of the SOC, the minimum value of the SOC, and a value of the SOC at the point of time that the predetermined period is finished.

The history acquisition part 110 calculates an average SOC and an SOC change amount based on the simple waveform. In this modification 1, an "average SOC" is an average value of SOCs of the energy storage device 200 at a plurality of points of times during a predetermined period, and an "SOC change amount" is a change amount of the SOC at the plurality of point of times. For example, the history acquisition part 110 calculates an average value of 50% between a maximum value of 53% and a minimum value of 47% of the SOC shown in the drawing as an average value SOC. Alternatively, the history acquisition part 110 calculates an average value obtained by integrating the graph in the drawing as an average SOC. Further, the history acquisition part 110 calculates 10% which is a sum of a change amount of 3% from a value of 50% at a start point of time to a maximum value of 53%, a change amount of 6% from the maximum value of 53% to a minimum value of 47%, and a change amount of 1% from the minimum value of 47% to a value of 48% at a finish point of time as an SOC change amount.

The history acquisition part 110 calculates an average temperature which is an average value at a plurality of points of time during a predetermined period in the same manner also with respect to a use temperature of the energy storage device 200. That is, the history acquisition part 110 reads a use temperature of the energy storage device 200 during a predetermined period from the charge-discharge history data 151, and calculates an average temperature.

Then, the history acquisition part 110 links the calculated average SOC, the calculated SOC change amount and the calculated average temperature with a predetermined numeral. For example, the history acquisition part 110 intends to reduce an amount of data by setting the resolution as follows.

That is, an average SOC is broken down in 26 ways in increments of 4% within a range of from 0 to 100%, and is expressed as data of 5 bits. An SOC change amount is broken down in 106 ways in increments of 0.5% within a range of from 0 to 50% and in increments of 10% within a range of from 50 to 100% and is expressed as data of 7 bits. An average temperature is broken down in 64 ways in increments of 1.25° C. within a range of from −10° C. to 70° C., and is expressed as data of 6 bits. Accordingly, a total amount of data becomes 18 bits.

That is, as shown in FIG. 16, the history acquisition part 110 expressed an average SOC, an SOC change amount and an average temperature by an amount of data of 18 bits in total. Accordingly, the history acquisition part 110 can express data of 10 minutes by an amount of data of 18 bits and hence, data of 10 years can be expressed by an amount of data of approximately 1.2 MB. In a data transfer destination, by ciphering meanings of numerals recorded in memory regions of respective received data, values of an average SOC, an SOC change amount and an average temperature can be restored.

In this manner, the history acquisition part 110 acquires data on an average SOC, an SOC change amount and an average temperature expressed by 18 bits, and write acquired data into the charge-discharge history data 151. On the other hand, the history acquisition part 110 erases a charge-discharge history of the energy storage device 200 acquired at a sampling cycle of 1 second, for example.

In accordance with such steps, the history acquisition part 110 can update the data of every 1 second to data of every 600 seconds and hence, an amount of data is reduced to 1/600. Further, the history acquisition part 110 converts information on an electric current, a voltage or the like to information on an average SOC, an SOC change amount or the like and hence, it is considered that accuracy can be maintained even with coarse resolution compared to the case where data is stored in the form of a voltage, an electric current or the like as it is. This is because it is considered that an SOC takes a value in a narrow range from 0 to 100% and hence, the SOC can be converted with accuracy compared to a voltage, an electric current or the like which takes a value in an extremely wide range. Accordingly, it is considered that an amount of data can be largely compressed exceeding 1/600.

As described above, the history acquisition part 110 acquires a charge-discharge history which contains: an average SOC which is an average value of SOCs of the energy storage device 200 at a plurality of points of time; SOC change amounts which are change amounts at the plurality of points of time; and an average temperature which is an average value of temperatures of the energy storage device 200 at the plurality of points of time. Then, the deterioration information acquisition part 120 acquires information about time dependent deterioration and information about working electricity dependent deterioration corresponding to the average SOC, the SOC change amount and the average temperature contained in the charge-discharge history which the history acquisition part 110 acquires.

That is, as described in the embodiment 1, a time dependent deterioration coefficient $a_{sto}$ which forms information about time dependent deterioration is a coefficient which depends on an SOC and a use temperature of the energy storage device 200. Accordingly, the time dependent deterioration coefficient $a_{sto}$ can be determined based on the average SOC and the average temperature of the energy storage device 200. A working electricity dependent deterioration coefficient $a_{cyc}$ which forms information about working electricity dependent deterioration is a coefficient which depends on a working electricity rate and a use temperature of the energy storage device 200. Accordingly, by converting an SOC change amount into a working electricity rate, the working electricity dependent deterioration coefficient $a_{cyc}$ can be determined based on the SOC change amount and the average temperature of the energy storage device 200. For example, with respect to an SOC change amount, when an amount of the SOC changes by 10% within a predetermined period of 10 minutes, the amount of the SOC changes by 60% within 1 hour and hence, a working electricity rate becomes 0.6.

The deterioration value estimation part 130 estimates a time dependent deterioration value and a working electricity dependent deterioration value using information about time dependent deterioration and information about working electricity dependent deterioration which the deterioration information acquisition part 120 acquires. That is, the deterioration value estimation part 130 estimates a time dependent deterioration value and a working electricity dependent deterioration value using an average SOC, an SOC change amount and an average temperature contained in the charge-discharge history.

Next, the reason that the energy storage device state estimation device 100 can maintain high estimation accuracy even when the history acquisition part 110 compresses a charge-discharge history for every predetermined period is described.

FIG. 17A and FIG. 17B are views showing a change in capacity retention ratio when the history acquisition part 110 according to the modification 1 of the embodiment 1 of the present invention updates a charge-discharge history during a plurality of predetermined periods. To be more specific, FIG. 17A is a graph showing a change in capacity retention ratio when the history acquisition part 110 updates the charge-discharge history while setting the predetermined period to 10 minutes, 1 hour, 1 day and 1 month. FIG. 17B is a table describing values which are plotted in the graph shown in FIG. 17A. In the table, a numerical value in parentheses indicates a difference between a result of estimation and an actually measured value in each predetermined period.

In this modification 1, test conditions in these drawings are set as follows. That is, as a charge-discharge pattern, a pattern which is formed by converting a relationship between a vehicle speed and a time pattern for measurement of fuel consumption of a vehicle into an input/output pattern of a battery and by simplifying the input/output pattern is used. As a temperature pattern, a temperature pattern which is prepared based on an average atmospheric temperature, an average maximum atmospheric temperature and an average minimum atmospheric temperature of each month in a region where the vehicle is arranged is applied for every month.

As shown in these drawings, when a charge-discharge history is updated by compression every day, estimation accuracy turns out to be low. On the other hand, when the charge-discharge history is updated while compressing the charge-discharge history every 10 minutes or every 1 hour, estimation accuracy turns out to be high. Accordingly, in this test, it is understood that a predetermined period for compressing a charge-discharge history is preferably set within 1 day, and is more preferably set within 1 hour. It is considered that a preferable predetermined period also changes when the test condition differs and hence, it is sufficient that the predetermined period is suitably determined based on the energy storage device 200 which is an object to be estimated.

As described above, according to the energy storage device state estimation device 100 according to the modification 1 of the embodiment 1 of the present invention, the energy storage device state estimation device 100 acquires an average SOC, an SOC change amount and an average temperature of the energy storage device 200, and estimates a time dependent deterioration value and a working electricity dependent deterioration value using the average SOC, the SOC change amount and the average temperature of the energy storage device 200. To consider the case where data on the energy storage device 200 is continuously measured for a long period for estimating a time dependent deterioration value and a working electricity dependent deterioration value, it is necessary to store enormous data in a memory except for the case where the configuration is adopted where the data can be constantly transferred by on line. To cope with such a task, the inventors of the present invention have found that the estimation accuracy of a time dependent deterioration value and the estimation accuracy of a working electricity dependent deterioration value can be maintained at substantially the same level while compressing an amount of data with the use of an average SOC, an SOC change amount and an average temperature of the energy storage device 200. Accordingly, the energy storage device state estimation device 100 can compress (reduce) an amount of data and, at the same time, can estimate a time dependent deterioration value and a working electricity dependent deterioration value with high accuracy with the use of the average value of an SOC, the average value of temperature and the like without using an enormous amount of data on the SOC and temperature.

The energy storage device state estimation device 100 updates the acquired charge-discharge history to a charge-discharge history for every predetermined period. The inventors of the present invention have found that even when a charge-discharge history acquired for every 1 second, for example, is updated as a charge-discharge history for every predetermined period such as 10 minutes, estimation accuracy of a time dependent deterioration value and estimation accuracy of a working electricity dependent deterioration value can be maintained at substantially the same level. Accordingly, the energy storage device state estimation device 100 can compress (reduce) an amount of data and, at the same time, can estimate the time dependent deterioration value and the working electricity dependent deterioration value with high accuracy.

In the modification 1, the history acquisition part 110 calculates an average SOC, an SOC change amount and an average temperature for every predetermined period such as 10 minutes, and updates a charge-discharge history. However, a compression period for updating the charge-discharge history may not be a fixed period, and the history acquisition part 110 may update a charge-discharge history by changing the compression period. For example, the history acquisition part 110 may set a short compression period from a start of the use of the energy storage device 200 in an initial stage and, thereafter, may set a long compression period and, thereafter, may again set a short compression period from a timing that deterioration of the energy storage device 200 may occur.

In the modification 1, the history acquisition part 110 calculates an average SOC, an SOC change amount and an average temperature during a predetermined period, and updates a charge-discharge history. However, the history acquisition part 110 may update the charge-discharge history by calculating an average value of an electric current, an average value of a voltage and the like during the predetermined period (for example, 10 minutes or 1 hour). Also such steps, an amount of data can be compressed.

(Modification 2 of Embodiment 1)

Next, a modification 2 of the embodiment 1 is described. In the embodiment 1, information about time dependent deterioration and information about working electricity dependent deterioration are written in deterioration information data 152 in advance, and a state of the energy storage device is estimated using the information about time dependent deterioration and information about working electricity dependent deterioration. On the other hand, in this modification, information about time dependent deterioration and information about working electricity dependent deterioration written in the deterioration information data 152 are corrected, and a state of an energy storage device is estimated using the corrected information about time dependent deterioration and the corrected information about working electricity dependent deterioration. This modification is described in detail hereinafter.

Figure 18A:
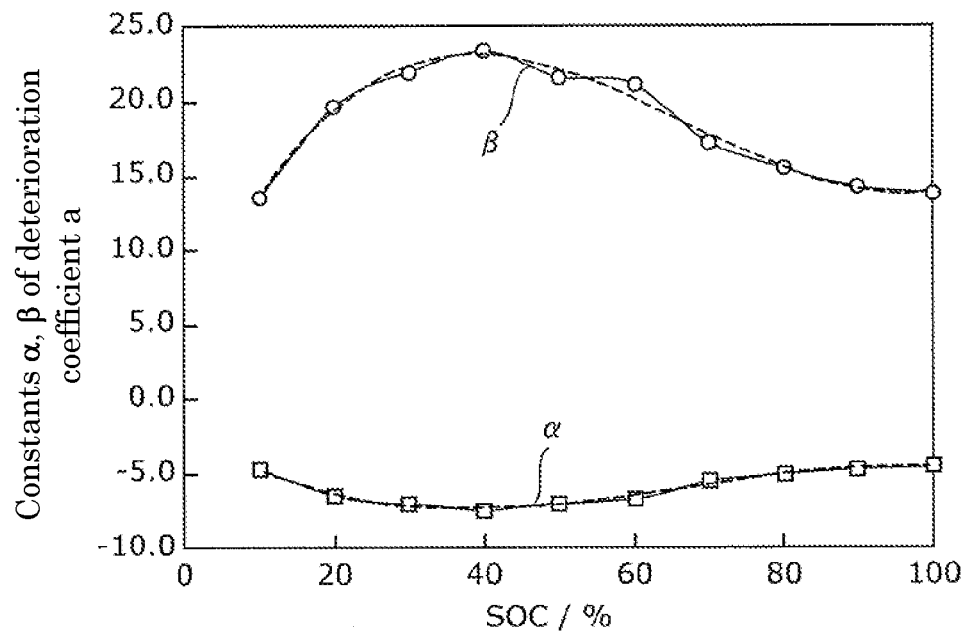
FIG. 18A is a view for describing processing where a deterioration value estimation part according to a modification 2 of the embodiment 1 of the present invention corrects information about time dependent deterioration and information about working electricity dependent deterioration.
Figure 18B:
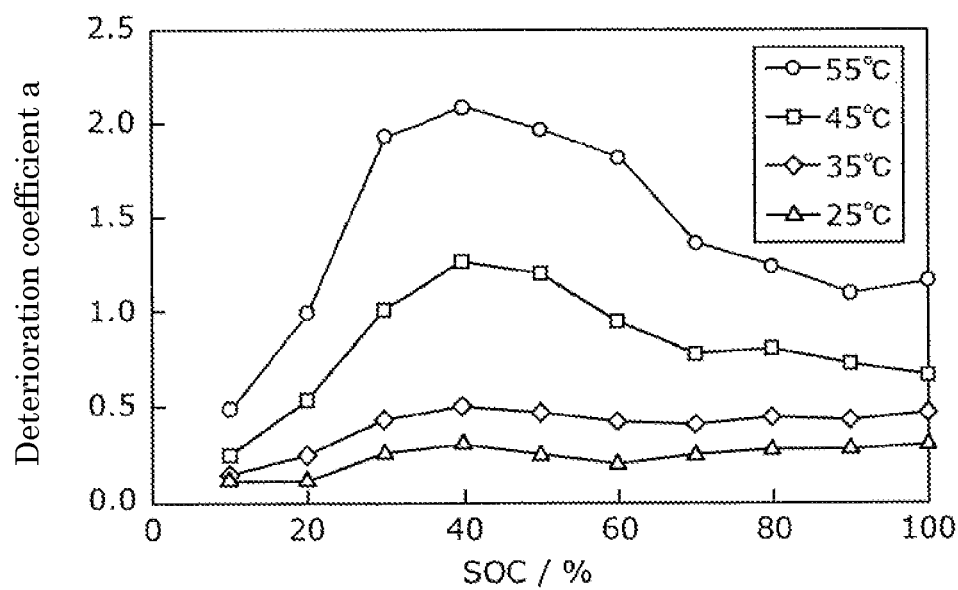
FIG. 18B is a view for describing processing where the deterioration value estimation part according to the modification 2 of the embodiment 1 of the present invention corrects information about time dependent deterioration and information about working electricity dependent deterioration.

FIG. 18A and FIG. 18B are views for describing processing where a deterioration value estimation part 130 according to the modification 2 of the embodiment 1 of the present invention corrects information about time dependent deterioration and information about working electricity dependent deterioration. This modification has substantially the same functions as the embodiment 1 except for parts described hereinafter, and the overall configuration of this modification is substantially equal to the overall configuration of the embodiment 1 shown in FIG. 2 and hence, the detailed description of a block diagram and respective parts which correspond to the block diagram and the respective parts shown in FIG. 2 is omitted.

In the description of the embodiment 1 with reference to FIG. 4A, a deterioration coefficient a at a use temperature T can be expressed by a formula $\ln(a) = -\alpha(10^3/T) + \beta$ using a gradient $\alpha$ and an intercept $\beta$ in an Arrhenius plot. The gradient $\alpha$ and the intercept $\beta$ depend on an SOC of the energy storage device 200 and hence, as shown in FIG. 18A, the SOC dependency of the gradient $\alpha$ and the intercept $\beta$ can be approximated using a tertiary function ($y = px^3 + qx^2 + rx + s$), for example. Four coefficients (p, q, r, and s) in respective terms of the tertiary function are explanatory variables.

That is, the gradient $\alpha$ and the intercept $\beta$ respectively require four explanatory variables and hence, the number of explanatory variables becomes 8 with respect to a time dependent deterioration coefficient which forms information about time dependent deterioration. On the other hand, a working electricity dependent deterioration coefficient which forms information about working electricity dependent deterioration does not depend on an SOC and hence, with respect to the working electricity dependent deterioration coefficient, the gradient and the intercept in an Arrhenius plot can be used as it is as explanatory variables. Accordingly, with respect to the working electricity dependent deterioration coefficient, the number of explanatory variables becomes 2. As a result, the number of explanatory variables necessary for expressing the time dependent deterioration coefficient and the working electricity dependent deterioration coefficient becomes 10. Accordingly, the deterioration value estimation part 130 corrects the time dependent deterioration coefficient and the working electricity dependent deterioration coefficient by optimizing these 10 variables.

For example, the deterioration value estimation part 130 optimizes 10 variables (v[10]) by obtaining 10 variables (v[10]) such that a value calculated by the following formula becomes minimum. In the following formula, $Q_{25°\,C.\_cycle}$ and $Q_{45°\,C.\_cycle}$ are estimated values (calculated values) of capacities at 25° C. and 45° C., and Patterns are actually measured values (charge-discharge histories) of the respective cases. That is, the deterioration value estimation part 130 optimizes V[10] such that the difference between an estimated value and an actually measured value of a capacity of the energy storage device 200 where the calculation of deterioration coefficients (a time dependent deterioration coefficient and a working electricity dependent deterioration coefficient) is required at 25° C. and 45° C. becomes minimum. The use temperature is not limited to 25° C. and 45° C.

$$\sum_{\substack{Number\,of\\measurement}} \{Q_{25°C\_cycle} - Q(\text{Pattern}, v[10])\}^2 + \qquad [\text{Formula 2}]$$

$$\sum_{\substack{Number\,of\\measurement}} \{Q_{45°C\_cycle} - Q(\text{Pattern}, v[10])\}^2$$

The above-mentioned formula may be strictly defined as the following formula, for example. In the following formula, Q indicates an actually measured value of a remaining capacity, an f function is a function for calculating time dependent deterioration, and a g function is a function for calculating working electricity dependent deterioration. N indicates the number of measurement of a remaining capacity, and $M_i$ is the number of information about use history for an i-th measured value. $S_j$ is j-th information about use history (SOC), $T_j$ is j-th information about use history (temperature), and $t_j$ is j-th information about use history (time). $D_j$ is j-th information about use history (DOD), and $C_j$ is j-th information about use history (working electricity rate). v is a value formed into a parameter by approximating a deterioration coefficient. That is, the deterioration value estimation part 130 obtains 10 valuables $v_1$ to $v_{10}$ (the above-mentioned v[10]) such that a value calculated by the following formula becomes minimum thus optimizing such 10 valuables $v_1$ to $v_{10}$. The formula for which the deterioration value estimation part 130 uses is not limited to the following formula, and various formulae can be used.

$$\sum_{i=1}^{N} [Q_i - \sum_{j=1}^{M_i} \{f(S_j, T_j, t_j, v_1, v_2, v_3, v_4, v_5, v_6, v_7, v_8, v_9, v_{10}) + g(D_j, C_j, T_j, t_j, v_1, v_2, v_3, v_4, v_5, v_6, v_7, v_8, v_9, v_{10})\}]^2 \quad \text{[Formula 3]}$$

When the deterioration coefficients before and after correction have correlation, the deterioration value estimation part 130 can optimize 10 variables by also taking into account data before correction. The case where the deterioration coefficients before and after correction have correlation means the case where the energy storage device is estimated to have the similar deterioration characteristic before and after correction in view of materials of positive and negative electrodes, battery designs and the like of a battery to be used. For example, the deterioration value estimation part 130 optimizes 10 variables by setting restriction conditions such that a result of calculation takes a shape substantially equal to a profile of an SOC dependency of the deterioration coefficient before correction shown in FIG. 18B. Further, when the battery before and after correction has substantially the same charge-discharge history at an initial stage of charging and discharging, the deterioration value estimation part 130 may also take into account the charge-discharge history at the initial stage.

In this manner, the deterioration value estimation part 130 calculates optimum explanatory variables based on a charge-discharge history, a deterioration characteristic of the energy storage device 200 and the like, and corrects a deterioration coefficient using the optimum explanatory variables. That is, the deterioration value estimation part 130 corrects information about time dependent deterioration and information about working electricity dependent deterioration using a charge-discharge history. Then, the deterioration value estimation part 130 estimates a time dependent deterioration value and a working electricity dependent deterioration value using the corrected information about time dependent deterioration and the corrected information about working electricity dependent deterioration. Processing where the deterioration value estimation part 130 estimates a time dependent deterioration value and a working electricity dependent deterioration value by correcting information about time dependent deterioration and information about working electricity dependent deterioration is described more specifically.

Figure 19A:
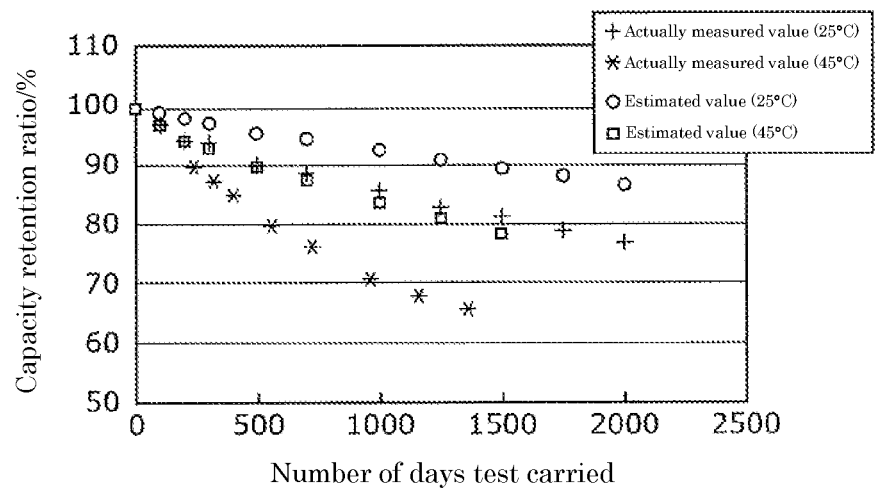
FIG. 19A is a view showing a state before the deterioration value estimation part according to the modification 2 of the embodiment 1 of the present invention corrects information about time dependent deterioration and information about working electricity dependent deterioration.
Figure 19B:
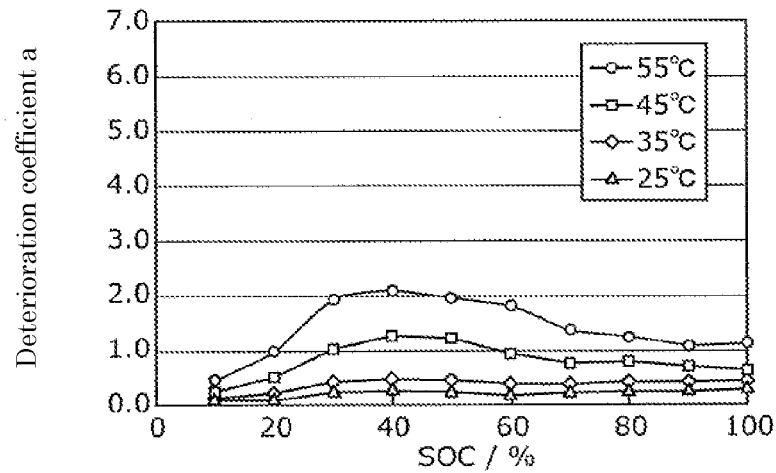
FIG. 19B is a view showing a state before the deterioration value estimation part according to the modification 2 of the embodiment 1 of the present invention corrects information about time dependent deterioration and information about working electricity dependent deterioration.
Figure 19C:
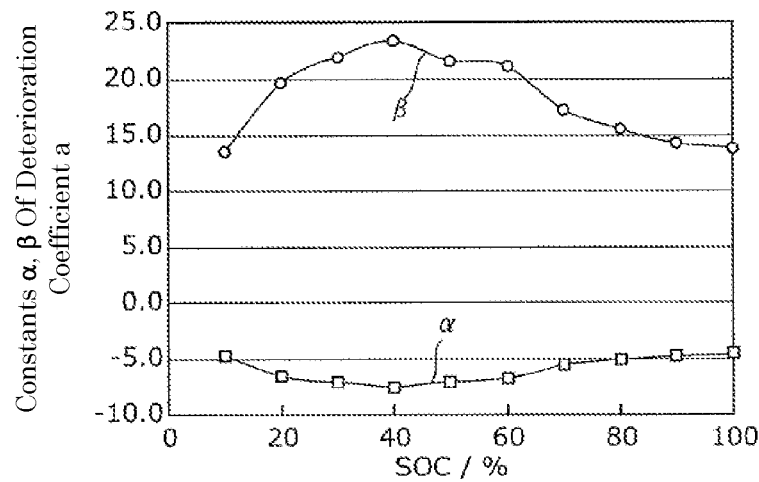
FIG. 19C is a view showing a state before the deterioration value estimation part according to the modification 2 of the embodiment 1 of the present invention corrects information about time dependent deterioration and information about working electricity dependent deterioration.
Figure 20A:
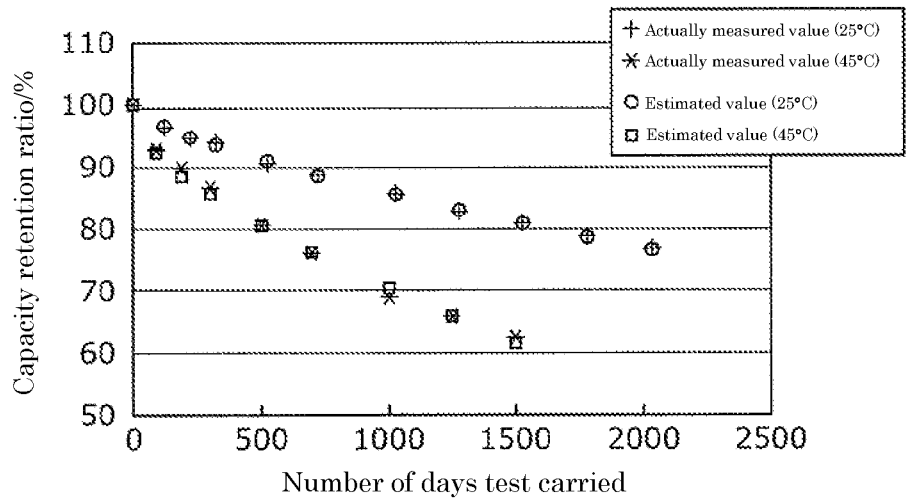
FIG. 20A is a view showing a state after the deterioration value estimation part according to the modification 2 of the embodiment 1 of the present invention corrects information about time dependent deterioration and information about working electricity dependent deterioration.
Figure 20B:
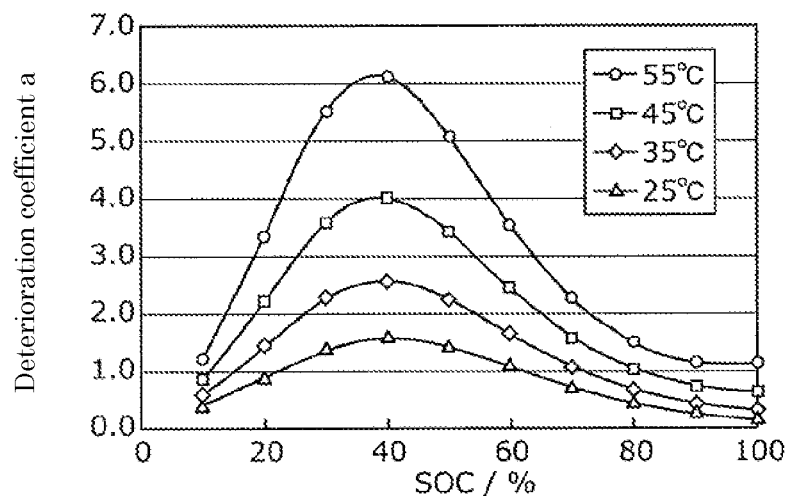
FIG. 20B is a view showing a state after the deterioration value estimation part according to the modification 2 of the embodiment 1 of the present invention corrects information about time dependent deterioration and information about working electricity dependent deterioration.
Figure 20C:
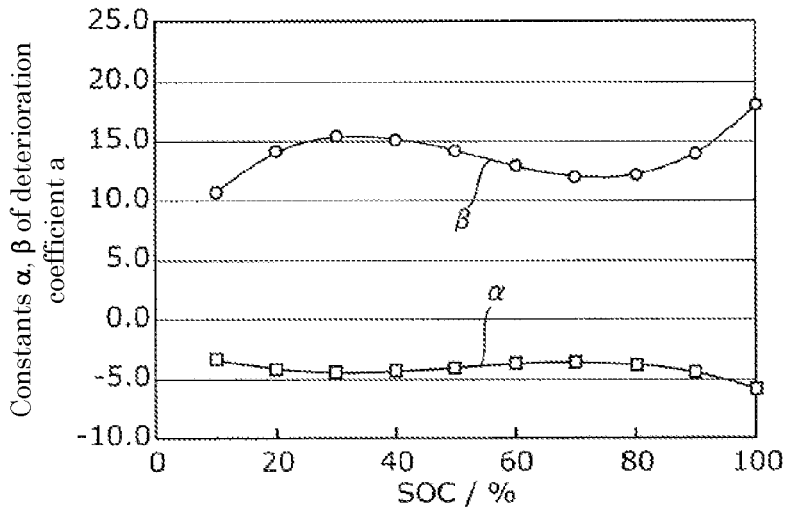
FIG. 20C is a view showing a state after the deterioration value estimation part according to the modification 2 of the embodiment 1 of the present invention corrects information about time dependent deterioration and information about working electricity dependent deterioration.

FIG. 19A to FIG. 19C are views showing a state before the deterioration value estimation part 130 according to the modification 2 of the embodiment 1 of the present invention corrects information about time dependent deterioration and information about working electricity dependent deterioration. FIG. 20A to FIG. 20C are views showing a state after the deterioration value estimation part 130 according to the modification 2 of the embodiment 1 of the present invention corrects information about time dependent deterioration and information about working electricity dependent deterioration.

First, as shown in FIG. 19A, when a difference is generated between an actually measured value and an estimated value (calculated value), it is necessary to perform the correction of deterioration coefficients (information about time dependent deterioration and information about working electricity dependent deterioration). Assume that a deterioration coefficient a takes a value shown in FIG. 19B and a gradient α and an intercept β in an Arrhenius plot at the deterioration coefficient a take values shown in FIG. 19C in a state before the correction of the deterioration coefficients.

To cope with such a case, the deterioration value estimation part 130 performs optimization of explanatory variables by approximating the gradient α and the intercept β by a tertiary function such that the deterioration coefficients take the forms substantially equal to graphs shown in FIG. 19B. In such optimization, the deterioration value estimation part 130 calculates the gradient α and the intercept β after correction as shown in FIG. 20C, and calculates the deterioration coefficients a after correction as shown in FIG. 20B. As a result, as shown in FIG. 20A, the estimated value (calculated value) using the corrected deterioration coefficient a and the actually measured value extremely accurately agree with each other and hence, it is understood that estimation is performed with high accuracy. In this manner, the deterioration value estimation part 130 corrects the deterioration coefficients (information about time dependent deterioration and information about working electricity dependent deterioration) and hence, the deterioration value estimation part 130 can identify the deterioration characteristic of the energy storage device 200 without using any open-circuit standing test data.

Frequency that the deterioration value estimation part 130 corrects the deterioration coefficients is not particularly limited. It is considered that the correction may be performed in conformity with an inspection cycle of the energy storage device 200 such as once in three years, for example.

As has been described heretofore, the energy storage device state estimation device 100 according to the modification 2 of the embodiment 1 of the present invention estimates a time dependent deterioration value and a working electricity dependent deterioration value by correcting information about time dependent deterioration and information about working electricity dependent deterioration using a charge-discharge history. For example, in the case where deterioration tendency is changed during the use of the energy storage device, the case where the energy storage device which is an object to be estimated is changed and the case where estimation is performed by setting an assembled battery formed of a plurality of energy storage devices as one energy storage device, it is necessary to newly acquire information about time dependent deterioration and information about working electricity dependent deterioration. In this modification, the energy storage device state estimation device 100 can estimate a time dependent deterioration value and a working electricity dependent deterioration value with high accuracy without newly acquiring information about time dependent deterioration and information about working electricity dependent deterioration by correcting information about time dependent deterioration and information about working electricity dependent deterioration corresponding to a past charge-discharge history.

(Embodiment 2)

Next, an embodiment 2 is described. In the embodiment 1, one energy storage device state estimation device 100 is disposed for one energy storage device 200 (or the plurality of energy storage devices 200 included in the assembled battery). On the other hand, in this embodiment, one energy storage device state estimation device 100 is disposed for a plurality of assembled batteries. Hereinafter, this embodiment is described in detail.

Figure 21:
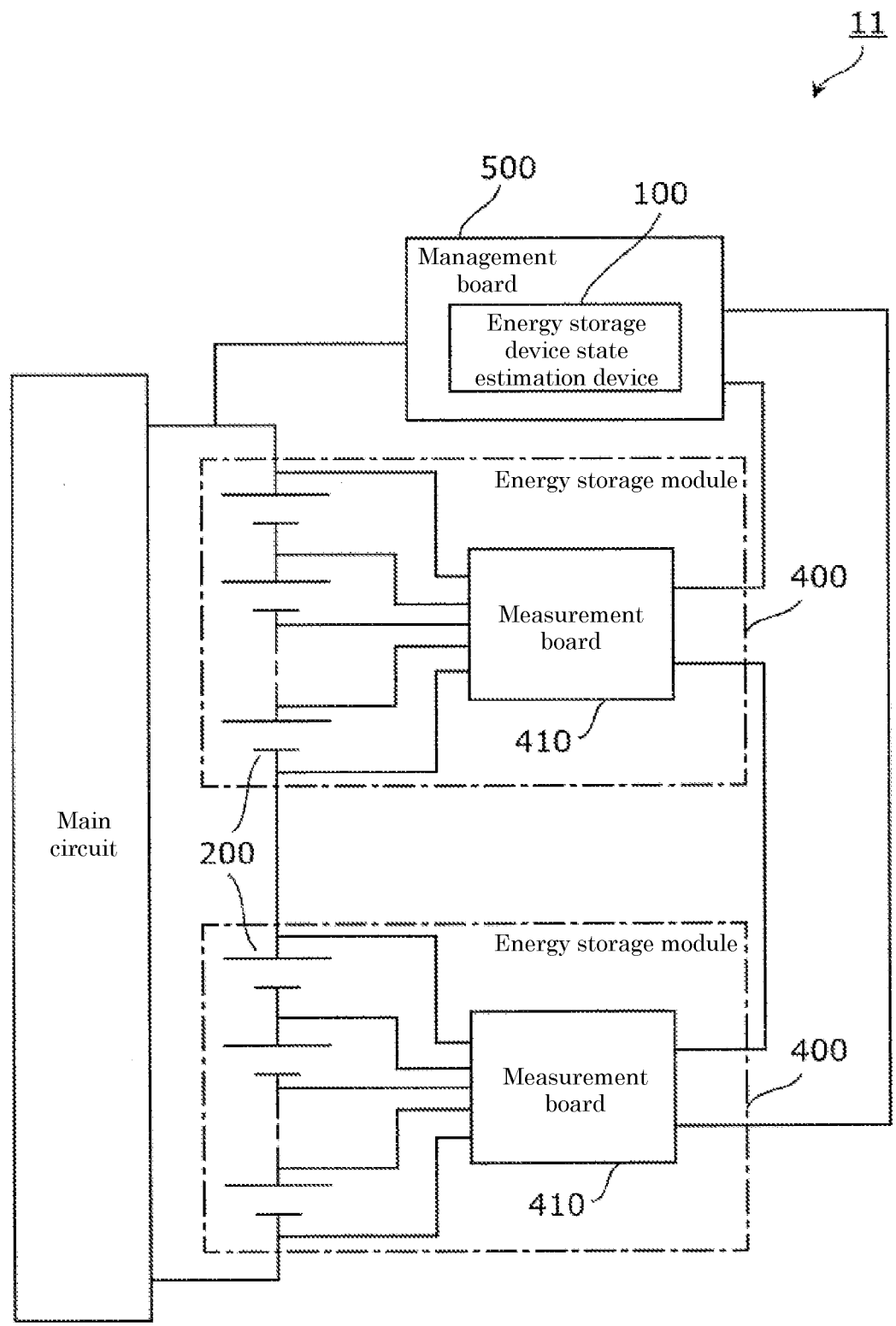
FIG. 21 is a block diagram showing the functional configuration of an energy storage system which includes an energy storage device state estimation device according to an embodiment 2 of the present invention.

FIG. 21 is a block diagram showing a functional configuration of an energy storage system 11 which includes the energy storage device state estimation device 100 according to the embodiment 2 of the present invention. The energy storage device state estimation device 100 in this embodiment has substantially the same function as the energy storage device state estimation device 100 in the embodiment 1 and hence, the detailed description is omitted.

As shown in the drawing, the energy storage system 11 includes a plurality of energy storage modules 400 and a management board 500 which manages the plurality of energy storage modules 400.

The energy storage module 400 is a so-called assembled battery which includes a plurality of energy storage devices 200 and a measurement board 410. The energy storage device 200 in this embodiment has substantially the same function as the energy storage device 200 in the embodiment 1 and hence, the detailed description is omitted.

The measurement board 410 measures a voltage of the plurality of respective energy storage devices 200 in the energy storage module 400, and measures a temperature of at least one of the plurality of energy storage devices 200. The measurement board 410 also performs communication with another measurement board 410 and the management board 500 so as to exchange information.

The management board 500 measures an electric current of a main circuit, stores data in a memory and reads out data from the memory, and performs communication with the measurement board 410 and an external equipment (not shown in the drawing) so as to exchange information. In this embodiment, the management board 500 includes the energy storage device state estimation device 100. That is, the management board 500 can estimate an SOH (State Of Health, a capacity of the energy storage device 200 in the embodiment 1) of the energy storage device 200 by the energy storage device state estimation device 100, and stores the transition of the estimated capacity in the memory. The management board 500 also has a function of performing an arithmetic calculation (switching between a current integration method and an SOC-OCV conversion method) of an SOC of the energy storage device 200 using the capacity or the like.

The energy storage device state estimation device 100 may estimate an SOH of all energy storage devices 200 in the energy storage system 11, may estimate an SOH of a representative energy storage device 200, or may estimate an average SOH of the plurality of energy storage devices 200. The energy storage device state estimation device 100 may estimate an SOH in real time or may estimate an SOH at a predetermined timing.

As described above, according to the energy storage system 11 of the embodiment 2 of the present invention, one energy storage device state estimation device 100 is disposed corresponding to the plurality of energy storage devices 200 and hence, the energy storage system 11 can be simplified and a cost can be reduced.

(Modification 1 of Embodiment 2)

Next, a modification 1 of the embodiment 2 is described. In the embodiment 2, the management board 500 includes the energy storage device state estimation device 100. On the other hand, in this modification, an energy storage device state estimation device 100 is disposed separately from a management board. Hereinafter, this modification is described in detail.

Figure 22:
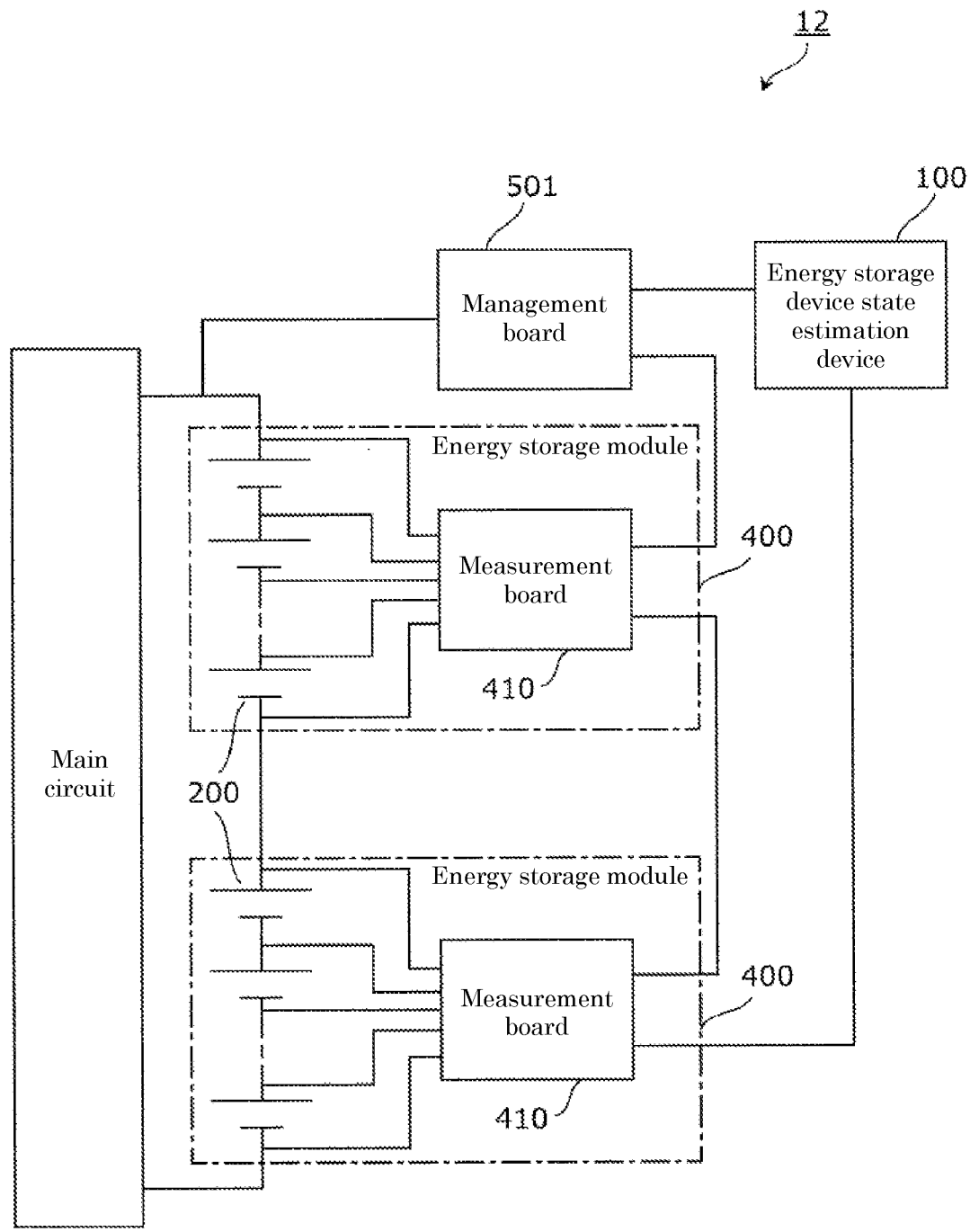
FIG. 22 is a block diagram showing the functional configuration of an energy storage system which includes an energy storage device state estimation device according to a modification 1 of the embodiment 2 of the present invention.

FIG. 22 is a block diagram showing a functional configuration of an energy storage system 12 which includes the energy storage device state estimation device 100 according to the modification 1 of the embodiment 2 of the present invention. The energy storage device state estimation device 100 in this modification has substantially the same function as the energy storage device state estimation device 100 in the embodiment 1 and hence, the detailed description is omitted.

As shown in the drawing, the energy storage system 12 includes: a plurality of energy storage modules 400; a management board 501; and the energy storage device state estimation device 100. In other words, in this modification, the energy storage system 12 includes, in place of the management board 500 in the embodiment 2, the management board 501 and the energy storage device state estimation device 100 as separate members. That is, the energy storage device state estimation device 100 is disposed outside an energy storage apparatus formed of the plurality of energy storage modules 400 and the management board 501, and is connected to the energy storage apparatus by a wire.

In such a configuration, the management board 501 measures an electric current of a main circuit, stores data in a memory, and performs communication with the measurement boards 410 and an external equipment (not shown in the drawing) so as to exchange information. The energy storage device state estimation device 100 estimates SOHs (capacities) of the energy storage devices 200, and stores the transition of the estimated capacities in the memory. The management board 501 also has a function of performing an arithmetic calculation of SOCs of the energy storage devices 200 by acquiring capacities of the energy storage devices 200 estimated by the energy storage device state estimation device 100.

As described above, according to the energy storage system 12 of the modification 1 of the embodiment 2 of the present invention, the energy storage device state estimation device 100 is disposed outside the management board 501 which the energy storage apparatus formed of the plurality of energy storage modules 400 and the management board 501 includes. In this modification, as in the case of the embodiment 2, when the management board 500 estimates states of the energy storage devices 200, it is necessary for the management board 500 to perform an enormous arithmetic calculation. However, in this modification, the energy storage device state estimation device 100 is disposed separately from the management board 501 and hence, it is possible to reduce an amount of arithmetic calculation which the management board 501 performs.

(Modification 2 of Embodiment 2)

Next, a modification 2 of the embodiment 2 is described. In the modification 1 of the embodiment 2, the management board 501 and the energy storage device state estimation device 100 are connected with each other by a wire. On the other hand, in this modification, two-way communication is wirelessly performed between a management board 501 and an energy storage device state estimation device 100. Hereinafter, this modification is described in detail.

Figure 23:
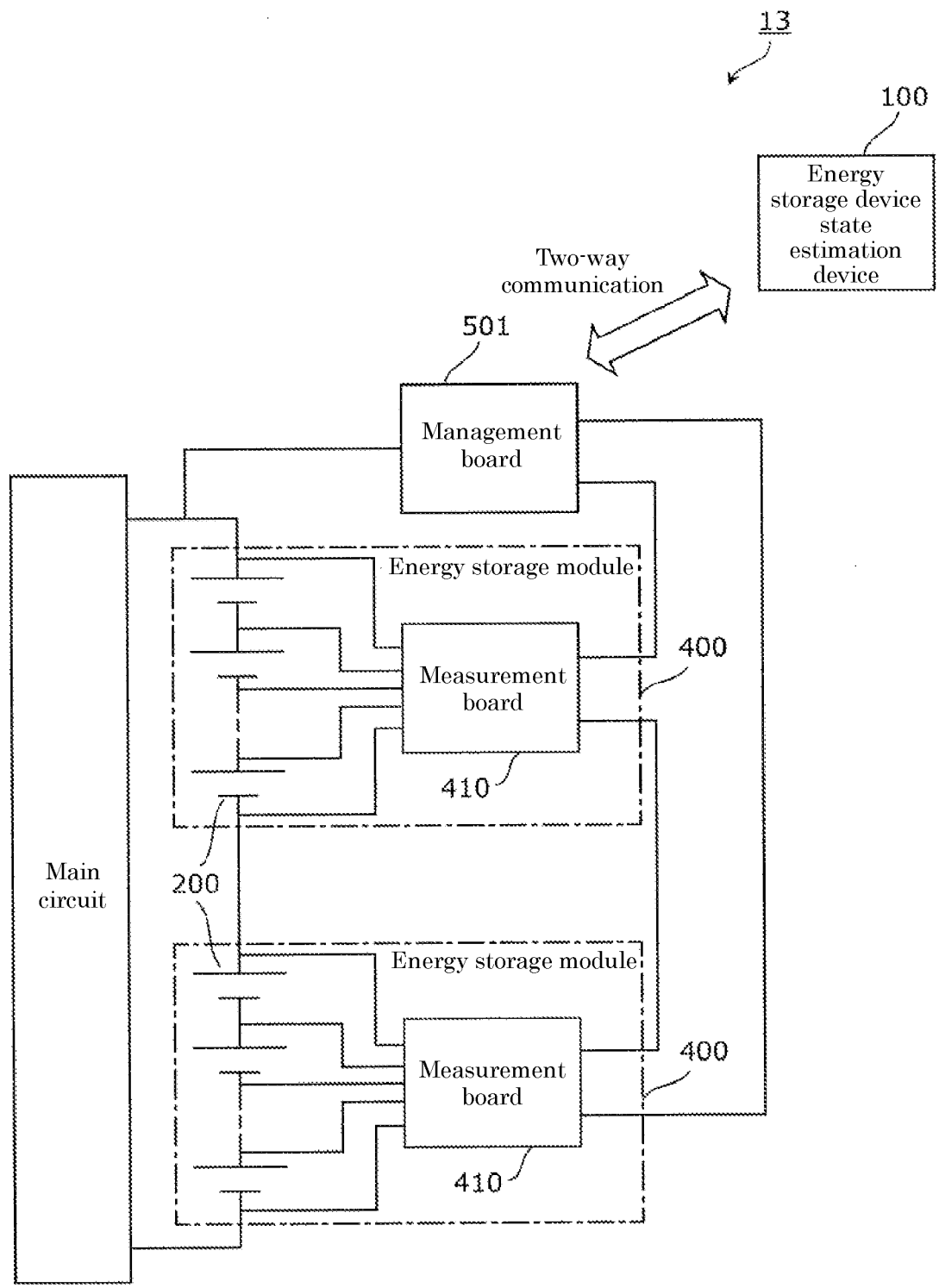
FIG. 23 is a block diagram showing the functional configuration of an energy storage system which includes an energy storage device state estimation device according to a modification 2 of the embodiment 2 of the present invention.

FIG. 23 is a block diagram showing a functional configuration of an energy storage system 13 which includes the energy storage device state estimation device 100 according to the modification 2 of the embodiment 2 of the present invention. The energy storage device state estimation device 100 in this modification has substantially the same function as the energy storage device state estimation device 100 in the embodiment 1 and hence, the detailed description is omitted.

As shown in the drawing, in the same manner as the modification 1 of the embodiment 2, the energy storage system 13 includes an energy storage apparatus formed of a plurality of energy storage modules 400 and a management board 501, and the energy storage device state estimation device 100. However, the energy storage apparatus and the energy storage device state estimation device 100 are not connected with each other by a wire. That is, two-way communication is wirelessly performed between the energy storage apparatus and the energy storage device state estimation device 100 so as to exchange information. Other configurations in this modification are substantially equal to corresponding configurations in the embodiment 2 or the modification 1 of the embodiment 2 and hence, the detailed description is omitted.

To be more specific, a history acquisition part 110 of the energy storage device state estimation device 100 receives charge-discharge histories of energy storage devices 200 from an energy storage apparatus which includes the energy storage devices 200. A state estimation part 140 of the energy storage device state estimation device 100 estimates states of the energy storage devices 200, and transmits the estimated states of the energy storage devices 200 to the energy storage apparatus. That is, the energy storage device state estimation device 100 receives the charge-discharge histories of the energy storage devices 200 from the management board 501, and transmits the estimated capacities of the energy storage devices 200 to the management board 501.

As described above, according to the energy storage system 13 of the modification 2 of the embodiment 2 of the present invention, the energy storage device state estimation device 100 receives charge-discharge histories from an energy storage apparatus which includes the energy storage devices 200, and transmits the estimated states of the energy storage devices 200 to the energy storage apparatus. With such a configuration, in the same manner as the modification 1 of the embodiment 2, it is possible to reduce an amount of arithmetic calculation which the management board 501 performs.

In this modification, two-way communication is wirelessly performed between the energy storage apparatus and the energy storage device state estimation device 100. However, communication may not be performed between the energy storage apparatus and the energy storage device state estimation device 100. That is, it may be possible to adopt a configuration where the energy storage device state estimation device 100 is disposed independently from the energy storage apparatus, and data is inputted and outputted by a user.

Although the energy storage device state estimation devices 100 and the energy storage systems 10 according to the embodiments and the modifications of the embodiments of the present invention have been described heretofore, the present invention is not limited to the above-mentioned embodiments and the modifications of the embodiments. That is, it should be construed that the embodiments and the modifications of the embodiments disclosed in this specification are only for exemplifying purpose in all aspects and are not limited. The scope of the present invention is not designated by the above-mentioned description but is designated by Claims, and it is intended that all modifications which fall within the meaning and the scope equivalent to Claims are also included in the scope of the present invention.

For example, in the embodiments and the modifications of the embodiments, the history acquisition part 110 acquires a charge-discharge history which contains an SOC of the energy storage device 200, and the deterioration information acquisition part 120 acquires information about time dependent deterioration and information about working electricity dependent deterioration corresponding to the SOC in the charge-discharge history. However, the history acquisition part 110 may acquire a charge-discharge history which contains a DOD (Depth Of Discharge) instead of the SOC or together with the SOC, and the deterioration information acquisition part 120 may acquire information about time dependent deterioration and information about working electricity dependent deterioration corresponding to the DOD in the charge-discharge history. That is, the history acquisition part 110 may acquire a charge-discharge history which contains at least one of an SOC, a DOD and a use temperature of the energy storage device 200, and the deterioration information acquisition part 120 may acquire information about time dependent deterioration and information about working electricity dependent deterioration corresponding to at least one of the SOC, the DOD and the use temperature of the energy storage device 200 in the charge-discharge history.

In the embodiments and the modifications of the embodiments, the history acquisition part 110 acquires a charge-discharge history which contains a use period of the energy storage device 200. However, when the energy storage device 200 is used as a battery mounted on a vehicle, the history acquisition part 110 may use a travel distance of the vehicle instead of the use period of the energy storage device 200. That is, it may be possible to adopt the configuration where the travel distance of the vehicle is written in the charge-discharge history data 151, and a state of the energy storage device 200 at a predetermined point of time is estimated using the travel distance.

In the embodiments and the modifications of the embodiments, the history acquisition part 110 detects and acquires a charge-discharge history from the energy storage device 200, and stores the charge-discharge history in the memory part 150. With such a configuration, the energy storage device state estimation device 100 estimates a state of the energy storage device using the charge-discharge history. However, for example, when an external device detects a charge-discharge history and stores the charge-discharge history in a memory, the history acquisition part 110 may read and acquire the charge-discharge history from the memory, and the energy storage device state estimation device 100 may estimate a state of the energy storage device using the charge-discharge history. As described above, when a charge-discharge history can be acquired from an external memory, it is unnecessary for the history acquisition part 110 to detect a charge-discharge history from the energy storage device 200. Further, when data can be stored in an external memory, the energy storage device state estimation device 100 may not include the memory part 150, and may use the external memory instead of the memory part 150.

In the embodiments and the modifications of the embodiments, deterioration information (information about time dependent deterioration and information about working electricity dependent deterioration) is written in the deterioration information data 152 in advance, and the deterioration information acquisition part 120 acquires the deterioration information from the deterioration information data 152.

However, the deterioration information acquisition part 120 may acquire the deterioration information by calculating the deterioration information in accordance with a predetermined formula.

In the embodiments and the modifications of the embodiments, the deterioration information acquisition part 120 acquires a deterioration coefficient (a time dependent deterioration coefficient and a working electricity dependent deterioration coefficient) as deterioration information (information about time dependent deterioration and information about working electricity dependent deterioration). However, the deterioration information is not necessarily a deterioration coefficient, and information indicative of a deterioration degree may be used as the deterioration information. For example, the deterioration information acquisition part 120 may acquire a formula which expresses a graph indicating a deterioration degree as shown in FIG. 7A to FIG. 7C, or may acquire the graph per se as the deterioration information.

The deterioration value estimation part 130 estimates (calculates) a deterioration amount of the energy storage device 200 (a time dependent deterioration amount and a working electricity dependent deterioration amount) as a deterioration value (a time dependent deterioration value and a working electricity dependent deterioration value). However, the deterioration value is not necessarily a deterioration amount, and a value indicative of an amount of deterioration may be used as the deterioration value. The deterioration value estimation part 130 may estimate (calculate) a capacitance reduction ratio or a capacity retention ratio with respect to time dependent deterioration and working electricity dependent deterioration.

The deterioration information acquisition part 120 acquires information about working electricity dependent deterioration indicative of a deterioration degree caused by working electricity excluding time dependent deterioration, and the deterioration value estimation part 130 estimates a working electricity dependent deterioration value using the information about working electricity dependent deterioration. However, the deterioration information acquisition part 120 may acquire, instead of the information about working electricity dependent deterioration, information indicative of a deterioration degree caused by working electricity including time dependent deterioration (that is, information about working electricity dependent deterioration including information about time dependent deterioration), and the deterioration value estimation part 130 may estimate a working electricity dependent deterioration value using the information. In this case, based on a temperature and an SOC when the information (information about working electricity dependent deterioration including information about time dependent deterioration) is acquired, information about time dependent deterioration which is to be subtracted is unequivocally decided. Accordingly, the deterioration value estimation part 130 can calculate information about working electricity dependent deterioration by subtracting information about time dependent deterioration from such information, and can estimate a working electricity dependent deterioration value.

The state estimation part 140 may have a function of estimating a safe state such as a function of detecting an abnormal change in voltage and a flow of an abnormally large electric current by referring to data which the history acquisition part 110 acquires, and generating an alarm for safety.

In the embodiments and the modifications of the embodiments, the energy storage device state estimation device 100 estimates a capacity retention ratio (a time dependent deterioration amount and a working electricity dependent deterioration amount) of the energy storage device 200 as a time dependent deterioration value and a working electricity dependent deterioration value of the energy storage device 200. However, the energy storage device state estimation device 100 may estimate a resistance value of the energy storage device 200 as the time dependent deterioration value and the working electricity dependent deterioration value of the energy storage device 200. In this case, for example, the "time dependent deterioration amount" and the "working electricity dependent deterioration amount" in the embodiments and the modifications of the embodiments are used as increased amounts of resistance values in time dependent deterioration and working electricity dependent deterioration of the energy storage device 200, and the "capacity retention ratio" is used as the "resistance increase ratio". With such a configuration, a resistance value of the energy storage device 200 can be estimated using substantially the same method.

Figure 24:
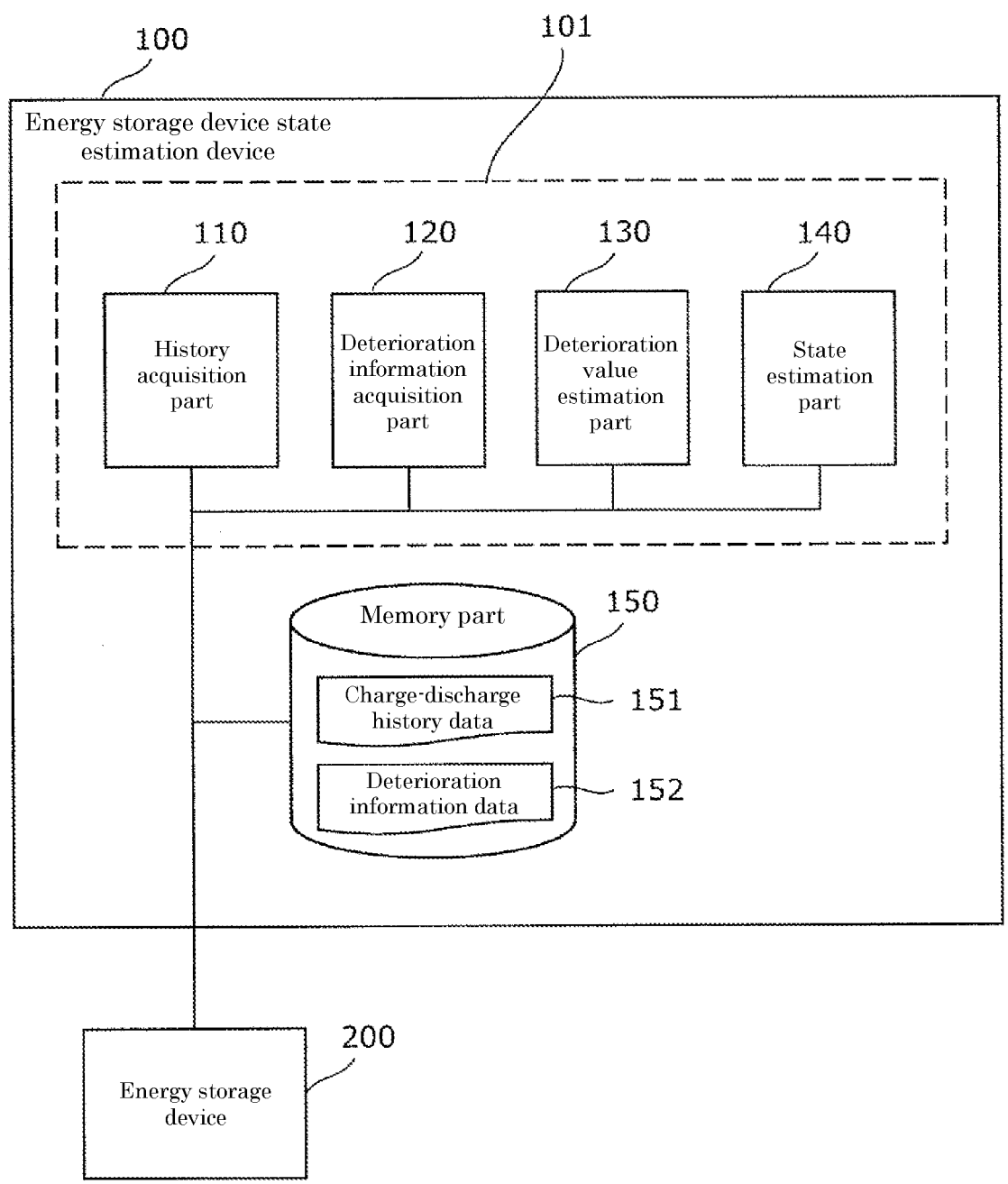
FIG. 24 is a block diagram showing the configuration where the energy storage device state estimation devices according to the embodiments and the modifications of the present invention are realized in the form of an integrated circuit.

A processing part which the energy storage device state estimation device 100 according to the present invention includes is typically realized in the form of an LSI (Large Scale Integration) which is an integrated circuit. That is, for example, as shown in FIG. 24, the present invention is realized as an integrated circuit 101 which includes: a history acquisition part 110; a deterioration information acquisition part 120; a deterioration value estimation part 130; and a state estimation part 140. FIG. 24 is a block diagram showing a configuration where the energy storage device state estimation devices 100 according to the embodiment and the modification of the embodiment of the present invention are realized in the form of an integrated circuit.

Each processing part which the integrated circuit 101 includes may be individually formed into one chip. Alternatively, a part of or all processing parts which the integrated circuit 101 includes may be formed into one chip. In this embodiment, the processing part is realized in the form of an LSI. However, depending on the difference in an integration degree, the LSI may be also referred to as an IC, a system LSI, a super LSI or an ultra LSI.

A method of forming processing parts into an integrated circuit is not limited to a method where the processing parts are realized in the form of an LSI. The processing parts may be realized in the form of a dedicated circuit or in the form of a general processor. After an LSI is manufactured, it may be possible to use a programmable FPGA (Field Programmable Gate Array), or a reconfigurable processor where connection and setting of circuit cells in an LSI can be reconfigured.

When technology on integrated circuits is further developed thanks to the progress of semiconductor technology and other technologies derived from the semiconductor technology and such integrated circuits replace LSIs, as a matter of course, functional blocks may be integrated using such new technology. It may be also possible to adopt biotechnology or the like.

The present invention can be realized not only as the energy storage device state estimation device 100 having such a configuration but also as an energy storage device state estimation method including a step where the energy storage device state estimation device 100 executes unique processing.

The present invention can be also realized in the form of a program which causes a computer (processor) to execute unique processing included in an energy storage device state estimation method, or can be also realized in the form of a computer (processor) readable non-transitory recording medium in which the program is recorded including various mediums such as, for example, a flexible disk, a hard disk, a CD-ROM, an MO, a DVD, a DVD-ROM, a DVD-RAM, a BD (Blu-ray (registered trademark) Disc), a semiconductor memory, a flash memory, a magnetic storage device, an optical disk, and a paper tape. Such a program can be put into a market through a recording medium such as a CD-ROM or a transmission medium such as Internet.

Configurations which are made by arbitrarily combining the constitutional elements which the above-mentioned embodiments and the modifications of the embodiments include are also included in the scope of the present invention. For example, the configuration of the modification 2 of the embodiment 1 may be adopted in the configuration of the modification 1 of the embodiment 1, or the configuration of the modification 1 or 2 of the embodiment 1 may be adopted in the configuration of the embodiment 2 or the modification 1, 2 of the embodiment 2.

INDUSTRIAL APPLICABILITY

The present invention is preferably applicable to an energy storage device state estimation device or the like which can enhance estimation accuracy of a state of the energy storage device.

DESCRIPTION OF REFERENCE SIGNS 10, 11, 12, 13: energy storage system
100: energy storage device state estimation device
101: integrated circuit
110: history acquisition part
120: deterioration information acquisition part
130: deterioration value estimation part
140: state estimation part
150: memory part
151: charge-discharge history data
152: deterioration information data
200: energy storage device
300: housing case
400: energy storage module
410: measurement board
500, 501: management board

The invention claimed is:

1. An energy storage device state estimation device for estimating a state of an energy storage device at a predetermined point of time, the energy storage device state estimation device comprising:
a history acquisition part configured to acquire a charge-discharge history of the energy storage device up to the predetermined point of time;
a deterioration value estimation part configured to, assuming information indicative of a deterioration degree of time dependent deterioration in which the energy storage device deteriorates with a lapse of time in an open-circuit state as information about time dependent deterioration, assuming information indicative of a deterioration degree of working electricity dependent deterioration which is deterioration by working electricity excluding the time dependent deterioration as information about working electricity dependent deterioration, assuming a value indicative of an amount of the time dependent deterioration of the energy storage device as a time dependent deterioration value, and assuming a value indicative of an amount of the working electricity dependent deterioration of the energy storage device as a working electricity dependent deterioration value, estimate the time dependent deterioration value at the predetermined point of time using the information about time dependent deterioration corresponding to the charge-discharge history, and estimate the working electricity dependent deterioration value at the predetermined point of time using the information about working electricity dependent deterioration corresponding to the charge-discharge history; and
a state estimation part configured to estimate a state of the energy storage device at the predetermined point of time using the time dependent deterioration value and the working electricity dependent deterioration value.

2. The energy storage device state estimation device according to claim 1, further comprising: a deterioration information acquisition part configured to acquire the information about time dependent deterioration and the information about working electricity dependent deterioration, wherein
the history acquisition part is configured to acquire the charge-discharge history including histories by predetermined periods which are charge-discharge histories corresponding to a plurality of respective periods up to the predetermined point of time,
the deterioration information acquisition part is configured to acquire the information about time dependent deterioration and the information about working electricity dependent deterioration which respectively correspond to the histories by predetermined periods,
the deterioration value estimation part is configured to calculate the time dependent deterioration value and the working electricity dependent deterioration value for the respective histories by predetermined periods using the information about time dependent deterioration and the information about working electricity dependent deterioration corresponding to the respective histories of predetermined periods, is configured to calculate the time dependent deterioration value at the predetermined point of time by integrating the calculated time dependent deterioration values in the order of the histories by predetermined periods, and is configured to calculate the working electricity dependent deterioration value at the predetermined point of time by integrating the calculated working electricity dependent deterioration values in the order of the histories by predetermined periods.

3. The energy storage device state estimation device according to claim 2, further comprising a memory part which is configured to store the information about time dependent deterioration and the information about working electricity dependent deterioration, wherein
the deterioration information acquisition part is configured to extract and acquire the information about time dependent deterioration and the information about working electricity dependent deterioration corresponding to the respective histories by predetermined periods from the memory part.

4. The energy storage device state estimation device according to claim 2, wherein the history acquisition part is configured to acquire the charge-discharge history which includes: a first history by predetermined period which is a history by predetermined period from a first point of time to a second point of time; and a second history by predetermined period which is a history by predetermined period from the second point of time to a third point of time,
the deterioration information acquisition part is configured to acquire first information about time dependent deterioration which is information about time dependent deterioration corresponding to the first history by predetermined period and second information about time dependent deterioration which is information about time dependent deterioration corresponding to the second history by predetermined period, the deterioration value estimation part is configured to:

calculate a first time dependent deterioration value which is a time dependent deterioration value from the first point of time to the second point of time using the first information about time dependent deterioration;

calculate a second time dependent deterioration value which is a time dependent deterioration value from the second point of time to the third point of time using the second information about time dependent deterioration by setting a state where a deterioration at the first time dependent deterioration value takes place as a start point; and calculate a time dependent deterioration value from the first point of time to the third point of time by adding the first time dependent deterioration value and the second time dependent deterioration value to each other.

5. The energy storage device state estimation device according to claim 1, wherein the history acquisition part is configured to acquire the charge-discharge history which includes: a third history by predetermined period which is a history by predetermined period from a fourth point of time to a fifth point of time during which electricity is supplied to the energy storage device; and a fourth history by predetermined period which is a history by predetermined period from a sixth point of time to a seventh point of time during which electricity is supplied to the energy storage device after the fifth point of time, and the deterioration information acquisition part is configured to acquire first information about working electricity dependent deterioration which is information about working electricity dependent deterioration corresponding to the third history by predetermined period and second information about working electricity dependent deterioration which is information about working electricity dependent deterioration corresponding to the fourth history by predetermined period, and the deterioration value estimation part is configured to:

calculate a first working electricity dependent deterioration value which is a working electricity dependent deterioration value from the fourth point of time to the fifth point of time using the first information about working electricity dependent deterioration;

calculate a second working electricity dependent deterioration value which is a working electricity dependent deterioration value from the sixth point of time to the seventh point of time using the second information about working electricity dependent deterioration by setting a state where a deterioration of the first working electricity dependent deterioration value takes place as a start point; and calculate a working electricity dependent deterioration value from the fourth point of time to the seventh point of time by adding the first working electricity dependent deterioration value and the second working electricity dependent deterioration value to each other.

6. The energy storage device state estimation device according to claim 1, wherein the history acquisition part is configured to acquire the charge-discharge history which contains: an average SOC which is an average value of SOCs of the energy storage device at a plurality of points of time; SOC change amounts which are change amounts at the plurality of points of time; and an average temperature which is an average value of temperatures of the energy storage device at the plurality of points of time, and the deterioration value estimation part is configured to estimate the time dependent deterioration value and the working electricity dependent deterioration value using the average SOC, the SOC change amount and the average temperature included in the charge-discharge history.

7. The energy storage device state estimation device according to claim 1, wherein the history acquisition part is configured to update the acquired charge-discharge history to a charge-discharge history for every predetermined period.

8. The energy storage device state estimation device according to claim 1, wherein the deterioration value estimation part is configured to correct the information about time dependent deterioration and the information about working electricity dependent deterioration stored in a memory part in advance using the charge-discharge history, and is configured to estimate the time dependent deterioration value and the working electricity dependent deterioration value using the information about time dependent deterioration and the information about working electricity dependent deterioration after correction.

9. The energy storage device state estimation device according to claim 1, wherein the predetermined point of time is a future point of time, the history acquisition part is configured to acquire a charge-discharge history up to the future point of time by acquiring a past charge-discharge history and by estimating the charge-discharge history up to the future point of time, the deterioration value estimation part is configured to estimate the time dependent deterioration value and the working electricity dependent deterioration value at the future point of time using the information about time dependent deterioration and the information about working electricity dependent deterioration corresponding to the charge-discharge history up to the future point of time, and the state estimation part is configured to estimate a state of the energy storage device up to the future point of time using the time dependent deterioration value and the working electricity dependent deterioration value at the future point of time.

10. The energy storage device state estimation device according to claim 1, wherein the history acquisition part is configured to receive the charge-discharge history from an energy storage apparatus including the energy storage device, and the state estimation part is configured to transmit the estimated state of the energy storage device to the energy storage apparatus.

11. An energy storage system comprising:

a plurality of energy storage devices; and the energy storage device state estimation device according to claim 1 which is configured to estimate states of the plurality of energy storage devices at a predetermined point of time.

12. An energy storage device state estimation method of estimating a state of an energy storage device at a predetermined point of time, the method comprising:

a history acquisition step of acquiring a charge-discharge history of the energy storage device up to the predetermined point of time;

a deterioration value estimation step of estimating a time dependent deterioration value at the predetermined point of time using information about time dependent deterioration corresponding to the charge-discharge history and estimating a working electricity dependent deterioration value at the predetermined point of time using information about working electricity dependent deterioration corresponding to the charge-discharge history while assuming information indicative of a deterioration degree of time dependent deterioration in which the energy storage device deteriorates with a lapse of time in an open-circuit state as the information about time dependent deterioration, assuming information indicative of a deterioration degree of working electricity dependent deterioration which is deterioration by working electricity excluding the time dependent deterioration as the information about working electricity dependent deterioration, assuming a value indicative of an amount of the time dependent deterioration of the energy storage device as the time dependent deterioration value, and assuming a value indicative of an amount of the working electricity dependent deterioration of the energy storage device as the working electricity dependent deterioration value; and a state estimation step of estimating a state of the energy storage device at the predetermined point of time using the time dependent deterioration value and the working electricity dependent deterioration value.

13. A program for causing a processor to execute the steps included in the energy storage device state estimation method described in claim 12.

14. A recording medium in which the program described in claim 13 is recorded.

15. The energy storage device state estimation device according to claim 1, wherein the history acquisition part is configured to acquire pattern data obtained by patterning data indicative of a repeatedly performed change in data up to the predetermined point of time, the data up to the predetermined point of time being indicative of a change of a state quantity of the energy storage device.

16. The energy storage device state estimation device according to claim 15, wherein the history acquisition part is configured to acquire the charge-discharge history of the energy storage device up to the predetermined point of time, is configured to generate the pattern data using the acquired charge-discharge history, and is configured to update the charge-discharge history with the generated pattern data.

17. The energy storage device state estimation device according to claim 1, wherein the history acquisition part is configured to, when the charge-discharge history is updated, erase the charge-discharge history stored prior to the update in a memory part.

18. The energy storage device state estimation device according to claim 7, wherein the history acquisition part is configured to update the acquired charge-discharge history to the charge-discharge history for every predetermined period by forming a simple waveform that sequentially connects: a value at a point of time that the predetermined period is started; a maximum value; a minimum value; and a value at a point of time that the predetermined period is finished in the acquired charge-discharge history.

19. The energy storage device state estimation device according to claim 15, wherein the pattern data comprises a plurality of zones, each of the plurality of zones being a time period between change points of the state quantity of the energy storage device, and the deterioration value estimation part is configured to estimate the time dependent deterioration value at the each of the plurality of zones using the information about time dependent deterioration corresponding to the each of the plurality of zones and estimate the working electricity dependent deterioration value at the each of the plurality of zones using the information about working electricity dependent deterioration corresponding to the each of the plurality of zones.

20. The energy storage device state estimation device according to claim 1, wherein each of the information about time dependent deterioration and the information about working electricity dependent deterioration is a coefficient in a deterioration model formula adopting at least a use period as a variable.

* * * * *